(12) United States Patent
Shinohara et al.

(10) Patent No.: US 9,377,825 B2
(45) Date of Patent: Jun. 28, 2016

(54) SEMICONDUCTOR DEVICE

(71) Applicant: Renesas Electronics Corporation, Kawasaki-shi, Kanagawa (JP)

(72) Inventors: Minoru Shinohara, Tokyo (JP); Makoto Araki, Tokyo (JP); Michiaki Sugiyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 63 days.

(21) Appl. No.: 14/296,552

(22) Filed: Jun. 5, 2014

(65) Prior Publication Data
US 2014/0347809 A1    Nov. 27, 2014

Related U.S. Application Data

(60) Continuation of application No. 13/673,990, filed on Nov. 9, 2012, now Pat. No. 8,754,534, which is a division of application No. 13/158,430, filed on Jun. 12, 2011, now Pat. No. 8,319,352, which is a division of application No. 12/365,806, filed on Feb. 4, 2009, now Pat. No. 7,989,960.

(30) Foreign Application Priority Data

Feb. 8, 2008   (JP) .................. 2008-029691
Jul. 31, 2008  (JP) .................. 2008-198535

(51) Int. Cl.
*H01L 23/50*   (2006.01)
*G06F 1/18*    (2006.01)
(Continued)

(52) U.S. Cl.
CPC *G06F 1/185* (2013.01); *G11C 5/02* (2013.01); *G11C 5/063* (2013.01);
(Continued)

(58) Field of Classification Search
CPC .............. H01L 25/043; H01L 25/0657; H01L 25/0756; H01L 25/117; H01L 2225/0657; H01L 2225/06503; H01L 2225/06506; H01L 2225/06572; H01L 2225/0651; H01L 25/18; H01L 53/88
USPC .................. 257/723, 777, E25.006, E25.021, 257/E25.027, E23.085; 438/109
See application file for complete search history.

(56) References Cited

U.S. PATENT DOCUMENTS 5,473,196 A    12/1995   De Givry
5,614,766 A    3/1997    Takasu et al.
(Continued)

FOREIGN PATENT DOCUMENTS

JP    2002-033442 A    1/2002
JP    2002-217356 A    2/2002
(Continued)

OTHER PUBLICATIONS

Office Action issued Jan. 31, 2012, in Chinese Patent Application No. 200910003571.X.
(Continued)

*Primary Examiner* — Jasmine Clark
(74) *Attorney, Agent, or Firm* — Shapiro, Gabor and Rosenberger, PLLC

(57) ABSTRACT

A memory card has a wiring board, four memory chips stacked on a main surface of the wiring board, and a controller chip and an interposer mounted on a surface of the memory chip of the uppermost layer. The memory chips are stacked on the surface of the wiring board so that their long sides are directed in the same direction as that of the long side of the wiring board. The memory chip of the lowermost layer is mounted on the wiring board in a dislocated manner by a predetermined distance in a direction toward a front end of the memory card so as not to overlap the pads of the wiring board. The three memory chips stacked on the memory chip of the lowermost layer are disposed so that their short sides on which pads are formed are located at the front end of the memory card.

15 Claims, 41 Drawing Sheets

(51) Int. Cl.
  *G11C 5/02* (2006.01)
  *G11C 5/06* (2006.01)
  *H01L 23/538* (2006.01)
  *H01L 25/065* (2006.01)
  *H01L 25/18* (2006.01)
  *H01L 23/00* (2006.01)

(52) U.S. Cl.
  CPC .......... *H01L 23/5388* (2013.01); *H01L 24/49* (2013.01); *H01L 24/97* (2013.01); *H01L 25/0657* (2013.01); *H01L 25/18* (2013.01); *H01L 24/45* (2013.01); *H01L 24/48* (2013.01); *H01L 2224/05553* (2013.01); *H01L 2224/05554* (2013.01); *H01L 2224/45144* (2013.01); *H01L 2224/48091* (2013.01); *H01L 2224/48137* (2013.01); *H01L 2224/48145* (2013.01); *H01L 2224/48225* (2013.01); *H01L 2224/48227* (2013.01); *H01L 2224/49171* (2013.01); *H01L 2224/49175* (2013.01); *H01L 2224/97* (2013.01); *H01L 2225/0651* (2013.01); *H01L 2225/06506* (2013.01); *H01L 2225/06527* (2013.01); *H01L 2225/06562* (2013.01); *H01L 2225/06572* (2013.01); *H01L 2924/01004* (2013.01); *H01L 2924/01005* (2013.01); *H01L 2924/01006* (2013.01); *H01L 2924/01014* (2013.01); *H01L 2924/01023* (2013.01); *H01L 2924/01033* (2013.01); *H01L 2924/01047* (2013.01); *H01L 2924/01079* (2013.01); *H01L 2924/01082* (2013.01); *H01L 2924/10253* (2013.01); *H01L 2924/12042* (2013.01); *H01L 2924/14* (2013.01); *H01L 2924/15311* (2013.01); *H01L 2924/181* (2013.01); *H01L 2924/1815* (2013.01); *H01L 2924/19041* (2013.01); *H01L 2924/30105* (2013.01)

(56) References Cited

U.S. PATENT DOCUMENTS

| | | | |
|---|---|---|---|
| 5,998,864 | A | 12/1999 | Khandros et al. |
| 6,005,778 | A | 12/1999 | Spielberger et al. |
| 6,215,182 | B1 | 4/2001 | Ozawa et al. |
| 6,376,904 | B1 | 4/2002 | Haba et al. |
| 6,744,141 | B2 | 6/2004 | Kimura |
| 7,119,428 | B2 | 10/2006 | Tanie et al. |
| 7,132,752 | B2 | 11/2006 | Saeki |
| 7,354,800 | B2 | 4/2008 | Carson |
| 7,420,281 | B2 | 9/2008 | Tsunozaki |
| 7,514,796 | B2 | 4/2009 | Saeki |
| 7,622,794 | B1 | 11/2009 | Fan |
| 7,683,491 | B2 | 3/2010 | Itoh et al. |
| 7,800,211 | B2 | 9/2010 | Yang et al. |
| 7,989,943 | B2 | 8/2011 | Kim et al. |
| 8,232,631 | B2 | 7/2012 | Cho |
| 8,253,232 | B2 | 8/2012 | Kim et al. |
| 8,643,175 | B2 * | 2/2014 | Kim ................ H01L 24/92 257/723 |
| 2002/0195697 | A1 | 12/2002 | Mess et al. |
| 2003/0137042 | A1 | 7/2003 | Mess et al. |
| 2003/0195697 | A1 | 10/2003 | Jones |
| 2004/0164391 | A1 | 8/2004 | Okamura |
| 2005/0052851 | A1 | 3/2005 | Yamada et al. |
| 2005/0253239 | A1 | 11/2005 | Nishizawa et al. |
| 2006/0055018 | A1 | 3/2006 | Sekiguchi et al. |
| 2006/0186524 | A1 | 8/2006 | Aiba et al. |
| 2006/0261489 | A1 | 11/2006 | Takemoto et al. |
| 2006/0267173 | A1 | 11/2006 | Takiar et al. |
| 2007/0045864 | A1 | 3/2007 | Shiba et al. |
| 2007/0257374 | A1 | 11/2007 | Saeki |
| 2008/0001266 | A1 | 1/2008 | Yu et al. |
| 2008/0025003 | A1 | 1/2008 | Nishizawa et al. |
| 2008/0150158 | A1 | 6/2008 | Chin |
| 2008/0157393 | A1 * | 7/2008 | Kodama .................. H01L 24/06 257/777 |
| 2009/0032969 | A1 | 2/2009 | Pilla |
| 2009/0065948 | A1 | 3/2009 | Wang |
| 2009/0085223 | A1 | 4/2009 | Nishiyama et al. |
| 2009/0140440 | A1 | 6/2009 | Liu et al. |
| 2009/0166839 | A1 | 7/2009 | Suzuki et al. |
| 2010/0181661 | A1 | 7/2010 | Takemoto et al. |
| 2010/0200976 | A1 | 8/2010 | Nishiyama et al. |
| 2010/0261312 | A1 | 10/2010 | Maki et al. |
| 2010/0270689 | A1 | 10/2010 | Kim et al. |
| 2010/0301466 | A1 | 12/2010 | Taoka et al. |

FOREIGN PATENT DOCUMENTS

| | | |
|---|---|---|
| JP | 2004-063579 A | 2/2004 |
| JP | 2005-244143 A | 9/2005 |
| JP | 2005-339496 A | 12/2005 |
| JP | 2006-086149 A | 3/2006 |
| JP | 2006-351664 A | 12/2006 |
| JP | 2007-004775 A | 1/2007 |
| JP | 2007-059541 A | 3/2007 |
| JP | 2007-066922 A | 3/2007 |
| JP | 2007-096071 A | 4/2007 |
| JP | 2007-128953 A | 5/2007 |
| JP | 2009-088217 A | 4/2009 |

OTHER PUBLICATIONS

Office Action issued Dec. 3, 2013, in Japanese Patent Application No. 2013-029646.

Office Action (First Notification of Reasons for Refusal) issued Mar. 21, 2014, in Chinese Patent Application No. 201210186284.9.

Office Action issued Jan. 6, 2015, in Japanese Patent Application No. 2014-096674.

* cited by examiner

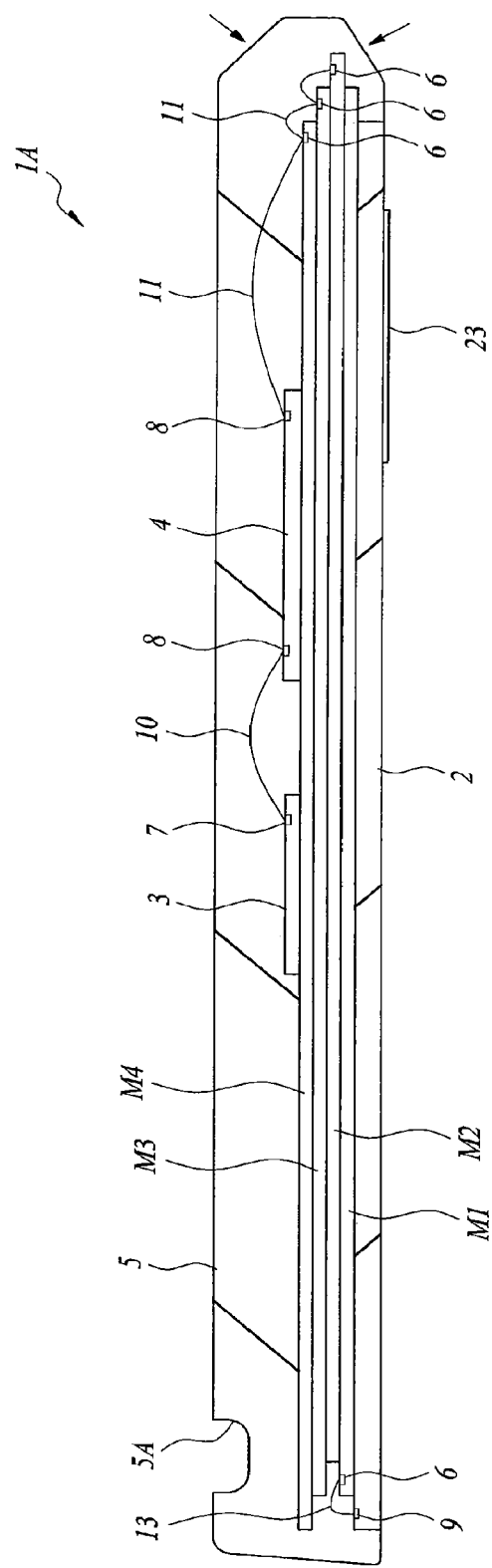

SEMICONDUCTOR DEVICE

CROSS-REFERENCE TO RELATED APPLICATION

The present application is a continuation of U.S. application Ser. No. 13/673,990, filed Nov. 9, 2012, now U.S. Pat. No. 8,754,534, which is a division of U.S. application Ser. No. 13/158,430, filed Jun. 12, 2011, now U.S. Pat. No. 8,319,352, which is a division of U.S. application Ser. No. 12/365,806, filed Feb. 4, 2009, now U.S. Pat. No. 7,989,960, and claims priority from Japanese Patent Application No. JP 2008-029691 filed on Feb. 8, 2008 and Japanese Patent Application No. JP 2008-198535 filed on Jul. 31, 2008, the contents of which are hereby incorporated by reference into this application.

TECHNICAL FIELD OF THE INVENTION

The present invention relates to a semiconductor device, and more particularly to a technique effectively applied to a semiconductor device having a package structure in which memory chips and a controller chip are stacked on a wiring board.

BACKGROUND OF THE INVENTION

In recent years, various types of the semiconductor devices in which a plurality of memory chips are stacked on a wiring board have been developed in order to achieve an increased capacity of a semiconductor memory and reduction in size of the semiconductor device.

Japanese Patent Application Laid-Open Publication No. 2006-351664 (patent document 1) has disclosed a system in package (SIP) in which a plurality of memory chips and a microcomputer chip are stacked on a wiring board. In this SIP, a plurality of memory chips and a microcomputer chip are stacked on a surface of a wiring board and an interposer chip composed of a silicon substrate is disposed on a surface of the memory chip adjacently to the microcomputer chip. Also, pads of the microcomputer chip are connected to pads of the wiring board through the interposer chip and bonding wires.

Japanese Patent Application Laid-Open Publication No. 2002-33442 (patent document 2), Japanese Patent Application Laid-Open Publication No. 2002-217356 (patent document 3) and Japanese Patent Application Laid-Open Publication No. 2007-59541 (patent document 4) have disclosed a semiconductor device in which semiconductor chips each having a plurality of bonding pads formed on one side thereof are stacked on a wiring board. The respective semiconductor chips are disposed so that their sides having the bonding pads formed thereon are directed in opposite directions to each other, and are stacked in a dislocated manner alternately in a direction perpendicular to the sides.

Japanese Patent Application Laid-Open Publication No. 2006-86149 (patent document 5) has disclosed a semiconductor device having a stacked multi-chip package structure in which a plurality of semiconductor chips and a rewiring element (interposer) are stacked and mounted on a wiring board. The rewiring element has wirings for connecting between the plurality of semiconductor chips and between the wiring board and the semiconductor chips, and mutual connection between the plurality of semiconductor chips and rearrangement of the pads of the semiconductor chips are achieved with the rewiring element.

Japanese Patent Application Laid-Open Publication No. 2005-244143 (patent document 6) has disclosed a semiconductor device in which an interface chip is stacked on a plurality of stacked semiconductor chips. A Si interposer and a resin interposer are disposed below the plurality of semiconductor chips. The Si interposer is disposed between the resin interposer and the plurality of semiconductor chips, has a thickness larger than that of the semiconductor chip, and has a linear expansion coefficient smaller than that of the resin interposer and larger than that of the plurality of semiconductor chips.

Japanese Patent Application Laid-Open Publication No. 2007-66922 (patent document 7) has disclosed a semiconductor integrated circuit device having a stacked structure package. This semiconductor integrated circuit device has a stacked structure in which a plurality of semiconductor chips are stacked on a printed wiring board, and a semiconductor chip mounted on the lowermost portion is provided with an interface circuit. This interface circuit includes a buffer, an electrostatic protection circuit and others, and signals to be input or output into/from the plurality of semiconductor chips are all input or output through this interface circuit.

Japanese Patent Application Laid-Open Publication No. 2007-128953 (patent document 8) has disclosed a semiconductor device in which first and second semiconductor chips each having a pad structure formed on one long side thereof are stacked and mounted on a wiring board having connecting pads. The second semiconductor chip is smaller than the first semiconductor chip and has a narrow shape. The first and second semiconductor chips are electrically connected to the connecting pads of the wiring board 2 through bonding wires, and the second semiconductor chip is disposed so that the long side L is parallel to an ultrasonic wave application direction X at the time of wire bonding.

Japanese Patent Application Laid-Open Publication No. 2007-96071 (patent document 9) has disclosed a semiconductor memory card which can mount a large-capacity nonvolatile memory chip. This semiconductor memory card includes: a rectangular circuit board; a rectangular nonvolatile memory chip which is mounted on the circuit board and has a plurality of first bonding pads formed along only a first side thereof, the first bonding pads being wire-bonded to a plurality of first board terminals formed in the proximity of the first side; and a rectangular controller chip which is mounted on the nonvolatile memory chip so that the direction of a second side of the nonvolatile memory chip adjacent to the first side is substantially parallel to the direction of a long side of the rectangular controller chip and has a plurality of second bonding pads formed along the direction of the long side thereof, the second bonding pads being wire-bonded to a plurality of second board terminals formed on the circuit board in the proximity of the long side of the rectangular controller chip.

Japanese Patent Application Laid-Open Publication No. 2004-63579 (patent document 10) has disclosed a semiconductor device in which two semiconductor chips each having bonding pads formed on their two sides perpendicular to each other are stacked. The second semiconductor chip stacked on the first semiconductor chip is mounted in a dislocated manner in X and Y directions so that the bonding pads on the two sides of the first semiconductor chip are exposed.

Japanese Patent Application Laid-Open Publication No 2005-339496 (patent document 11) has disclosed a multi-function memory card in which a plurality of flash memory chips are stacked and mounted on a main surface of a wiring board and a controller chip and an IC card microcomputer chip as a security controller are mounted on the flash memory chip of the uppermost layer. In each of the plurality of flash memory chips, bonding pads are formed on one short side thereof, and the flash memory chips are stacked in a dislocated manner by a predetermined distance in a long side direction so that the bonding pads are exposed.

SUMMARY OF THE INVENTION

The memory cards are used as the recording medium of various portable electronic devices such as a cellular phone, a digital camera, and a digital audio player.

As described in the patent document 11, the basic structure of the memory card is constituted of a plurality of flash memory chips stacked and mounted on the main surface of the wiring board and a controller chip mounted on the flash memory chip of the uppermost layer. The plurality of flash memory chips are stacked in a dislocated manner by a predetermined distance in a direction perpendicular to one sides of the chips on which the bonding pads are formed so that the bonding pads formed on the sides are exposed.

With an increase of the memory capacity required for the recording medium of various portable electronic devices represented by the cellular phone in recent years, the number of flash memory chips mounted on the memory card has been increased and the flash memory chip has been increased in size. On the other hand, since the various portable electronic devices have been reduced in size and thickness, the reduction in size and thickness of the memory card has been demanded.

Thus, since the size of the flash memory chip has approached the size of the wiring board of the memory card, when a plurality of flash memory chips are mounted on the wiring board, the method of stacking the flash memory chips by dislocating them in one direction as described in the patent document 11 cannot accommodate the flash memory chips in a memory card.

Also, the memory card includes a controller chip for controlling the flash memory on the uppermost layer of the stacked flash memory chips, and the flash memory chips and the controller chip are electrically connected through the wirings formed on the wiring board and Au wires. However, if the size of the flash memory chip approaches the size of the wiring board of the memory card, a space for disposing the bonding pads for memory chip connection and the bonding pads for controller chip connection disappears from the surface of the wiring board.

An object of the present invention is to provide a technique capable of increasing the number of memory chips to be stacked and mounted on a wiring board in a semiconductor device having a package structure in which memory chips and a controller chip are stacked on a wiring board.

Another object of the present invention is to provide a technique capable of improving the freedom of wirings for connecting memory chips and a control chip in a semiconductor device having a package structure in which the memory chips and the control chip are stacked on a wiring board.

The above and other objects and novel characteristics of the present invention will be apparent from the description of this specification and the accompanying drawings.

The typical ones of the inventions disclosed in this application will be briefly described as follows.

(1) A semiconductor device comprises: a wiring board having a main surface and a rear surface and external connecting terminals formed on the rear surface; a memory chip mounted on the main surface of the wiring board; a controller chip mounted on the memory chip and controlling the memory chip; and an interposer mounted on the memory chip and electrically connected to the controller chip, wherein first terminals are formed on a first side of the memory chip, the interposer is disposed between the first side of the memory chip and the controller chip, second terminals are formed on a first side of the interposer, third terminals are formed on a second side perpendicular to the first side and fourth terminals are formed on a third side opposed to the first side, the second terminals formed on the first side of the interposer are electrically connected to the first terminals formed on the first side of the memory chip, the third terminals formed on the second side of the interposer are electrically connected to the external connecting terminals through fifth terminals provided on one side of the main surface of the wiring board, and the fourth terminals formed on the third side of the interposer are electrically connected to the controller chip.

(2) A semiconductor device comprises: a wiring board having a main surface and a rear surface and external connecting terminals formed on the rear surface; a memory chip mounted on the main surface of the wiring board; and a controller chip mounted on the memory chip, wherein first terminals are formed on a first side of the memory chip, second terminals are formed on a first side of the controller chip, and third terminals are formed on a second side perpendicular to the first side, the second terminals formed on the first side of the controller chip are electrically connected to the first terminals formed on the first side of the memory chip, the third terminals formed on the second side of the controller chip are electrically connected to the external connecting terminals through fourth terminals on the main surface of the wiring board provided on a side of a second side perpendicular to the first side of the memory chip, a plurality of the memory chips are mounted in a stacked manner on the main surface of the wiring board, the plurality of the memory chips are stacked in a dislocated manner in a direction perpendicular to the first side so that the first terminals provided on their first sides are exposed, of the plurality of the memory chips, the memory chip of a lowermost layer and the other memory chips are stacked in a state of being rotated 180° from each other within the main surface of the wiring board so that their first sides on which the first terminals are formed are directed in opposite directions, the first terminals of the memory chip of the lowermost layer are electrically connected to the controller chip through wirings of the wiring board connected to the fourth terminals, and the first terminals of the other memory chip are electrically connected to the second terminals of the controller chip.

(3) In a semiconductor device in which a plurality of memory chips are mounted in a stacked manner on a main surface of a wiring board, first terminals are formed on a first side of each of the plurality of memory chips, the plurality of the memory chips are stacked in a dislocated manner in a direction perpendicular to the first side so that the first terminals provided on their first sides are exposed, the first side of a memory chip of a lowermost layer of the plurality of the memory chips is disposed in line with a first side of the wiring board, when it is assumed that the number of the plurality of the memory chips is n (n is 4 or more), the number of the memory chips dislocated continuously in the same direction is (n/2) or less and two or more, and except a memory chip of an uppermost layer in the plurality of the memory chips, a memory chip of an uppermost layer in a group of a plurality of memory chips dislocated continuously in the same direction is stacked in a state of being rotated 180° degrees from the other memory chips in the group.

The effects obtained by typical one of the inventions disclosed in this application will be briefly described below.

In a semiconductor device having a package structure in which memory chips and a controller chip are stacked on a wiring board, the number of memory chips to be stacked and mounted on the wiring board can be increased.

In a semiconductor device having a package structure in which memory chips and a controller chip are stacked on a wiring board, the freedom of wirings for connecting the memory chips and the controller chip can be improved.

BRIEF DESCRIPTIONS OF THE DRAWINGS

FIG. 3 is a cross sectional view taken along the line A-A of FIG. 1;

DESCRIPTIONS OF THE PREFERRED EMBODIMENTS

Hereinafter, embodiments of the present invention will be described in detail with reference to the accompanying drawings. Note that components having the same function are denoted by the same reference numbers throughout the drawings for describing the embodiments, and the repetitive description thereof will be omitted.

First Embodiment

The present embodiment is applied to a memory card for use as a recording medium of a cellular phone.

<Outline of Stacked Structure>

Figure 1:
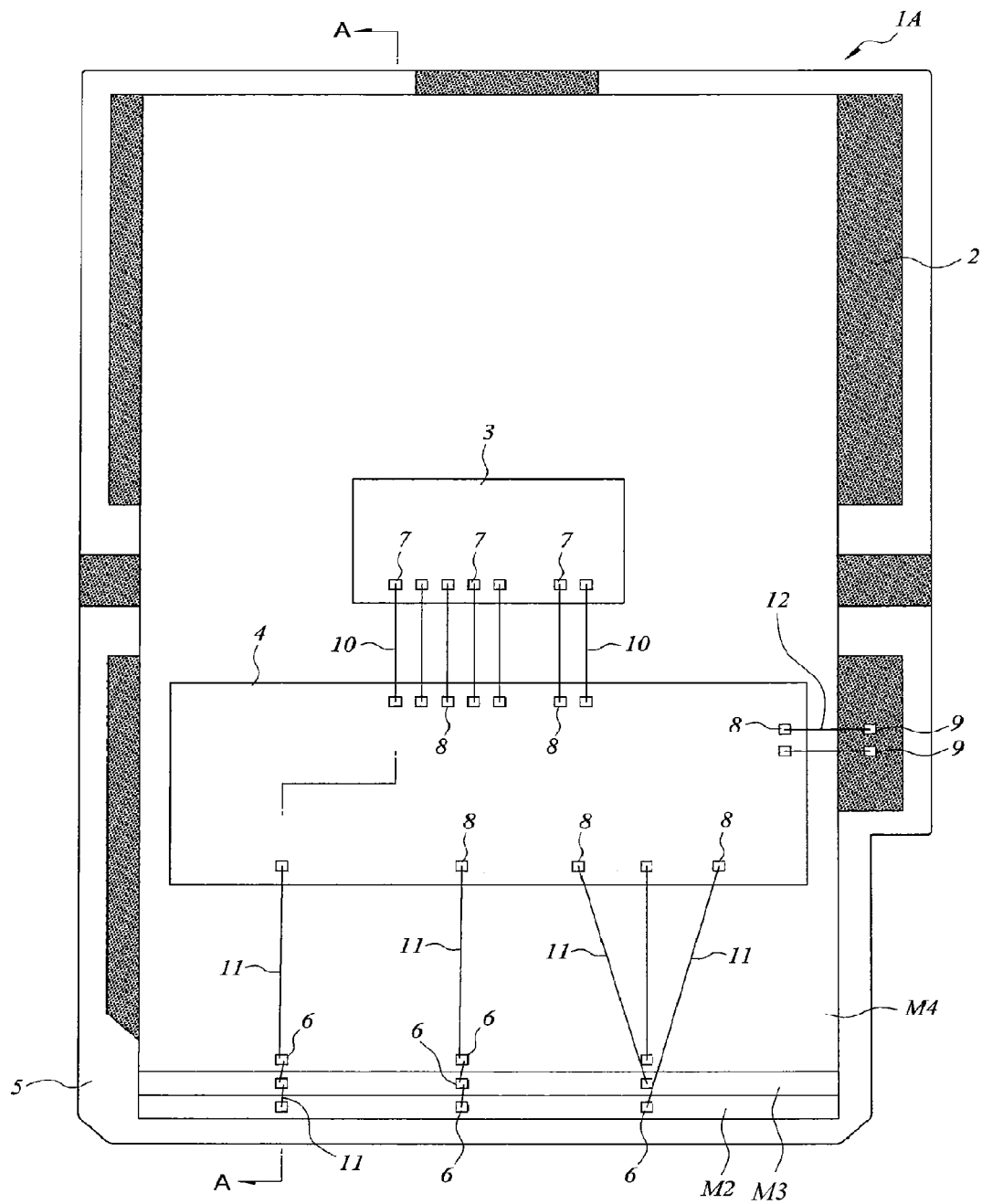
FIG. 1 is a schematic plan view showing the internal structure of a memory card according to an embodiment of the present invention.
Figure 2:
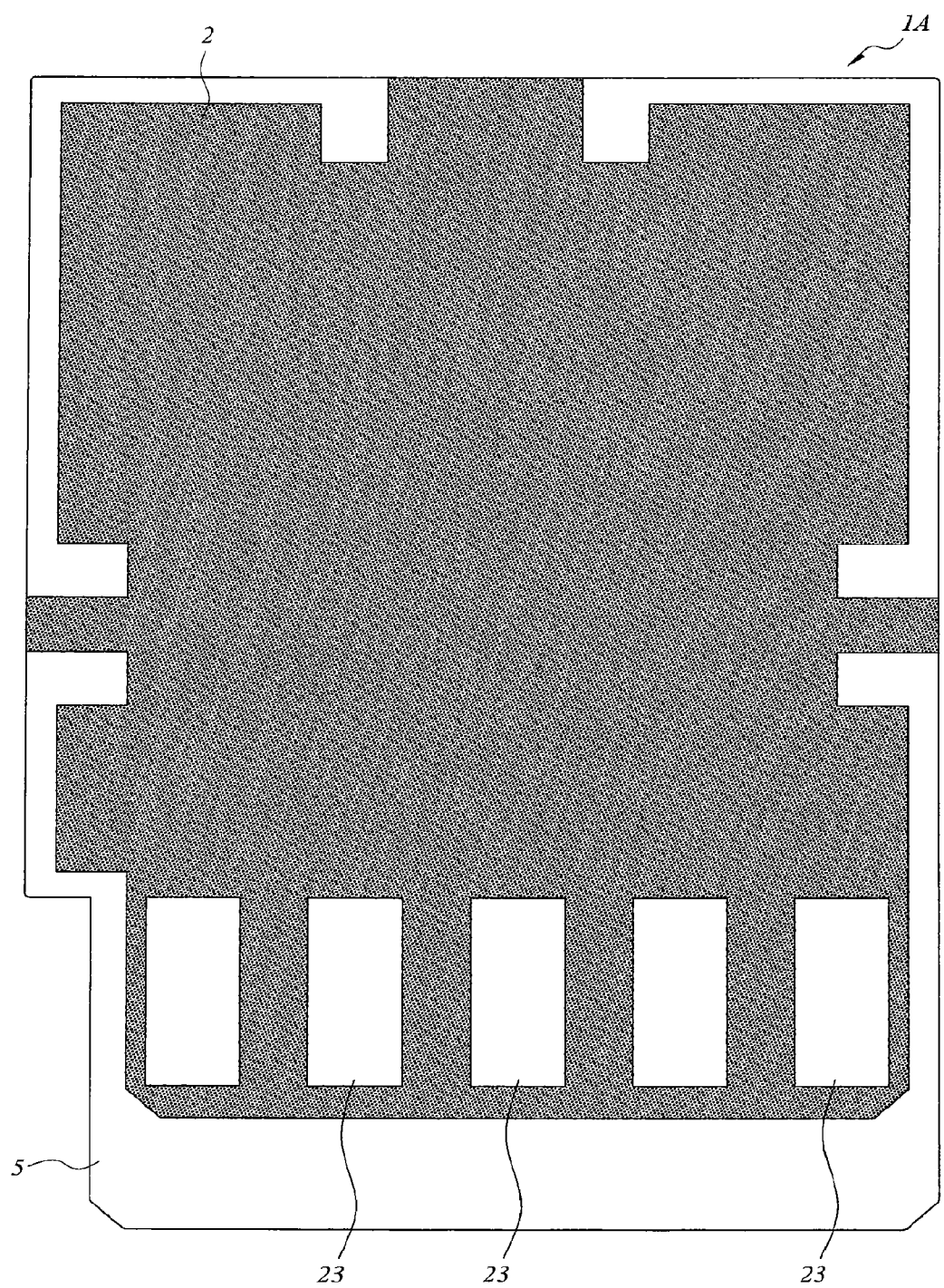
FIG. 2 is a plan view showing the appearance of the rear face of the memory card according to an embodiment of the preset invention.

FIG. 1 is a schematic plan view showing an internal structure of a memory card according to the present embodiment, FIG. 2 is a plan view showing an appearance of a rear face of the memory card and FIG. 3 is a cross sectional view taken along the line A-A of FIG. 1.

A memory card 1A of the present embodiment is inserted into a card slot of a cellular phone for use, and as for its external dimensions, the long side and short side are 15 mm×12.5 mm, and the thickness is 1.2 mm. This memory card 1A includes a wiring board 2 mainly made of glass epoxy resin, four memory chips M1, M2, M3 and M4 stacked on a main surface (front surface) thereof and a controller chip 3 and an interposer 4 mounted on a surface of the memory chip M4 of the uppermost layer. The memory chips M1, M2, M3 and M4 mentioned here have substantially the same shape and size.

The wiring board 2 and the memory chips M1 to M4 are bonded to one another with adhesive agent or others. Also, the controller chip 3 and the interposer 4 are fixed to the surface of the memory chip M4 with adhesive agent or others, respectively.

The front surface side of the wiring board 2 is covered with mold resin 5 for sealing the aforementioned memory chips M1 to M4, the controller chip 3 and the interposer 4. The mold resin 5 is made of, for example, thermoset epoxy resin containing quartz filler or the like. Although not shown, an insulating label on which a product name, a manufacturer name, memory capacity and others are described is affixed to the surface of the mold resin 5 corresponding to the surface of the memory card 1A. The above-mentioned contents can be printed directly on the surface of the mold resin 5 instead of affixing such a label.

As shown in FIG. 3, one side face (right end portion in the figure) of the mold resin 5, that is, one side (portion indicated with arrow) which serves as a front end portion (right end portion in the figure) when the memory card 1A is inserted into a card slot of the cellular phone is tapered so that the thickness of the front end portion is smaller than those of the other portions. By forming the front end portion into such a shape, a smooth insertion thereof can be attained even if the insertion angle is deviated to some extent in the vertical direction when the memory card 1A is inserted into the card slot. On the other hand, a concave groove 5A is provided in the mold resin 5 in the vicinity of one side (short side) which serves as a rear end portion (left end portion in the figure) when the memory card 1A is inserted into the card slot in the cellular phone. This concave groove 5A is a guide groove for preventing the front end portion and the rear end portion of the memory card 1A from being inverted when the memory card 1A is inserted into the card slot in the cellular phone. Further, by preventing this concave groove 5A, the removal of the memory card 1A from the card slot can be facilitated.

Each of the memory chips M1 to M4 is composed of a rectangular silicon chip having a thickness of about 0.09 mm, and an electrically erasable and writable nonvolatile memory (flash memory) having a memory capacity of 8 gigabits is formed in the main surface (front surface) thereof. Therefore, the memory card 1A of the present embodiment on which the four memory chips M1 to M4 are mounted has a memory capacity of 8 gigabits×4=32 gigabits (4 gigabytes). For example, a NAND type flash memory is used as the flash memory, but an AG-AND (Assist Gate-AND) type flash memory or a NOR type flash memory may be used. A plurality of pads (terminals) 6 are formed in the vicinity of one side (short side) of each surface of the memory chips M1 to M4 so that they are concentrated in a direction of this short side. Note that FIG. 1 shows only a part of the pads 6 for simplification of the drawing.

Each of the memory chips M1 to M4 is stacked on the surface of the wiring board 2 so that its long side is directed in the same direction as the long side of the wiring board 2. The wiring board 2 is disposed so that its long side is directed in the same direction as the long side of the memory card 1A.

<Controller Chip>

The controller chip 3 is composed of a rectangular silicon chip having a smaller area than the memory chips M1 to M4. The thickness of the controller chip 3 is about 0.1 mm. An interface circuit for exchanging data between the memory chips M1 to M4 and the outside is formed in the main surface (front surface) of the controller chip 3 to control an external interface operation and a memory interface operation to the memory chips M1 to M4 in a control mode in accordance with the instructions from outside. A plurality of pads (terminals) 7 are formed in a row in the vicinity of one side (long side) of the front surface of the controller chip 3.

The interface circuit formed in the controller chip 3 has a plurality of interface control modes and controls the external interface operation and the memory interface operation to the memory chips M1 to M4 in the control mode in accordance with the instructions from outside. The memory card interface mode conforms to the interface specification of various memory card units. For example, the interface controller realizes the function of the memory card controller, which supports the interface specification of the memory card, by program control. Further, it is also possible to support a predetermined memory card interface specification later by adding a control program, namely, firmware to the interface controller by downloading through the network. Furthermore, it is also possible to disable the predetermined memory card interface specification by inhibiting the execution of the predetermined control program by the license information acquired through the network.

<Interposer>

The interposer 4 is a rectangular resin board whose long side is slightly shorter than the short side of the memory chips M1 to M4, and the thickness thereof is about 0.13 mm. The interposer 4 is mounted in the vicinity of the controller chip 3 so that its long side is directed in the same direction as the short side of the wiring board 2. The interposer 4 is used as a relay board for connecting the controller chip 3 to the memory chips M1 to M4 and the wiring board 2, and a plurality of pads (terminals) 8 are formed on its surface in a row in the vicinity of three sides thereof.

In this case, pads for controller chip connection are disposed on one side of opposing two long sides, and pads for memory chip connection are disposed on the other side. Also, pads for wiring board connection are disposed on one short side.

Plural layers of wirings are formed in the interposer 4. In this case, the interposer 4 is formed of a resin board in which wirings are formed on the front surface and rear surface. Note that, although it has been described that the interposer 4 is a resin board, it may be formed of a silicon chip in which wirings are formed. Further, unless connection with the wiring board, memory chips and a controller chip is complicated, the interposer 4 may be formed of a single layer wiring instead of multi layer wiring.

As shown in FIG. 1, the interposer 4 and the controller chip 3 are electrically connected using Au wires 10. Also, the interposer 4 and the memory chips M2, M3 and M4 are electrically connected through the Au wires 11, and the memory chips M2 to M4 are electrically connected through the Au wires 11. Further, the interposer 4 and the wiring board 2 are electrically connected through Au wires 12. Pads (terminals) 9 on the side of the wiring board 2 to which one ends of the Au wires 12 are connected are formed along one long side of the wiring board 2.

Since the interposer 4 is provided between the controller chip 3 and the memory chips M2 to M4 and the wiring board 2, the order of signals to be input/output to/from the interposer 4 or the pad pitch can be changed by modifying the layout of the pads 8 and wirings of the interposer 4. Therefore, as compared with a case where the controller chip 3, the memory chips M2 to M4 and the wiring board 2 are directly connected, the freedom of wiring design is improved. Particularly, the freedom of the wirings can be enhanced.

Also, in the present embodiment, the long side of the interposer 4 is designed to have a length close to that of the short side of the memory chips M1 to M4 rather than that of the long side of the controller chip 3. Therefore, the connection of the pads 6 of the memory chips M1 to M4 and the pads 8 of the interposer 4 can be shortened because its oblique wirings can be reduced by adjusting the wirings in the interposer 4.

Also, since the long side of the interposer 4 is designed to have a length close to that of the short side of the memory chips M1 to M4, the distance between the pad 8 provided on the short side of the interposer 4 and the pad 9 on the wiring board 2 can be shortened in comparison to the case where it is set to the size of the controller chip 3. Accordingly, the length of the wire between the pads can be reduced. Particularly, since there are many differences in level in this structure, the reduction of the wire length can achieve a significant effect on stabilization of the wire connection.

Further, the external dimensions of the memory chips M1 to M4 and the layout of the pads 6 are different depending on semiconductor manufacturers, but even when memory chips M1 to M4 made by different semiconductor manufacturers are to be mounted, the specification of the controller chip 3 does not need to be changed by changing the specification of the interposer 4. Therefore, the general-purpose properties of the controller chip 3 can be improved.

<Wiring Board>

The wiring board 2 is a rectangular resin board having a thickness of about 0.2 mm and includes a front surface wiring 20, a rear surface wiring 21 and via holes 22 for connecting them though not shown in FIGS. 1 to 3. Small passive elements (not shown) such as a chip capacitor are mounted according to need on the main surface (front surface) of the wiring board 2 in addition to the memory chips M1 to M4.

The rear surface of the wiring board 2 is not covered with the mold resin 5 and it is exposed to the rear surface side of the memory card LA. As shown in FIG. 2, a plurality of external connecting terminals 23 are formed on the rear surface of the wiring board 2. The external connecting terminals 23 include a power supply terminal (Vcc), a grounding terminal (Vss) and a data I/O terminal and are connected to the controller chip 3 through the rear surface wiring 21, the via hole 22, the front surface wiring 20 and others of the wiring board 2 as described later.

The external connecting terminals 23 are formed in the vicinity of one side (short side) which serves as the front end portion when the memory card 1A is inserted into the card slot in the cellular phone, and are disposed in the direction of the short side. Therefore, when the memory card 1A is mounted in the card slot of the cellular phone, the terminals of the connectors incorporated in the card slot and the external connecting terminals 23 come into contact with each other, so that exchange of signals and supply of electric power between the memory card 1A and the cellular phone are carried out. Note that, although the memory card of the present embodiment is designed to be operated by a single power supply (for example, 3.3 V), it may be operated by a plurality of power supplies (for example, 1.8 V and 3.3 V). In this case, another power control chip is mounted on the surface of the memory chip M4 of the uppermost layer.

<Cross Section of Stacked Structure>

As described above, the memory chips M1 to M4 are stacked on the front surface of the wiring board 2 with their long sides directed in the same direction as the long side of the wiring board 2. As shown in FIG. 3, the memory chip M1 of the lowermost layer is disposed so that the short side thereof on the side in which the pads 6 are formed is located at the rear end portion (rear end portion when the memory card 1A is inserted into the card slot of the cellular phone). A plurality of pads 9 are formed in the vicinity of one side (short side) of the wiring board 2 located at the rear end portion of the memory card 1A, and these pads 9 and the pads 6 of the memory chip M1 are electrically connected through the Au wires 13. More specifically, the memory chip M1 of the lowermost layer is mounted on the wiring board 2 in a dislocated manner by a predetermined distance in the direction toward the front end portion of the memory card 1A so that it does not overlap the pads 9 of the wiring board 2.

On the other hand, the three memory chips M2 to M4 stacked on the memory chip M1 are disposed so that their short sides on the side in which the pads 6 are formed are located at the front end portion of the memory card 1A in contrast to the memory chip M1. Then, the memory chip M2 is mounted on the memory chip M1 in a dislocated manner by a predetermined distance in the direction toward the front end portion of the memory card 1A so that the pads 6 of the underlying memory chip M1 are exposed. Likewise, the memory chips M3 and M4 are respectively stacked in a dislocated manner by a predetermined distance in the direction toward the rear end portion of the memory card 1A so that the pads 6 of the memory chip M2 and the pads 6 of the memory chip M3 are exposed.

When the memory chips M1 to M4 are stacked as described above, ends (ends on the side of the front end portion of the memory card 1A) of the memory chips M1, M2 and M3 are projected out of the end portion of the wiring board 2. However, as described above, the mold resin 5 on the front end portion side of the memory card 1A is tapered and the central portion of the mold resin 5 in the thickness direction is projected laterally with respect to the upper and lower portions. Therefore, even if the end portions of the memory chips M1, M2 and M3 are projected from the end portion of the wiring board 2, they are never exposed outside the mold resin 5.

Figure 4A:
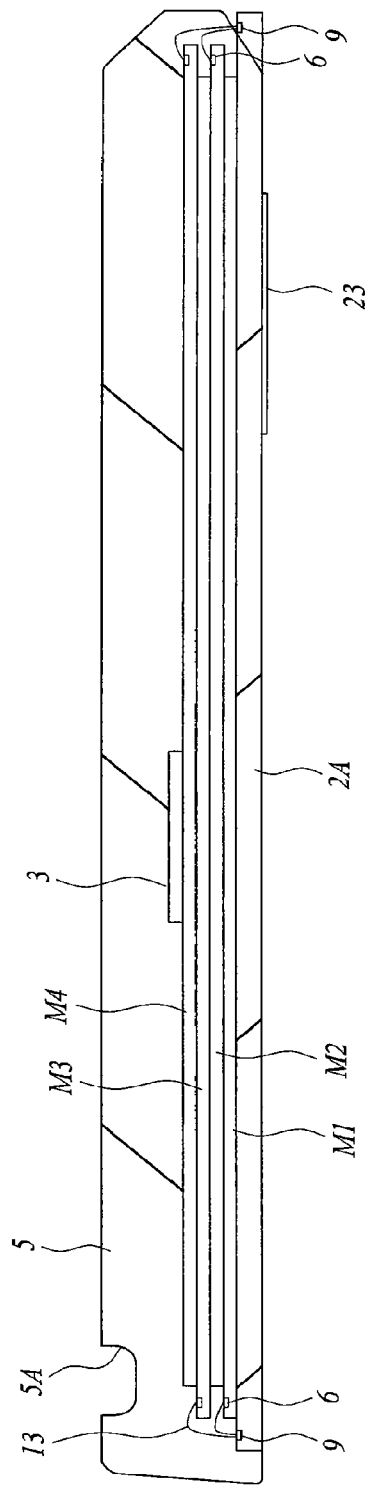
FIG. 4A is a cross sectional view of a memory card in which a stacking method of the memory chips is modified.
Figure 4B:
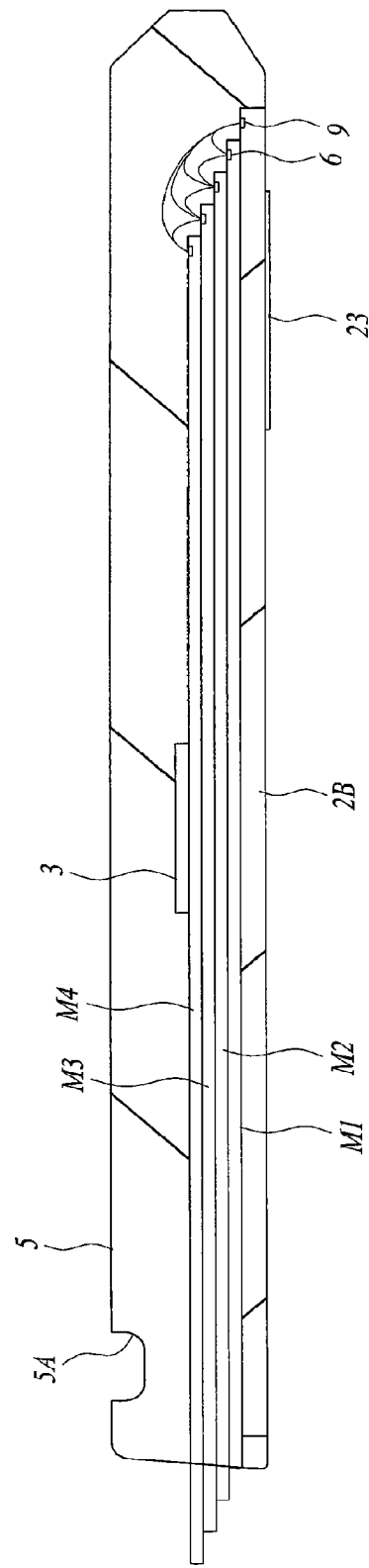
FIG. 4B is a cross sectional view of a memory card in which a stacking method of the memory chips is modified.

FIGS. 4A and 4B each show the section of the memory card in which the four memory chips M1 to M4 are stacked in a different manner from that described above and are sealed with the mold resin 5 having the same dimension as the mold resin 5 of the memory card 1A.

FIG. 4A shows an example in which the memory chips M1 and M3 and the memory chips M2 and M4 are disposed in opposite directions and the memory chips M1 to M4 are stacked in an alternately dislocated manner in the long side direction of a wiring board 2A. In this case, since the pads 9 have to be provided on both the front end side and the rear end side of the wiring board 2A of the memory card 1A, the dimension in the long side direction is increased as compared with the wiring board 2 of the present embodiment, so that the wiring board 2A is exposed outside the mold resin 5.

FIG. 4B shows an example in which the four memory chips M1 to M4 are disposed in the same direction and stacked in a dislocated manner by a predetermined distance in the direction toward the rear end portion of the memory card so that the pads 6 of each of the memory chips M2 to M4 are exposed. Although the wiring board 2B in this case may have the same dimension as the wiring board 2 of the present embodiment, a distance from an end (front end side of the memory card) of the memory chip M1 of the lowermost layer to the other end (rear end side of the memory card) of the memory chip M4 of the uppermost layer is increased, so that the memory chips M2 to M4 are exposed outside the mold resin 5.

Contrary to this, according to the present embodiment, the memory chip M1 of the lowermost layer is connected to the pads 9 provided on the short side on one side of the wiring board 2, and the memory chips M2 to M4 above the lowermost layer are not connected to the pads 9 on the short side of the wiring board 2. More specifically, the memory chips M2 to M4 above the lowermost layer are connected through the pads 9 provided on the long side on one side of the wiring board 2 and the interposer 4 provided on the memory chip M4. By this means, as compared with the case where the pads 9 are provided on two short sides of the wiring board 2, the area reduction equivalent to the pad area of one side can be achieved. Further, by providing the pads 9 on the long side on one side of the wiring board 2, the connection to the memory chips M2 to M4 above the lowermost layer can be achieved.

Also, by providing the pads 9 to the short side on one side and the long side on one side of the wiring board 2, as compared with the case where the pads are provided on two short sides, the wiring board 2 and the memory chips M1 to M4 can be approximated in size with a substantially equal dimensional allowance for the short side and the long side.

Also, according to the present embodiment, the pads 6 of the memory chip M1 of the lowermost layer are disposed on the short side on one side of the wiring board 2, and the pads 6 of the memory chips M2 to M4 other than the lowermost layer are located on the short side on the other side of the wiring board 2. Further, when viewed from the wiring board 2, the memory chips M1 and M2 of the first layer and the second layer from the bottom are sequentially dislocated to the right in FIG. 3 and the memory chips M3 and M4 of the third layer and the fourth layer are dislocated in the opposite direction (to the left in FIG. 3). By stacking the four memory chips M1 to M4 in this manner, the length in the long side direction of the stacked structure of the four memory chips M1 to M4 can be shortened. As a result, even when the chip size is increased due to the increase in capacity of the flash memory formed in the memory chips M1 to M4, the four memory chips M1 to M4 can be accommodated in the memory card 1A in a stacked manner. Therefore, it is possible to promote the capacity increase of the memory card 1A.

Furthermore, according to the present embodiment, as shown in FIG. 3, the external shape of the side face of the memory card 1A is not symmetrical between the right and left sides. More specifically, the right side face of FIG. 3 has a tapered portion, and the memory chip M2 of the upper layer is extended in this tapered portion. On the other hand, it is not extended on the left side face (portion not tapered) of FIG. 3 unlike the right side. By disposing the memory chip M2 in the tapered portion in this manner, influences due to the increase in length caused by the dislocations for the stacking can be absorbed.

<Connecting Relationship with the Interposer>

Figure 5:
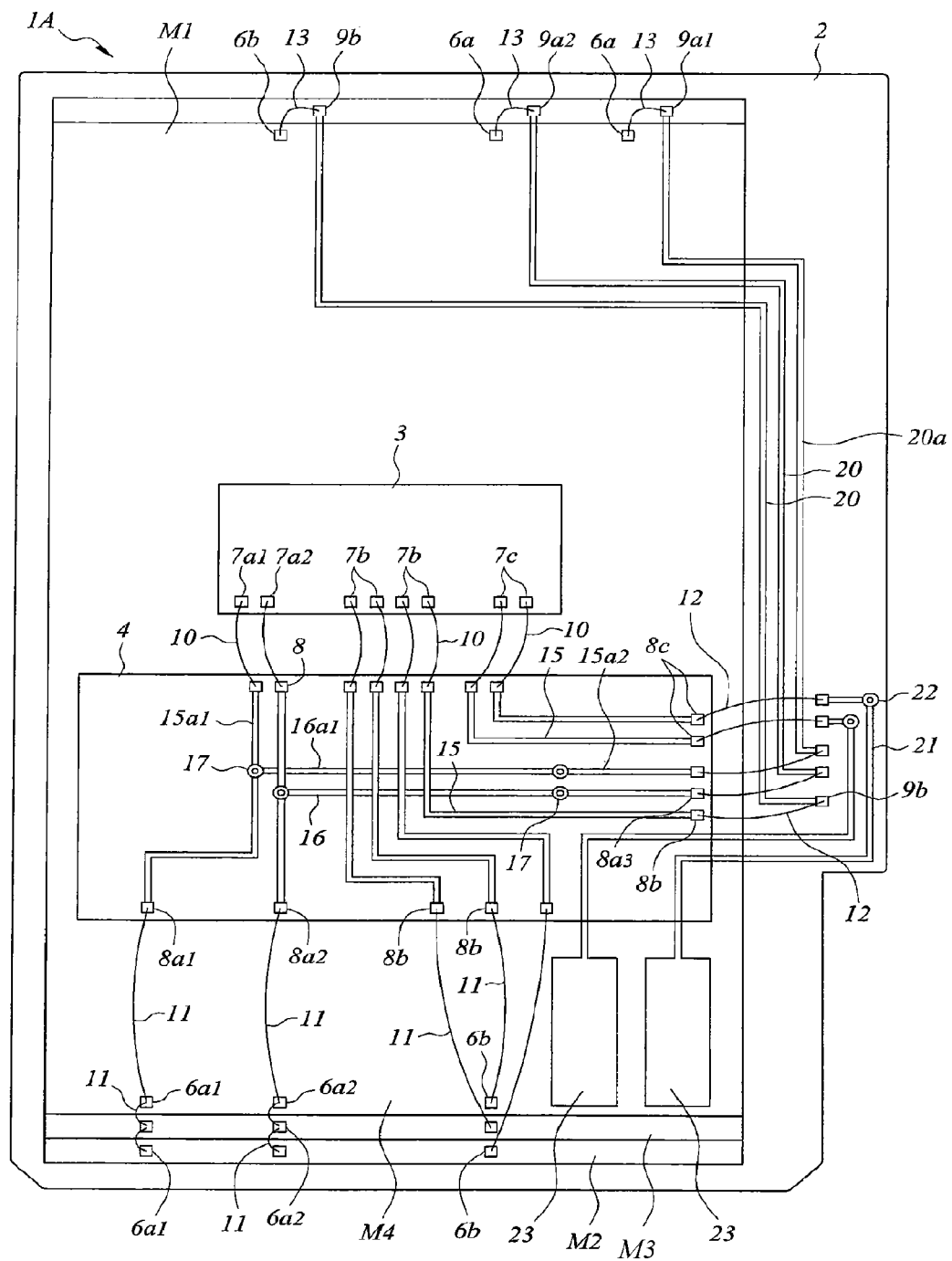
FIG. 5 is a schematic plan view showing the connecting relationship of a controller chip, an interposer, memory chips and a wiring board in the memory card according to an embodiment of the present invention.

FIG. 5 is a schematic plan view showing the connecting relationship of the controller chip 3, the interposer 4, the memory chips M1 to M4 and the wiring board 2 more in detail than FIG. 1.

Figure 6:
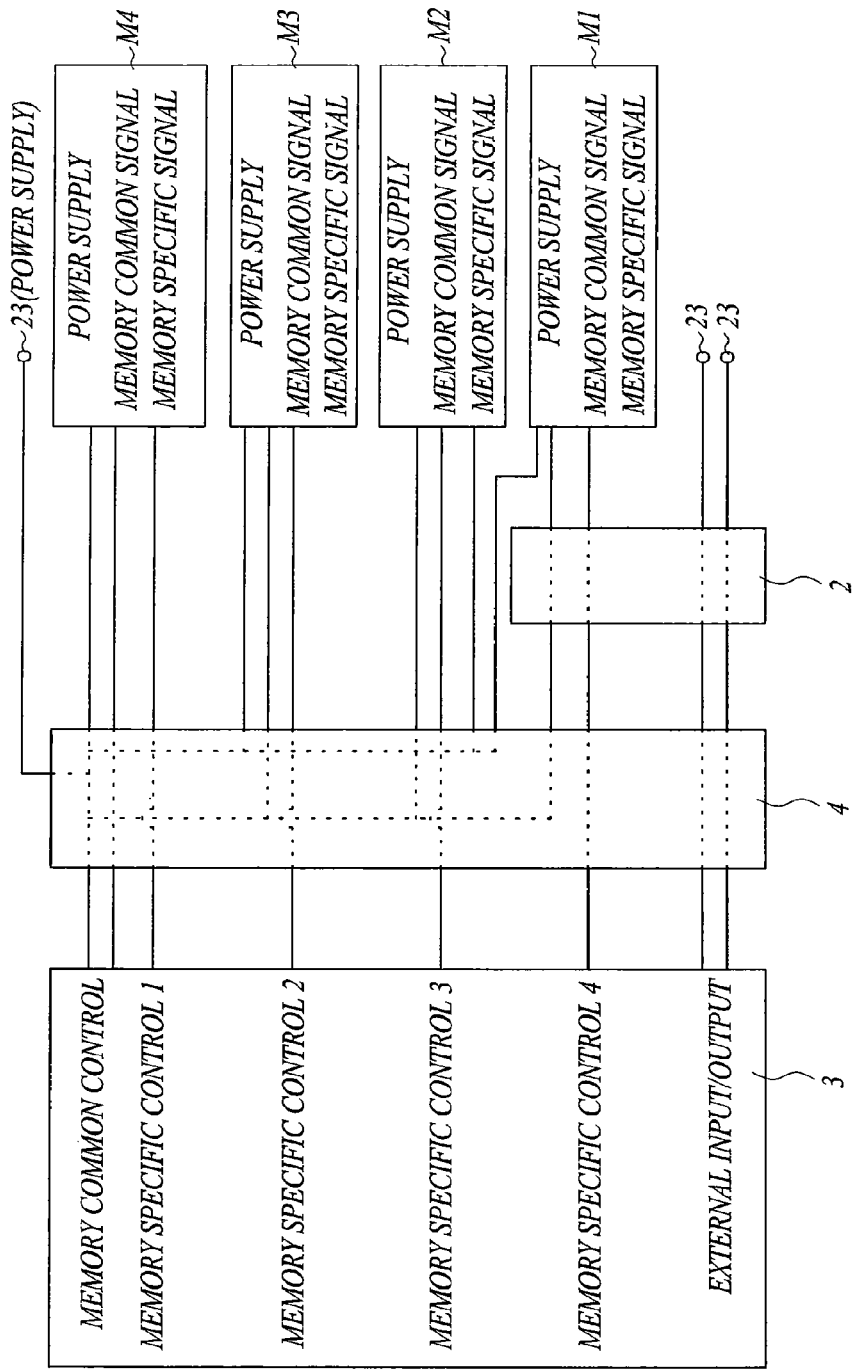
FIG. 6 is a block diagram showing the connecting relationship of a controller chip, an interposer, memory chips and a wiring board in the memory card according to an embodiment of the present invention.

FIG. 6 is a block diagram showing the connecting relationship of the controller chip 3, the interposer 4, the memory chips M1 to M4 and the wiring board 2. Note that only the parts of the pads (6 to 9) and signal wirings connected thereto are shown here for the simplification of the drawing. As for the external connecting terminals 23V for power supply, only one of Vcc and Vss is shown for simplification, but two terminals Vcc and Vss are provided in actual. Note that the "memory common" shown in the drawing means that it is given to each memory chip in common and the "memory specific" means that it is given to any one of a plurality of memory chips.

Figure 7:
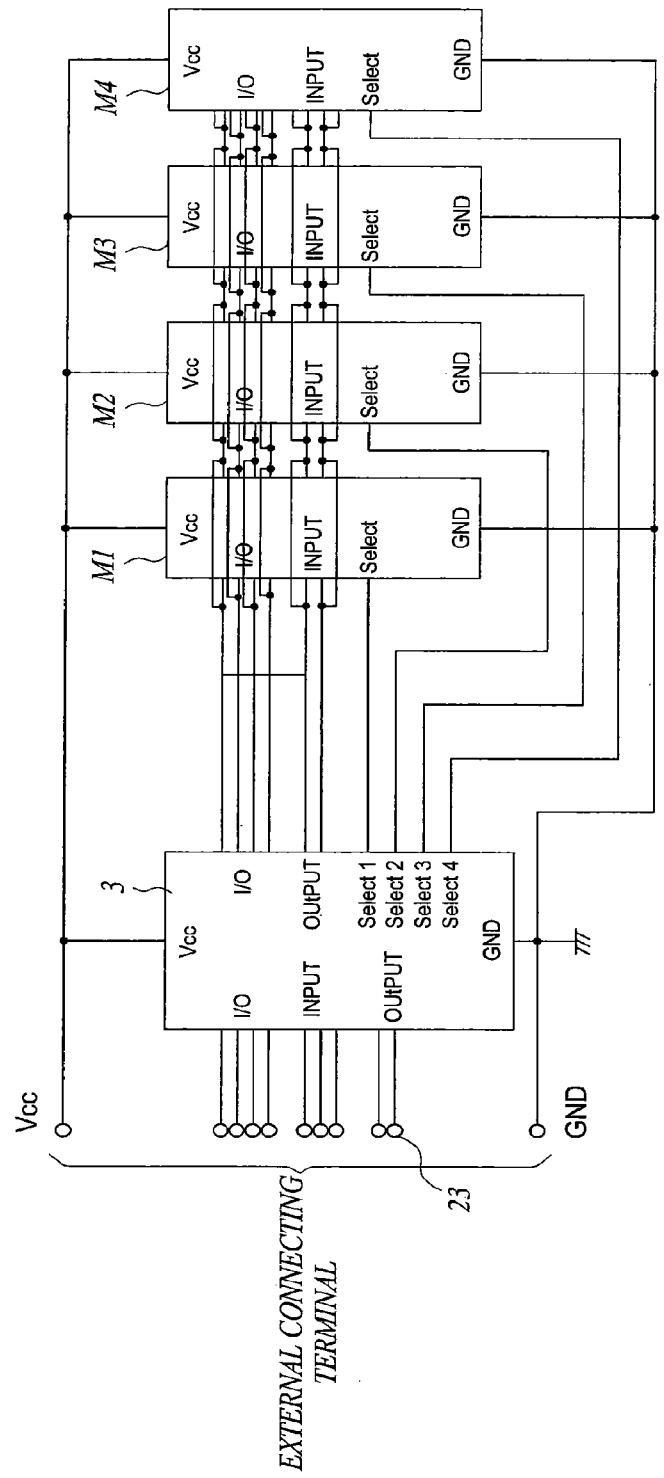
FIG. 7 is a block diagram showing the connecting relationship between respective chips without the interposer.

FIG. 7 shows the connecting relationship between the respective chips without the interposer 4. Vcc and GND (Vss) are given to the controller chip 3 and the memory chips M1 to M4 in common. The I/Ob used for a command signal, address signal and data signal with the controller chip 3 is connected to the memory chips M1 to M4 and the controller chip 3. Also, by Select signals (1 to 4) from the controller chip 3, any one of the memory chips M1 to M4 is selected. In this case, the I/Ob corresponds to the "memory common" mentioned above and the Select corresponds to the "memory specific".

Next, the above-described connecting relationship will be described with reference to FIG. 5. Powers (Vcc, Vss) are supplied to the memory chips M1 to M4 and the controller chip 3 through the interposer 4. In other words, the power supply pad 7a1 of the controller chip 3 and the power supply pads 6a1 of the memory chips M2 to M4 are connected through a front surface wiring 15a1 of the interposer 4.

The front surface wiring 15a1 is connected to a rear surface wiring 16a1 and a front surface wiring 15a2 through a via hole 17 and to a front surface wiring 20a of the wiring board 2 through the Au wire 12 and others. The front surface wiring 20a is connected to a power supply pad 9a1 of the memory chip M1 and further connected to the external connecting terminal 23 (power supply terminal) on the rear surface of the wiring board 2 shown in FIG. 2.

Each of the memory chips M1 to M4 has a memory common signal pad 6a2 used for the command signal, address signal and data signal and a chip select pad (memory specific signal pad) 6b used for the chip select signal. A memory common signal pad 8a2 and chip select pads (memory specific signal pads) 8b are disposed in the vicinity of the long side on one side of the interposer 4.

Of the four memory chips M1 to M4, the memory common signal pads 6a2 of the memory chips M2 to M4 except the memory chip M1 of the lowermost layer are connected to each other through the Au wires 11, and are connected to a memory common control pad 7a2 of the controller chip 3 through the memory common signal pad 8a2 of the interposer 4. Also, the chip select pads 6b of the memory chips M2 to M4 are connected to the memory specific control pads 7b of the controller chip 3 through the Au wires 11 and the chip select pads 8b of the interposer 4.

On the other hand, the memory common signal pad 6a of the memory chip M1 is connected to a memory common signal pad 8a3 of the interposer 4 through Au wires 12 and 13, a memory common signal pad 9a2 of the wiring board 2 and the front surface wiring 20 formed along the long side of the wiring board 2. This memory common signal pad 8a3 is disposed in the vicinity of the short side on one side of the interposer 4 and connected to the memory common signal pad 8a2 and the memory common control pad 7a2 of the controller chip 3 through a front surface wiring 15, a via hole 17 and a rear surface wiring 16.

Also, the chip select pad 6b of the memory chip M1 is connected to the chip select pad 8b of the interposer 4 through the Au wires 12 and 13, a chip select pad (memory specific signal pad) 9b of the wiring board 2 and a front surface wiring 20 formed along the long side of the wiring board 2. This chip select pad 8b is disposed in the vicinity of the short side on one side of the interposer 4 and connected to the memory specific control pad 7b of the controller chip 3 through the front surface wiring 15.

External I/O pads 8c are formed in the vicinity of the short side on one side of the interposer 4 together with the memory common signal pad 8a3 and the chip select pad 8b connected to the memory chip M1. Also, external I/O pads 7c of the controller chip 3 are connected to the external connecting terminals 23 through the external I/O pads 8c of the interposer 4, the front surface wirings 20, the via holes 22 and the rear surface wirings 21 of the wiring board 2.

As described above, in the present embodiment, one of the long sides of the interposer 4 is used for the connection with the stacked memory chips M2 to M4 of the second and upper layers and the other one of the long sides of the interposer 4 is used for the connection with the controller chip 3. Further, one of the short sides of the interposer 4 is used for the connection with the wiring board. In more detail, one of the short sides of the interposer is used for the connection between the memory chip M1 of the first layer and the controller chip 3, the connection of the power supply to the controller chip 3 and the memory chips M2 to M4, and the connection with the external connecting terminal 23 on the rear surface of the wiring board 2.

By separately using the respective sides of the interposer 4 for each connecting target in this manner, the interposer 4 is used effectively. Also, the side of the interposer 4 (short side in this case) in which pads used for the connection with the wiring board 2 are disposed is set closer to the side of a corresponding memory chip than the other sides provided with the pads. Consequently, since the length of wires for connecting the interposer 4 and the wiring board 2 having a large difference in level can be shortened, the connection stability can be improved.

<Interposer and Chip Select>

Figure 8A:
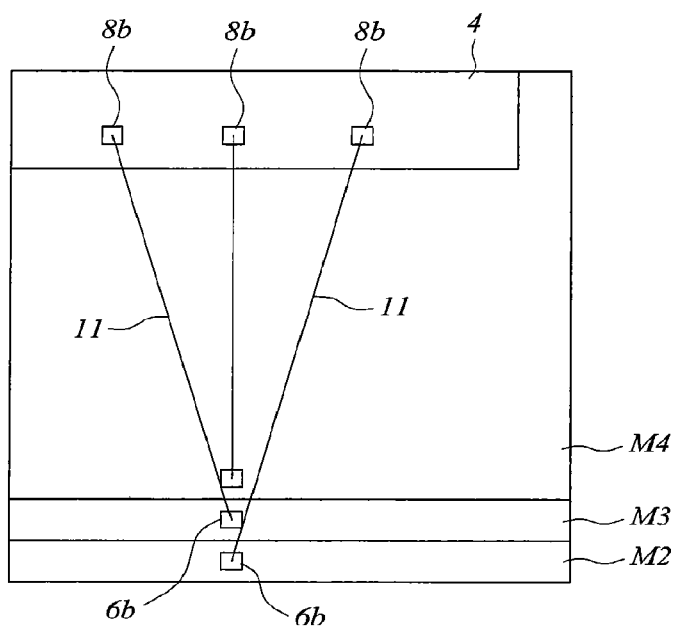
FIG. 8A is an enlarged plan view showing a connecting portion between the chip select pads of an interposer and the chip select pads of memory chips.

FIG. 8A is a plan view showing an enlarged connecting portion between the chip select pads 8b of the interposer 4 and the chip select pads 6b of the memory chips M2 to M4. As described above, when the interposer 4 is provided between the controller chip 3 and the memory chips M2 to M4, the pitch and layout of the pads 8 of the interposer 4 can be changed appropriately.

Thus, when the chip select pad 8b connected to the memory chip M4 is disposed at the center and the chip select pads 8b connected to the memory chips M2 and M3 are disposed on both sides thereof as shown in FIG. 8A, the pitch between the Au wires 11 is increased, and the short-circuit therebetween can be suppressed.

Figure 8B:
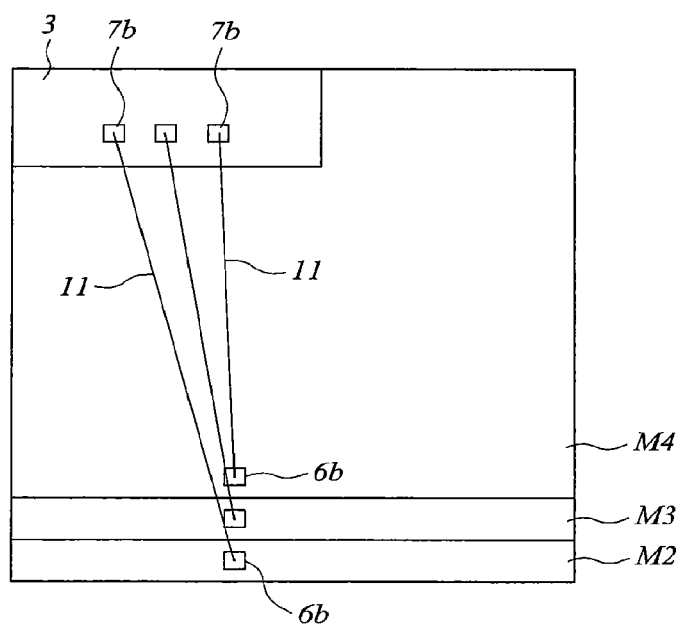
FIG. 8B is an enlarged plan view showing a connecting portion between the memory specific control pads of the controller chip and the chip select pads of the memory chips.

On the other hand, when the memory specific control pads 7b of the controller chip 3 and the chip select pads 6b of the memory chips M2 to M4 are directly connected as shown in FIG. 8B, the pitch between the memory specific control pads 7b is small and the layout thereof cannot be changed. Therefore, the pitch between the Au wires 11 is small, so that a short-circuit likely occurs. As described above, the provision of the interposer 4 between the controller chip 3 and the memory chips M2 to M4 is effective also for prevention of the short-circuit between the Au wires 11.

Second Embodiment

Stacking Method of Memory Chips

Figure 10:
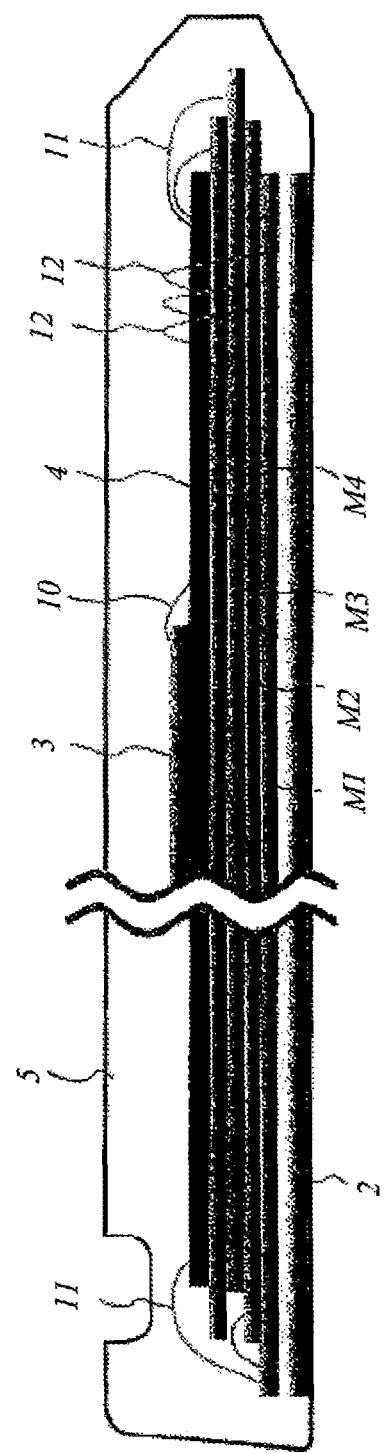
FIG. 10 is a cross sectional view showing another example of the stacking method of the memory chips.
Figure 11:
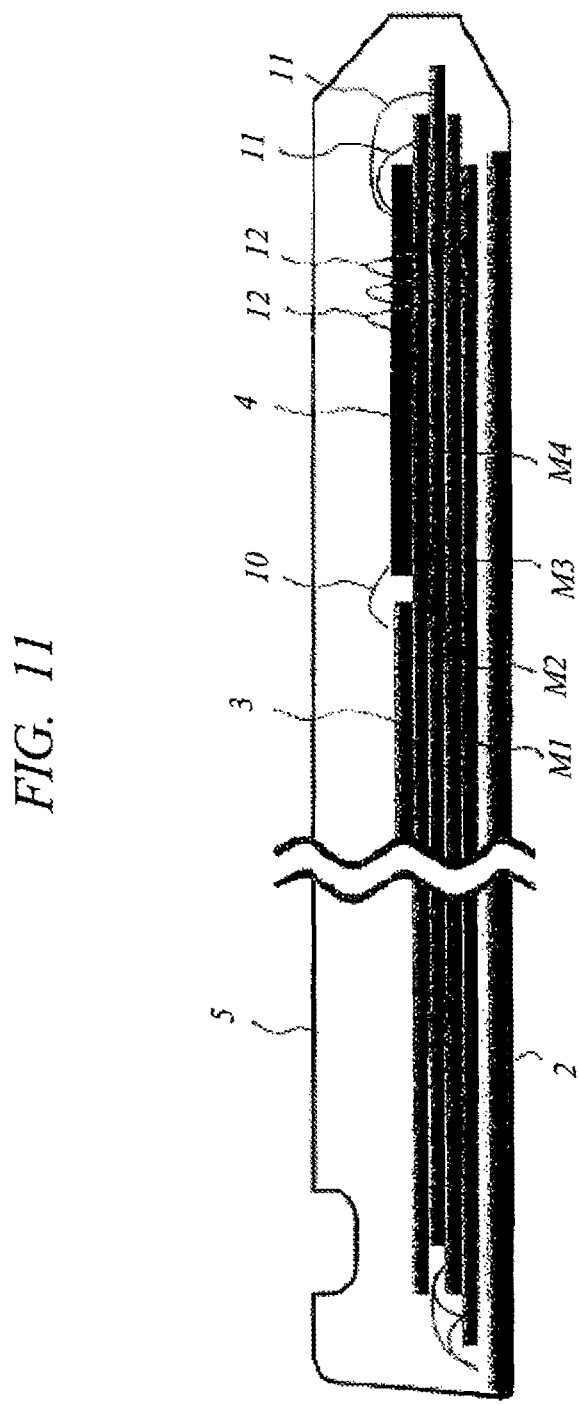
FIG. 11 is a cross sectional view showing another example of the stacking method of the memory chips.

In the present embodiment, a stacking method of four memory chips different from that of the first embodiment will be described. Even when the memory chips M1 to M4 are disposed and stacked as shown in FIGS. 9, 10 and 11, the length in the long side direction of the four memory chips M1 to M4 can be shortened.

Figure 9:
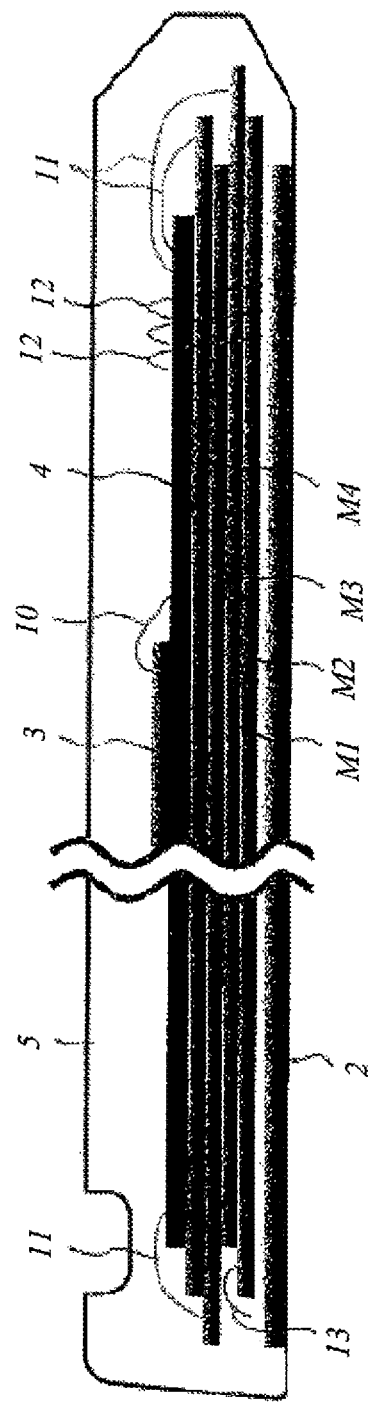
FIG. 9 is a cross sectional view showing another example of the stacking method of the memory chips.

<Stacked Structure of FIG. 9>

According to the stacking method shown in FIG. 9, the memory chips M1 and M3 are disposed so that their short sides on a side in which the pads 6 are formed are located at the rear end portion of the memory card 1A, and the memory chips M2 and M4 are disposed so that their short sides on a side in which the pads 6 are formed are located at the front end portion of the memory card 1A.

Also, the memory chips M1 and M2 are stacked on the right side of the figure with respect to the wiring board 2. The memory chip M3 is stacked on the left side of the figure with respect to the memory chips M1 and M2 so that it substantially overlaps the wiring board 2, and the memory chip M4 is stacked on the right side of the figure with respect to the memory chip M3.

The memory chip M1 is connected to the wiring board 2 through the wire 13. The memory chips M2 and M4 are connected to the interposer 4 on the right side of the figure, and the memory chip M3 is connected to the interposer 4 on the left side of the figure. The interposer 4 is connected on the long side of the wiring board 2 through the wire 12.

In this case, in order to reduce the length of the Au wires 11 for connecting the memory chips M1 and M3 with the interposer 4 and the length of the Au wires 11 for connecting the memory chips M2 and M4 with the interposer 4, the length of the interposer 4 in the long side direction of the memory chips M1 to M4 is extended compared with the first embodiment.

Further, since the area of the interposer 4 is increased in this case, the controller chip 3 is mounted on the surface of the interposer 4. In this stacked structure, the wires 11 can be dispersed to both the right and left sides.

<Stacked Structure of FIG. 10>

In FIG. 10, the memory chip M1 and the wiring board 2 are disposed so that they substantially overlap each other. The memory chip M2 is connected to the interposer 4 through the memory chip M1, and the memory chips M3 and M4 are connected to the interposer 4 by the side on an opposite side to the memory chips M1 and M2. The description of the portion similar to that of the stacked structure of FIG. 9 is omitted.

Since the memory chip M1 and the wiring board 2 are not connected directly in this stacked structure, it is not necessary to provide the pads to be connected directly to the memory chip M1 on the short side of the wiring board 2.

<Stacked Structure of FIG. 11>

In FIG. 11, the memory chips M1 and M2 are connected to the wiring board 2 on the left side of the figure, and the memory chips M3 and M4 are connected to the interposer 4 on the right side of the figure.

Since the two memory chips M1 and M2 are directly connected to the wiring board 2 in this stacked structure, the connection of the interposer 4 is not complicated compared with the structure in which the interposer 4 is connected to three or more memory chips.

A common point between the stacking method of the present embodiment and the stacking methods shown in FIGS. 9 to 11 lies in that two or three of the memory chips M2 to M4 are stacked in a dislocated manner by a predetermined distance in the long side direction of the memory chip M1 of the lowermost layer and that some memory chips such as the memory chips M3 and M4 are connected to the wiring board 2 through the interposer 4. Also, a common point between FIG. 9 and FIG. 10 lies in that the connection to the interposer 4 is made from both the right and left sides.

Third Embodiment

Figure 12:
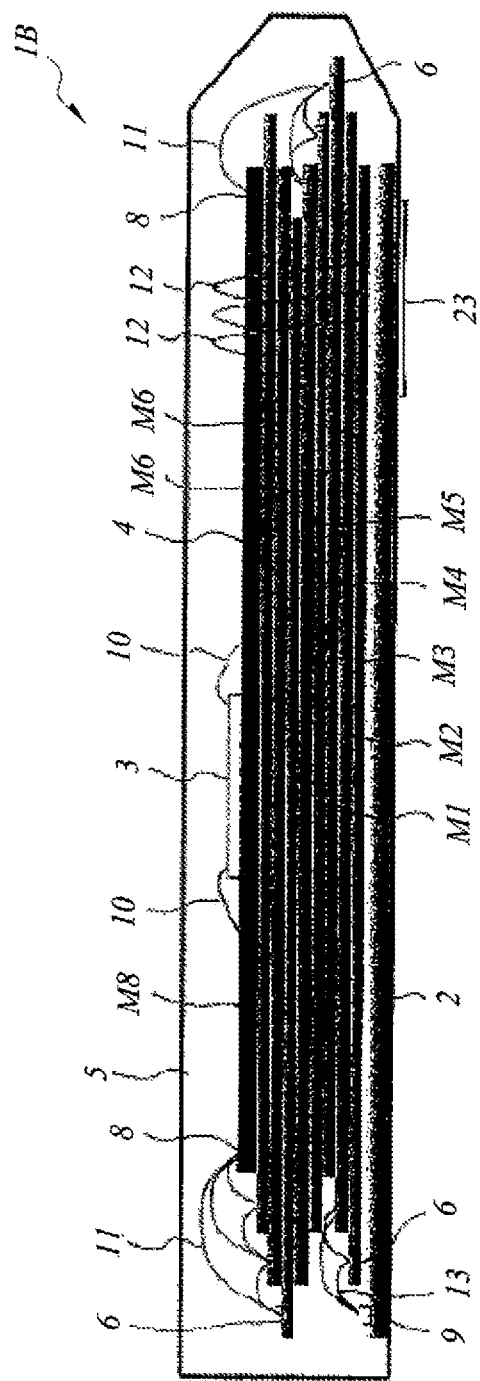
FIG. 12 is a cross sectional view of a memory card according to another embodiment of the present invention.

FIG. 12 is a cross sectional view showing the memory card of the present embodiment. In this memory card 1B, eight memory chips M1 to M8 are stacked on the surface of the wiring board 2 in the order of M1 to M8 from the bottom layer.

A plurality of pads 6 are formed in the vicinity of one side (short side) of each of the memory chips M1 to M8. The interposer 4 is mounted on the surface of the memory chip M8 of the uppermost layer, and the controller chip 3 is mounted on the surface of the interposer 4. A plurality of pads 8 are formed in the vicinity of the two short sides of the interposer 4, and these pads 8 and the pads 6 of the memory chips M3 to M8 are connected through the Au wires 11.

On the other hand, the memory chip M1 of the lowermost layer and the memory chip M2 thereon are connected to the front surface wiring (not shown) of the wiring board 2 through the Au wires 13. This front surface wiring is formed along the long side on one side of the wiring board 2 and connected to the pads (not shown) of the interposer 4 through the Au wire 12, and further connected to the controller chip 3 through the Au wire 10. Although not shown, the pads of the interposer 4 to which one ends of the Au wires 12 are connected are formed along the long side of the interposer 4.

Also, a part of the pads formed along the long side of the interposer 4 is connected to the front surface wiring (not shown) of the wiring board 2 through the Au wire 12 and further connected to the external connecting terminals 23 through the front surface wiring, the via hole (not shown) and the rear surface wiring.

In the example shown in FIG. 12, the two memory chips M1 and M2 of the lower layers are connected to the interposer 4 through the front surface wiring of the wiring board 2, and the memory chips M3 to M8 of the upper layers are connected to the interposer 4 not through the front surface wiring. However, it is also possible to connect the three memory chips M1 to M3 of the lower layers to the interposer 4 through the front surface wiring of the wiring board 2 and to connect the memory chips M4 to M8 of the upper layers to the interposer 4 not through the front surface wiring.

The stacking method in the case where the eight memory chips M1 to M8 are stacked on the surface of the wiring board 2 has been described here. In general, when a plurality of memory chips are to be stacked on the surface of the wiring board and the number of memory chips is n (n is 4 or more), the length of the stacked memory chips can be shortened by setting the number of memory chips to be dislocated continuously in the same direction to two or more and less than n/2.

When the eight memory chips M1 to M8 are stacked on the surface of the wiring board 2 like in the present embodiment, the number of memory chips to be dislocated continuously in the same direction is preferably set to less than four and two or more. In the example shown in the figure, three memory chips M1 to M3 are disposed in a dislocated manner in the front end direction of the memory card 1B, three memory chips M4 to M6 thereon are disposed in a dislocated manner in the rear end direction of the memory card 1B, and two memory chips M7 and M8 further thereon are disposed in a dislocated manner in the front end direction of the memory card 1B. Also, the side provided with the pads of the memory chip of the uppermost layer (in the group) of the memory chips dislocated continuously is located on an opposite side to those of the other memory chips (in the group). More specifically, the pad side of the memory chip M3 is opposite to the pad sides of the memory chips M1 and M2, and the pad side of the memory chip M6 is also opposite to the pad sides of the memory chips M4 and M5.

Note that, as for the memory chip of the uppermost layer of all the memory chips or the memory chip closest to the interposer 4, it does not matter if the pad side is opposite to the others or not. In the example shown in the figure, the pad side of the memory chip M8 is not opposite to that of the memory chip M7.

Figure 13:
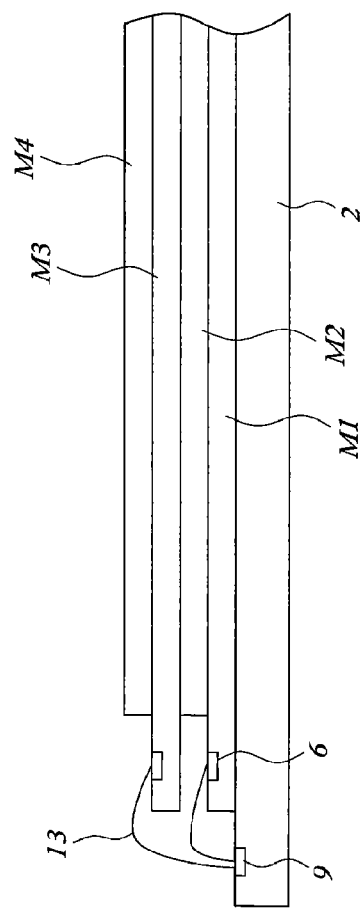
FIG. 13 is a schematic view showing the stacking method of a comparative example.

For example, in the stacking method in which the memory chips M1 to M4 are alternately dislocated one by one as shown in FIG. 13, the memory chip M3 above the memory chip M1 by two layers overlaps the pad 6 of the memory chip M1. Therefore, the memory chip M3 cannot be stacked until the Au wire 13 is bonded to the pad 6 of the memory chip M1. On the other hand, when the number of memory chips to be dislocated continuously in the same direction is increased more than (n/2), the length of the stacked memory chips is increased.

Accordingly, in the stacked structure using the interposer 4, the length of the stacked memory chips can be shortened.

Fourth Embodiment

In recent years, the memory card of the cellular phone has been demanded to achieve a reduced size and a smaller thickness as represented by a micro SD card. On the other hand, however, since an increased capacity in the memory chip to be accommodated in the memory card has been demanded, the size of the memory chip is made as close to the size of the wiring board of the memory card as possible, and a plurality of memory chips are stacked to achieve the increased capacity. Contrary to this, the size of the controller chip to be accommodated in the memory card tends to be reduced in order to increase the number of the chips which can be acquired from a single semiconductor wafer, so that the difference in dimension with respect to the memory chip has been gradually increased. Further, since the controller chip has more pads (bonding pads) than the memory chip, when the chip size is decreased, the pads disposed on one side or two sides of the chip conventionally need to be disposed on three sides or four sides of the chip.

For such a reason, the space for disposing pads for wire bonding on the wiring board becomes extremely small in a small and thin memory card like the micro SD card, so that it has become increasingly difficult to connect the controller chip and the wiring board with wires.

Also, if the pads are disposed along three sides or four sides of the controller chip, when the controller chip and other components (wiring board and memory card) are connected with wires, it is difficult to extend the wires depending on the positions of the pads of the other components. Also, even if the controller chip and the other components can be connected with wires, bonding becomes unstable due to the increased length of the wires, and the memory card cannot be reduced in thickness because the loop height of the wires cannot be decreased.

Figure 15A:
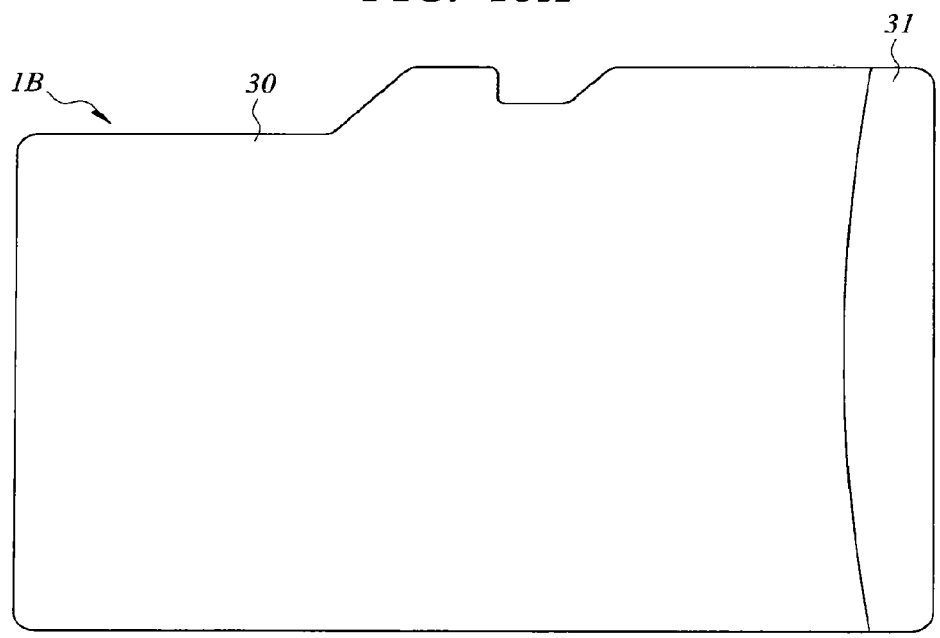
FIG. 15A is a plan view showing the appearance (front surface side) of a memory card according to another embodiment of the present invention.
Figure 15B:
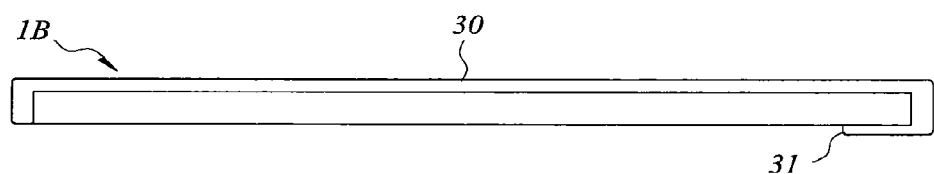
FIG. 15B is a side view of this memory card.
Figure 15C:
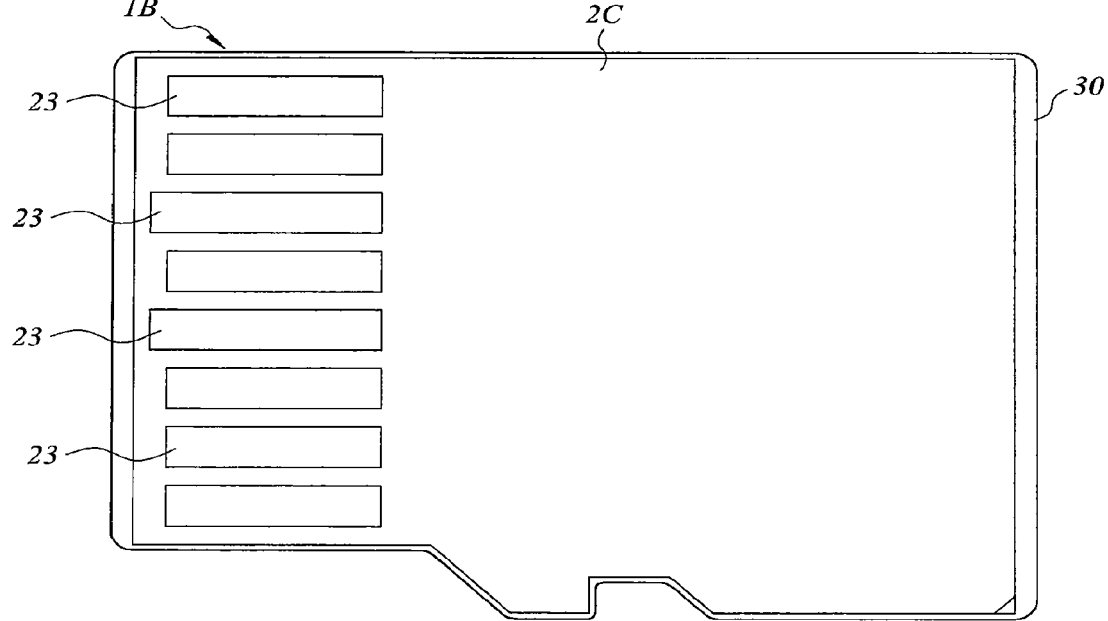
FIG. 15C is a plan view showing the appearance (rear surface side) of this memory card.
Figure 16:
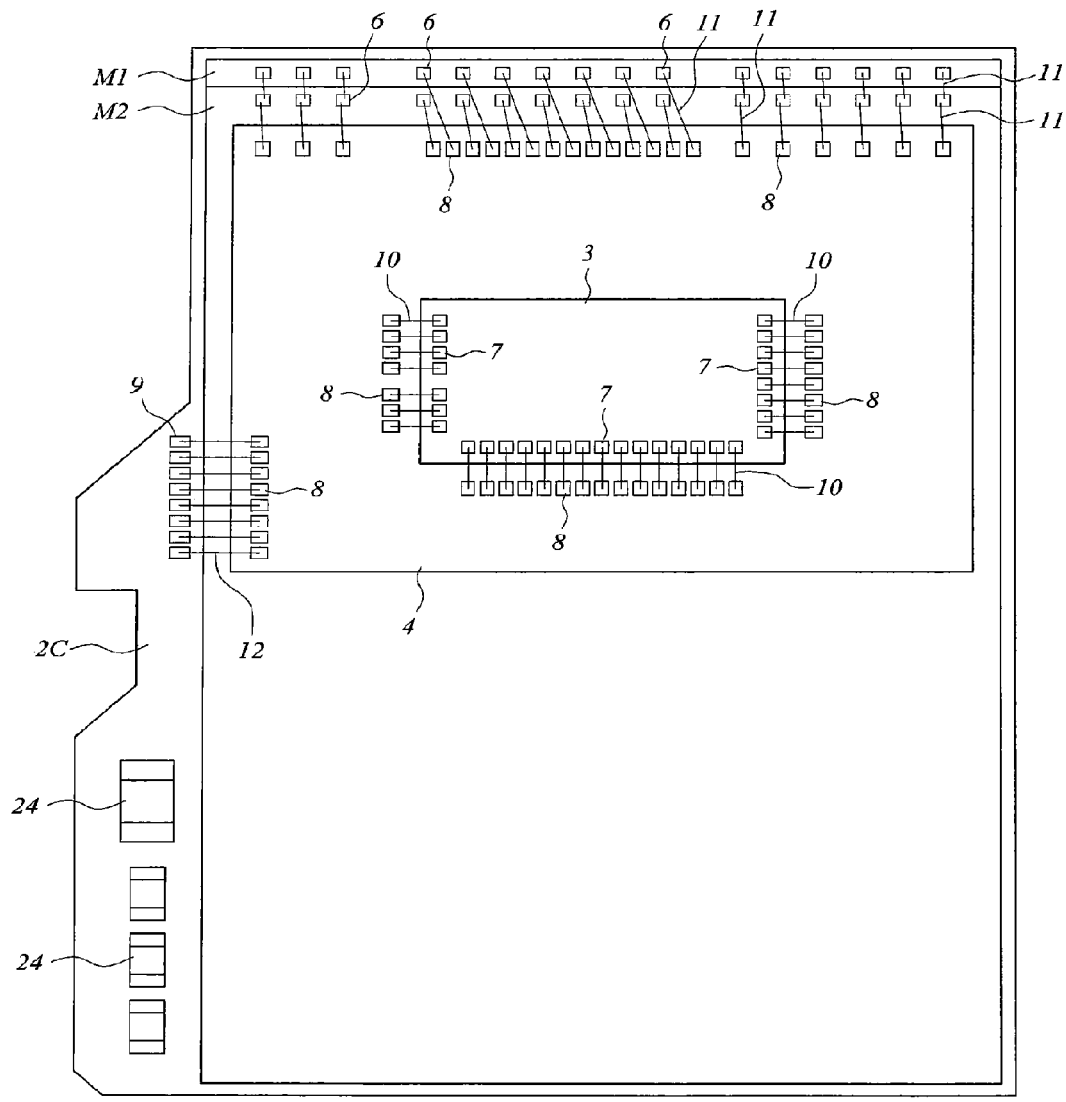
FIG. 16 is a plan view showing a wiring board of the memory card shown in FIG. 15.

The present embodiment and subsequent embodiments are made to solve these problems. Hereinafter, the embodiments applied to the micro SD card will be described in detail. FIG. 15A is a plan view showing the appearance (front surface side) of the memory card according to the present embodiment, FIG. 15B is a side view of this memory card, FIG. 15C is a plan view showing the appearance (rear surface side) of the memory card, FIG. 16 is a plan view showing the wiring board of the memory card and FIG. 17 is a cross sectional view showing the wiring board of the memory card.

The memory card 1B of the present embodiment is constituted of a cap 30 made of synthetic resin and a wiring board 2C accommodated in this cap 30. As for its external dimensions, its long side and short side are 15 mm×11 mm and its thickness is 1.0 mm except the portion in which a protrusion 31 is formed. Although not shown, a product name, a manufacturer name, memory capacity and others are printed on the surface of the cap 30 which serves as the surface of the memory card 1B. The protrusion 31 is provided along one side (short side) of the cap 30 which serves as a rear end portion when the memory card 1B is inserted into a card slot of a cellular phone. By providing this protrusion 31, insertion of the memory card 1B into the card slot and removal thereof from the card slot can be facilitated.

The wiring board 2C accommodated in the cap 30 is mainly made of glass epoxy resin, and two memory chips M1 and M2, one controller chip 3 and one interposer 4 are mounted on the main surface (front surface) thereof. Also, a small passive element such as a chip capacitor 24 is mounted on the main surface of the wiring board 2C according to need.

Figure 17:
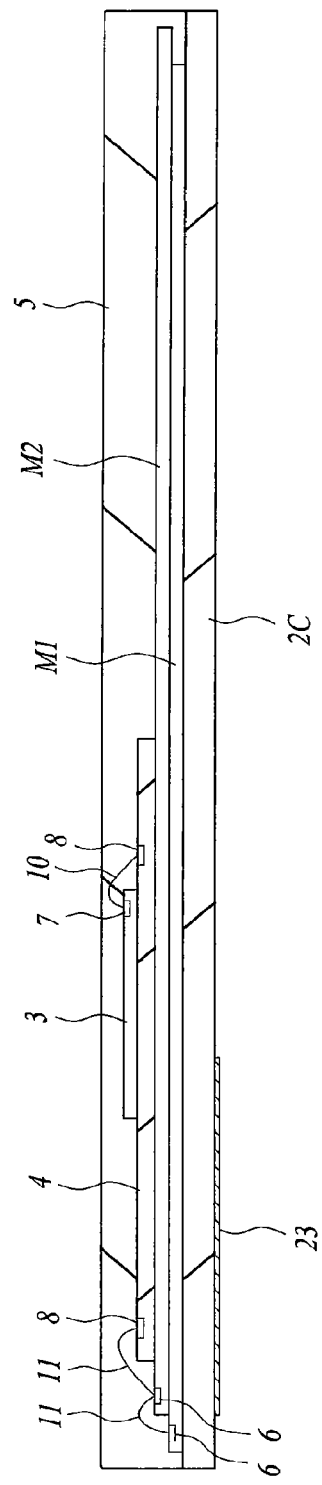
FIG. 17 is a cross sectional view showing the wiring board of the memory card shown in FIG. 15.

As shown in FIG. 17, the main surface of the wiring board 2C is covered with the mold resin 5 for sealing the memory chips M1 and M2, the controller chip 3 and the interposer 4. The mold resin 5 is made of, for example, thermoset epoxy resin to which quartz filler is added. The thickness of the wiring board 2C is about 0.2 mm and the total thickness of the wiring board 2C and the mold resin 5 is about 0.7 mm.

The rear surface of the wiring board 2C is not covered with the cap 30 and is exposed to the rear surface side of the memory card 1B. As shown in FIG. 15C, eight external connecting terminals 23 are formed on the rear surface of the wiring board 2C. These external connecting terminals 23 include, for example, a power supply terminal (Vdd), a grounding terminal (Vss), a command terminal (CMD), a clock terminal (CLK), and four data I/O terminals (I/O). These external connecting terminals 23 are connected to the interposer 4 through the rear surface wiring, via hole and front surface wiring (not shown) formed in the wiring board 2C like in the memory card 1A of the first embodiment, and further electrically connected to the controller chip 3 and the memory chips M1 and M2 through the interposer 4. Further, these external connecting terminals 23 are disposed along one side (short side) which serves as a front end portion when the memory card 1B is inserted into the card slot of the cellular phone like the external connecting terminals 23 formed on the memory card 1A of the first embodiment. Therefore, when the memory card 1B is mounted in the card slot of the cellular phone, the terminals of the connectors incorporated in the card slot and the external connecting terminals 23 come into contact with each other, so that exchange of signals and supply of electric power between the memory card 1B and the cellular phone are carried out.

As shown in FIG. 16, the two memory chips M1 and M2 mounted on the main surface of the wiring board 2C are disposed on the wiring board 2C so that their long sides are directed in the same direction as the long side of the wiring board 2C, and the wiring board 2C is disposed so that its long side is directed in the same direction as the long side of the memory card 1B. A plurality of pads (terminals) 6 connected to a memory cell (circuit) portion in the chip are formed in the vicinity of the one side (short side) of the main surface of each of the memory chips M1 and M2, and the memory chips M1 and M2 are disposed so that their short sides in which the pads 6 are formed are located at the front end portion of the memory card 1B. Therefore, the memory chip M2 stacked on the memory chip M1 is mounted on the memory chip M1 in a dislocated manner in the direction toward the rear end portion of the memory card 1B so as to expose the pads 6 of the memory chip M1 of the lower layer to such an extent that the rear end portion of the memory chip M1 does not exceed the rear end portion of the memory card 1B.

An electrically erasable and writable nonvolatile memory (flash memory) having a memory capacity of, for example, 8 gigabits is formed in each of the main surfaces of the memory chips M1 and M2. Therefore, the memory card 1B of the present embodiment having the two memory chips M1 and M2 has a memory capacity of 8 gigabits×2=16 gigabits (2 gigabytes).

The interposer 4 is mounted on the memory chip M2 of the upper layer. The interposer 4 is composed of, for example, a glass epoxy resin substrate having a thickness of about 0.09 mm in which two layers of wirings are formed. This interposer 4 has a long side slightly shorter than the short side of the memory chips M1 and M2 and is mounted on the memory chip M2 so that one of the long sides is located in the vicinity of the pads 6 of the memory chip M2. A plurality of pads 8 are formed in a row in the vicinity of the long side of the interposer 4, and these pads 8 are electrically connected to the pads 6 of the memory chip M2 through the Au wires 11. Also, the pads 6 of the memory chip M1 of the lower layer and the pads 6 of the memory chip M2 of the upper layer are electrically connected through the Au wires 11. In other words, the two memory chips M1 and M2 are electrically connected to each other through the Au wires 11 and electrically connected to the interposer 4. When the memory chips M1 and M2 and the interposer 4 are electrically connected through the Au wires 11, by disposing the pads 8 of the interposer 4 in the vicinity of the pads 6 of the memory chip M2, the length of the Au wires 11 can be shortened, thereby decreasing the loop height of the Au wires 11.

The controller chip 3 is mounted on the interposer 4. The controller chip 3 is formed of a rectangular silicon chip and has a thickness of about 0.1 mm. A plurality of pads 7 are formed along three sides of the main surface of the controller chip 3. On the other hand, a plurality of pads 8 are formed on the interposer 4 along the plurality of the pads 7 of the controller chip 3, and these pads 8 and the pads 7 of the controller chip 3 are electrically connected through the Au wires 10.

When the controller chip 3 and the interposer 4 are electrically connected through the Au wires 10, the controller chip 3 is mounted on the interposer 4 and the pads 8 of the interposer 4 are disposed in the vicinity of the controller chip 3. By this means, since the length of the Au wires 10 for electrically connecting the controller chip 3 in which the plurality of the pads 7 are formed along the three sides thereof and the interposer 4 can be shortened, the loop height of the Au wires 10 can be decreased.

A plurality of pads 9 are formed on the main surface of the wiring board 2C along one of the long sides thereof. Although not shown, these pads 9 are connected to the external connecting terminals 23 through the front surface wiring, the via hole and the rear surface wiring formed in the wiring board 2C like in the memory card 1A of the first embodiment. On the other hand, a plurality of pads 8 are formed on the interposer 4 in the vicinity of these pads 9, and these pads 8 and the pads 9 of the wiring board 2C are electrically connected through the Au wires 12. When electrically connecting the wiring board 2C and the interposer 4 with the Au wires 12, by disposing the pads 8 of the interposer 4 in the vicinity of the pads 9 of the wiring board 2C as described above, the length of the Au wires 12 can be shortened and the loop height of the Au wires 12 can be decreased.

As shown in FIG. 16, a slight protrusion is provided on one of the long sides of the wiring board 2C. Also, since most of the main surface of the wiring board 2C is occupied by the memory chips M1 and M2, there is no space to dispose the pads 9 in other area than this protrusion. Therefore, in the memory card 1B of the present embodiment, by making use of the slight protrusion provided on the long side on one side of the wiring board 2C, the pads 9 and the small passive element (chip capacitor 24) are disposed thereon. Then, the pads 8 of the interposer 4 are disposed in the vicinity of the pads 9, and the pads 9 and the pads 8 are electrically connected through the Au wires 12.

Figure 18:
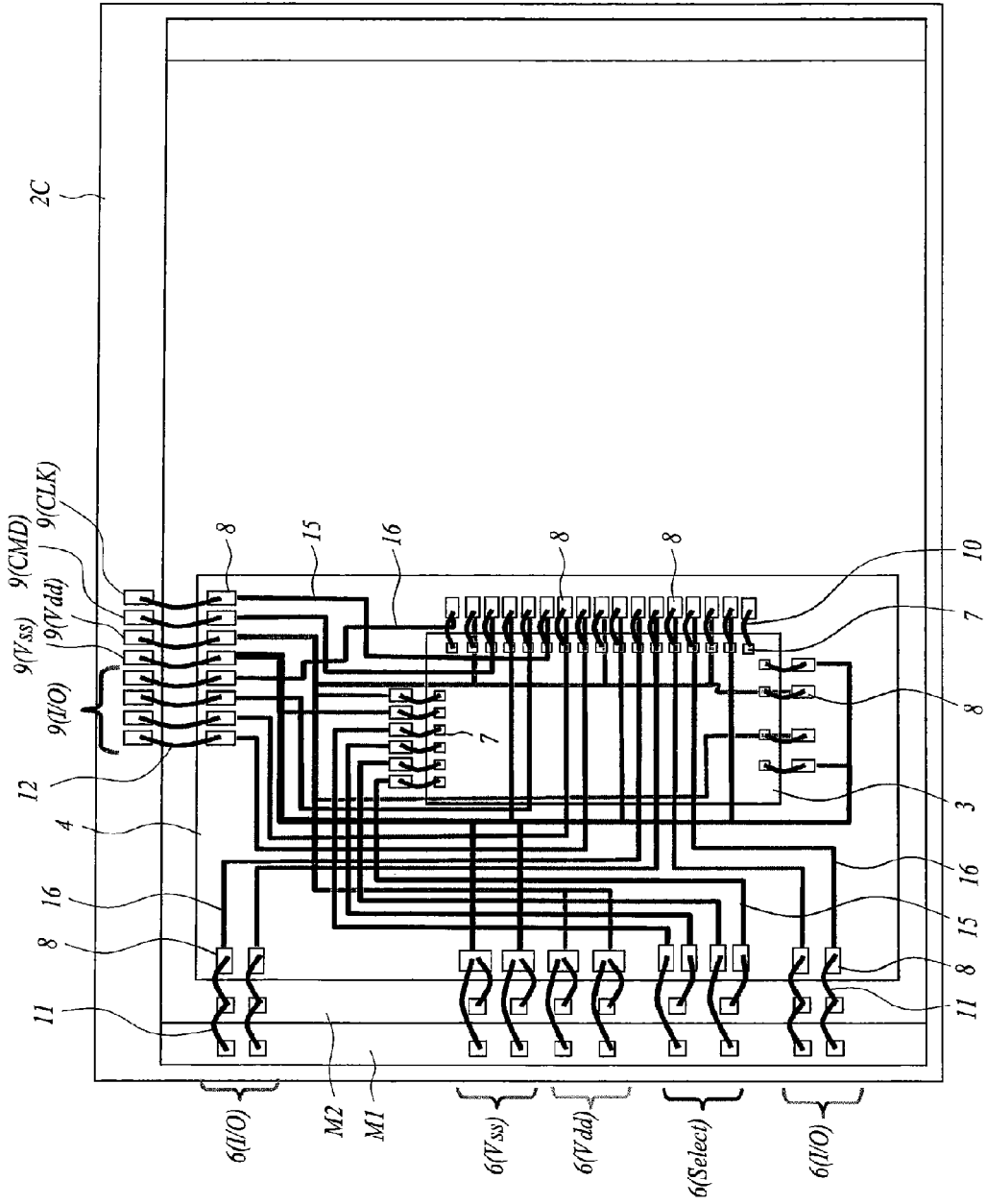
FIG. 18 is a circuit diagram schematically showing the connecting relationship of the wiring board, the memory chips, the controller chip and the interposer of the memory card shown in FIG. 15.

FIG. 18 is a circuit diagram schematically showing the connecting relationship of the wiring board 2C, the memory chips M1 and M2, the controller chip 3 and the interposer 4.

Wirings 15 and 16 of two layers are formed in the interposer 4 like in the interposer 4 of the first embodiment. Then, the memory chips M1 and M2, the controller chip 3 and the wiring board 2C are electrically connected to one another through the wirings 15 and 16 of the interposer 4. Therefore, by modifying the layout of the pads 8 and the wirings 15 and 16 of the interposer 4, the order of signals to be input or output into/from the interposer 4 and the pad pitch can be changed like in the memory card 1A of the first embodiment. Consequently, the freedom of wiring design is improved as compared with the case where the memory chips M1 and M2, the controller chip 3 and the wiring board 2C are connected with one another through the wirings formed on the wiring board 2C, and the memory chips M1 and M2 having a large area can be mounted on the wiring board 2C having a limited area.

Also, as described above, by mounting the controller chip 3 on the interposer 4 and disposing the pads 8 of the interposer 4 in the vicinity of the controller chip 3, the length of the Au wires 10 for electrically connecting the controller chip 3 on which the pads 7 are formed along the three sides thereof and the interposer 4 can be shortened. Accordingly, the memory chips M1 and M2, the controller chip 3 and the interposer 4 can be stacked and mounted on the extremely thin wiring board 2C having a thickness of 0.7 mm including the thickness of the mold resin 5.

The interposer 4 can be constituted of a silicon chip or a flexible resin substrate in which wirings of two layers are formed, other than the glass epoxy resin substrate in which the wirings of two layers are formed. Also, unless mutual connection with the wiring board 2C, the memory chips M1 and M2 and the controller chip 3 is complicated, the interposer with a single layer wiring structure can be used.

Figure 19:
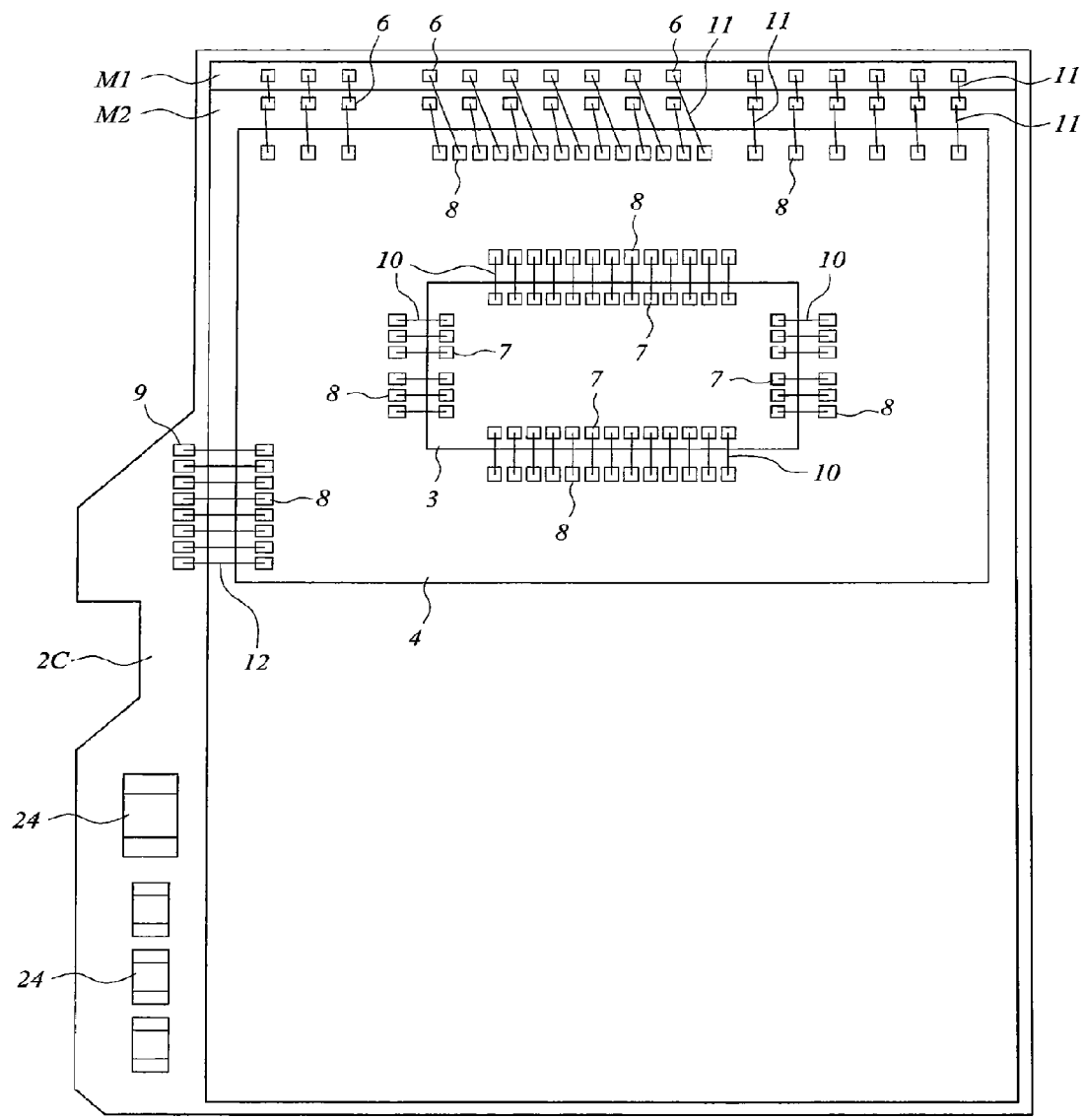
FIG. 19 is a plan view showing a wiring board of a memory card according to another embodiment of the present invention.
Figure 20:
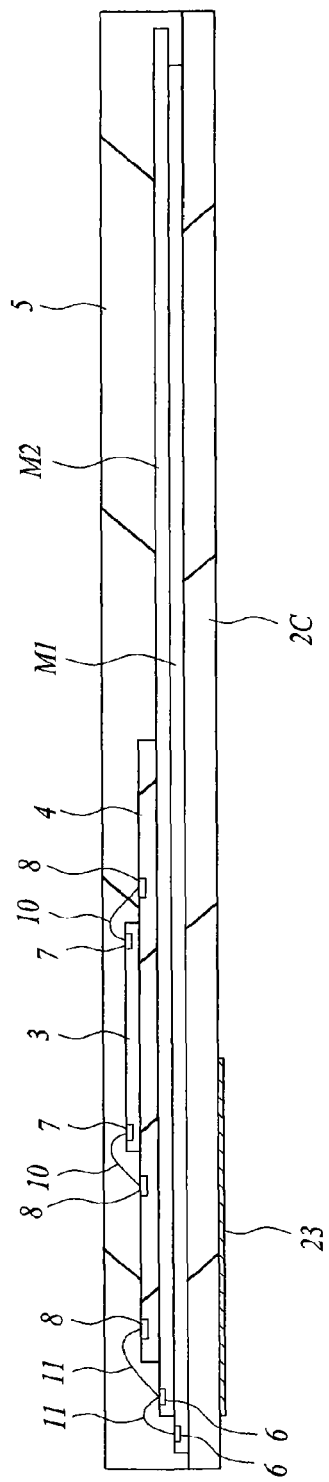
FIG. 20 is a cross sectional view showing the wiring board of the memory card according to another embodiment of the present invention.

Although the present embodiment has been described based on the case of mounting the controller chip 3 in which the plurality of pads 7 are formed along the three sides thereof, this can be applied also to the case of mounting the controller chip 3 in which a plurality of pads 7 are formed along four sides thereof. More specifically, by mounting the controller chip 3 in which a plurality of pads 7 are formed along the four sides thereof on the interposer 4 and disposing the pads 8 of the interposer 4 in the vicinity of the pads 7 of the controller chip 3 as shown in FIGS. 19 and 20, the same effect as that described above can be obtained.

In the memory card 1B of the present embodiment, the memory chips M1 and M2 and the controller chip 3 are connected with each other in an enclosed area inside the interposer 4. For the reason, the number of the pads 9 of the wiring board 2C to be connected to the interposer 4 can be reduced to eight (one power supply terminal (Vdd), one grounding terminal (Vss), one command terminal (CMD), one clock terminal (CLK) and four data I/O terminals (I/O)). Consequently, the pads 9 can be disposed in the protrusion having a slight area provided on the long side on one side of the wiring board 2C.

Also, if the manufacturer of the memory chips M1 and M2 and the controller chip 3 is changed in accordance with the product type of the memory card 1B or chips of plural manufacturers are used, the chip size and the layout of the pads are varied. Even in such a case, however, according to the structure of the present embodiment, different types of products can be adopted by only changing the specification of the interposer 4, and the wiring board 2C can be used in common even when the product type is changed.

Fifth Embodiment

Figure 21:
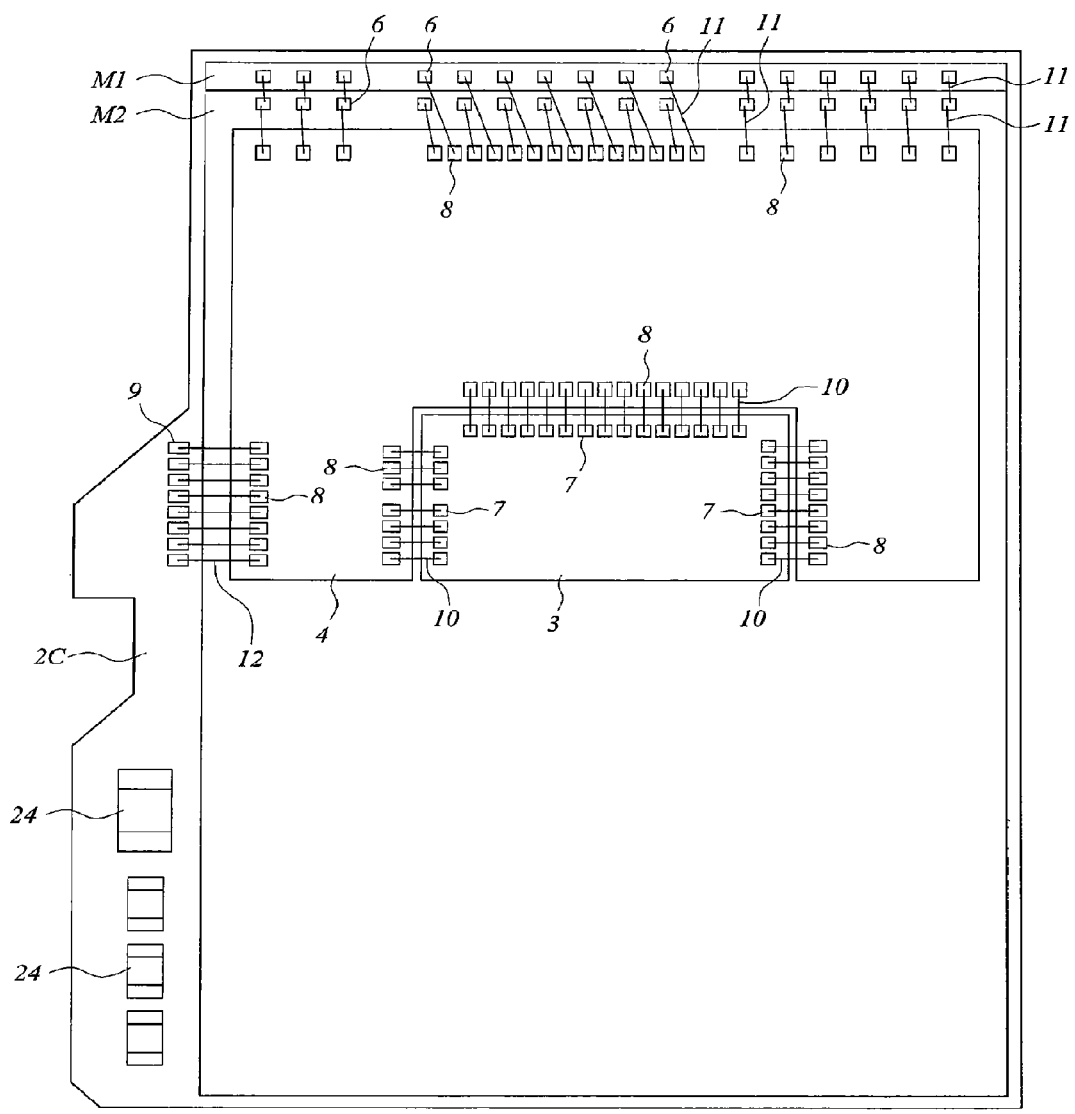
FIG. 21 is a plan view showing a wiring board of a memory card according to another embodiment of the present invention.
Figure 22:
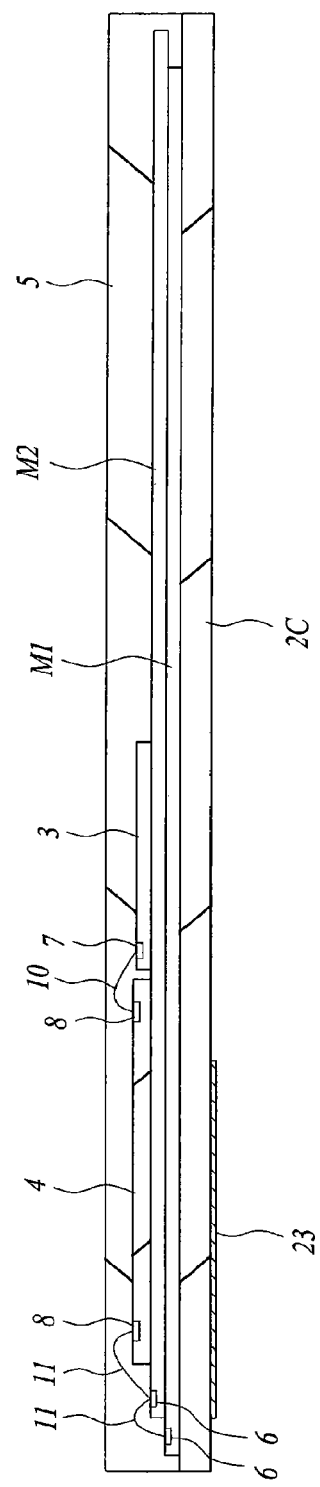
FIG. 22 is a cross sectional view showing the wiring board of the memory card according to another embodiment of the present invention.

The present embodiment is applied to the micro SD card like the fourth embodiment. FIG. 21 is a plan view showing the wiring board of this memory card and FIG. 22 is a cross sectional view showing the wiring board of this memory card.

Although the controller chip 3 is mounted on the interposer 4 in the memory card 1B of the fourth embodiment, the feature of the memory card of the present embodiment lies in that the controller chip 3 and the interposer 4 are mounted adjacently on the memory chip M2.

As shown in FIG. 21, the interposer 4 has a U-shape in its plan view, and the controller chip 3 is disposed inside an area surrounded by the U-shape of the interposer 4 so as to be mounted adjacent to the interposer 4. Similar to the interposer 4 of the fourth embodiment, the interposer 4 is constituted of a glass epoxy resin substrate having a thickness of about 0.09 mm in which wirings of two layers are formed.

The interposer 4 has a long side slightly shorter than the short side of the memory chips M1 and M2, and is mounted on the memory chip M2 so that this long side is located in the vicinity of the pads 6 of the memory chip M2. A plurality of pads 8 are formed in a row in the vicinity of the long side of the interposer 4, and these pads 8 and the pads 6 of the memory chip M2 are electrically connected through the Au wires 11. Also, the pads 6 of the memory chip M1 of the lower layer and the pads 6 of the memory chip M2 of the upper layer are electrically connected through the Au wires 11. More specifically, the two memory chips M1 and M2 are electrically connected to each other through the Au wires 11 and electrically connected to the interposer 4. When electrically connecting the memory chips M1 and M2 to the interposer 4 through the Au wires 11, the length of the Au wires 11 can be shortened by disposing the pads 8 of the interposer 4 in the vicinity of the pads 6 of the memory chip M2 as described above. Therefore, the loop height of the Au wires 11 can be decreased.

The controller chip 3 disposed inside the area surrounded by the U-shape of the interposer 4 is formed of a rectangular silicon chip and its thickness is about 0.1 mm. In this controller chip 3, a plurality of pads 7 are formed along three sides of the main surface thereof. On the other hand, a plurality of pads 8 are formed on the interposer 4 along the plurality of the pads 7 of the controller chip 3, and these pads 8 and the pads 7 of the controller chip 3 are electrically connected through the Au wires 10. When electrically connecting the controller chip 3 to the interposer 4 through the Au wires 10, by disposing the controller chip 3 inside the area surrounded by the U-shape of the interposer 4 and disposing the pads 8 of the interposer 4 in the vicinity of the controller chip 3 as described above, the length of the Au wires 10 for electrically connecting the controller chip 3 in which the plurality of the pads 7 are formed along three sides thereof to the interposer 4 can be reduced. Therefore, the loop height of the Au wires 10 can be decreased.

A plurality of pads 9 are formed on the main surface of the wiring board 2C along the long side on one side thereof. Although not shown, these pads 9 are connected to the external connecting terminals 23 through the front surface wiring, the via hole and the rear surface wiring formed in the wiring board 2C like in the memory card 1B of the fourth embodiment. On the other hand, the plurality of pads 8 are formed on the interposer 4 in the vicinity of these pads 9, and these pads 8 and the pads 9 of the wiring board 2C are electrically connected through the Au wires 12. When electrically connecting the wiring board 2C to the interposer 4 through the Au wires 12, by disposing the pads 8 of the interposer 4 in the vicinity of the pads 9 of the wiring board 2C, the length of the Au wires 12 can be shortened. Therefore, the loop height of the Au wires 12 can be decreased.

Although not shown, the interposer 4 has wirings of two layers formed therein like the interposer 4 of the fourth embodiment. Then, the memory chips M1 and M2, the controller chip 3 and the wiring board 2C are electrically connected to one another through the wirings of the interposer 4. Therefore, similar to the memory card 1B of the fourth embodiment, the order of signals to be input or output into/from the interposer 4 and the pad pitch can be changed by modifying the layout of the pads 8 and the wirings of the interposer 4. Consequently, the freedom of wiring design is improved as compared with the case where the memory chips M1 and M2, the controller chip 3 and the wiring board 2C are connected with one another through the wirings formed on the wiring board 2C, and the memory chips M1 and M2 having a large area can be mounted on the wiring board 2C having a limited area.

Further, by forming the interposer 4 into a U-shape in its plan view and disposing the controller chip 3 inside an area surrounded by this U-shape as described above, the loop height of the Au wires 10 for connecting the controller chip 3 in which the plurality of pads 7 are formed along three sides thereof and the interposer 4 can be reduced. Further, unlike the fourth embodiment in which the controller chip 3 is mounted on the interposer 4, the height from the main surface of the wiring board 2C to the top of the loop of the Au wires 10 can be decreased by adjacently mounting the controller chip 3 and the interposer 4 on the memory chip M2. Accordingly, the memory chips M1 and M2, the controller chip 3 and the interposer 4 can be easily stacked and mounted on the extremely thin wiring board 2C having a thickness of 0.7 mm including the thickness of the mold resin 5.

Figure 23:
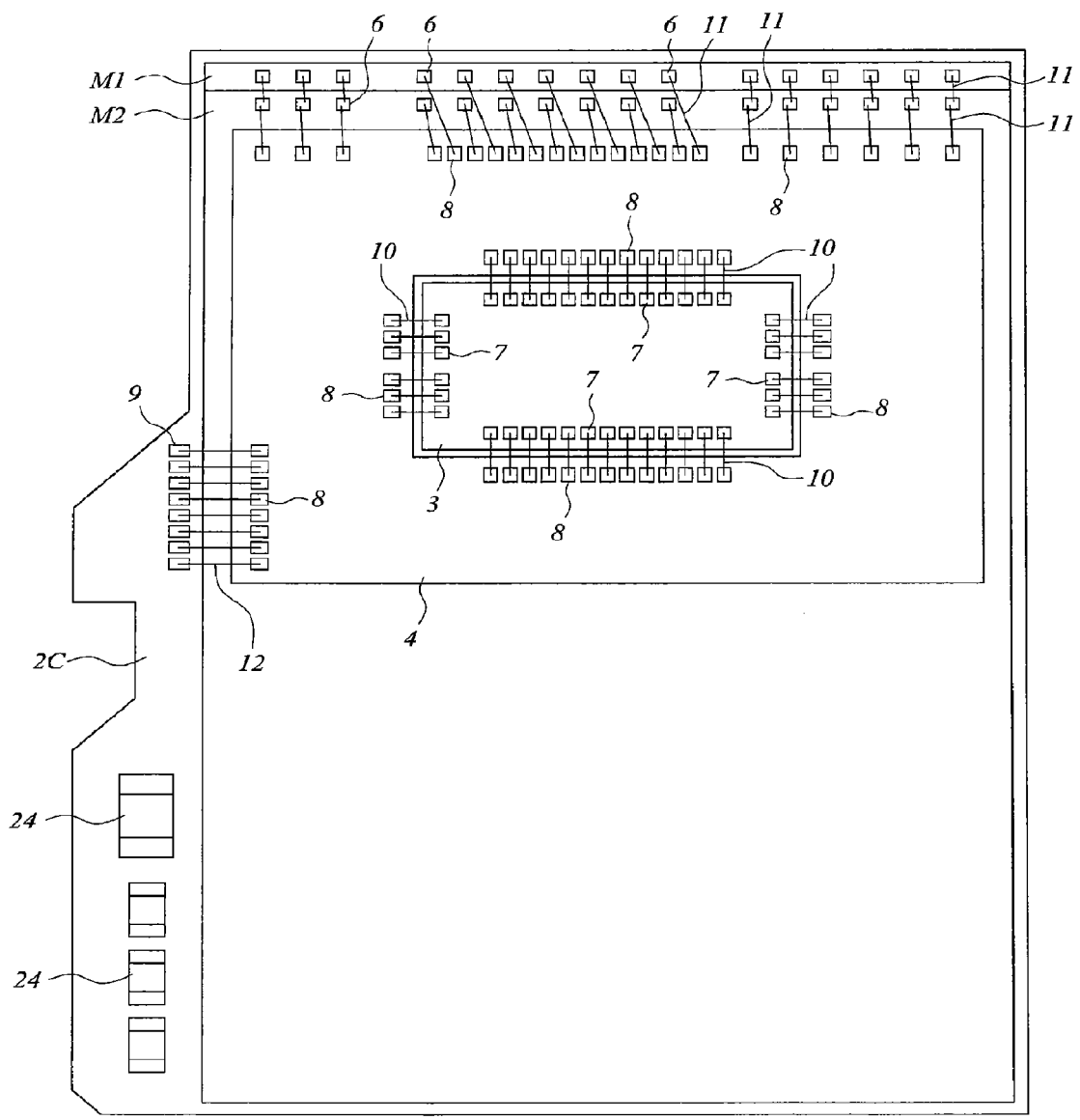
FIG. 23 is a plan view showing a wiring board of a memory card according to another embodiment of the present invention.
Figure 24:
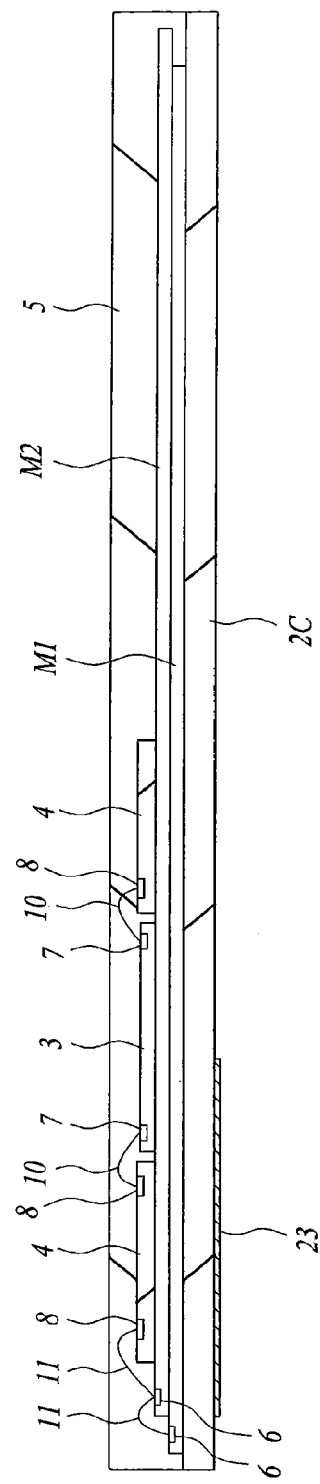
FIG. 24 is a cross sectional view showing the wiring board of the memory card according to another embodiment of the present invention.

Although the present embodiment has been described based on the case of mounting the controller chip 3 in which the plurality of pads 7 are formed along the three sides thereof, this can be applied also to the case of mounting the controller chip 3 in which a plurality of pads 7 are formed along four sides thereof. In this case, an interposer 4 having a hollow-square shape in its plan view is used as shown in FIGS. 23 and 24. More specifically, a rectangular opening slightly larger than the controller chip 3 is formed inside the interposer 4, and the controller chip 3 is disposed inside this opening, and then, the pads 8 are disposed along this opening. By this means, the same effect as that described above can be obtained.

Figure 25:
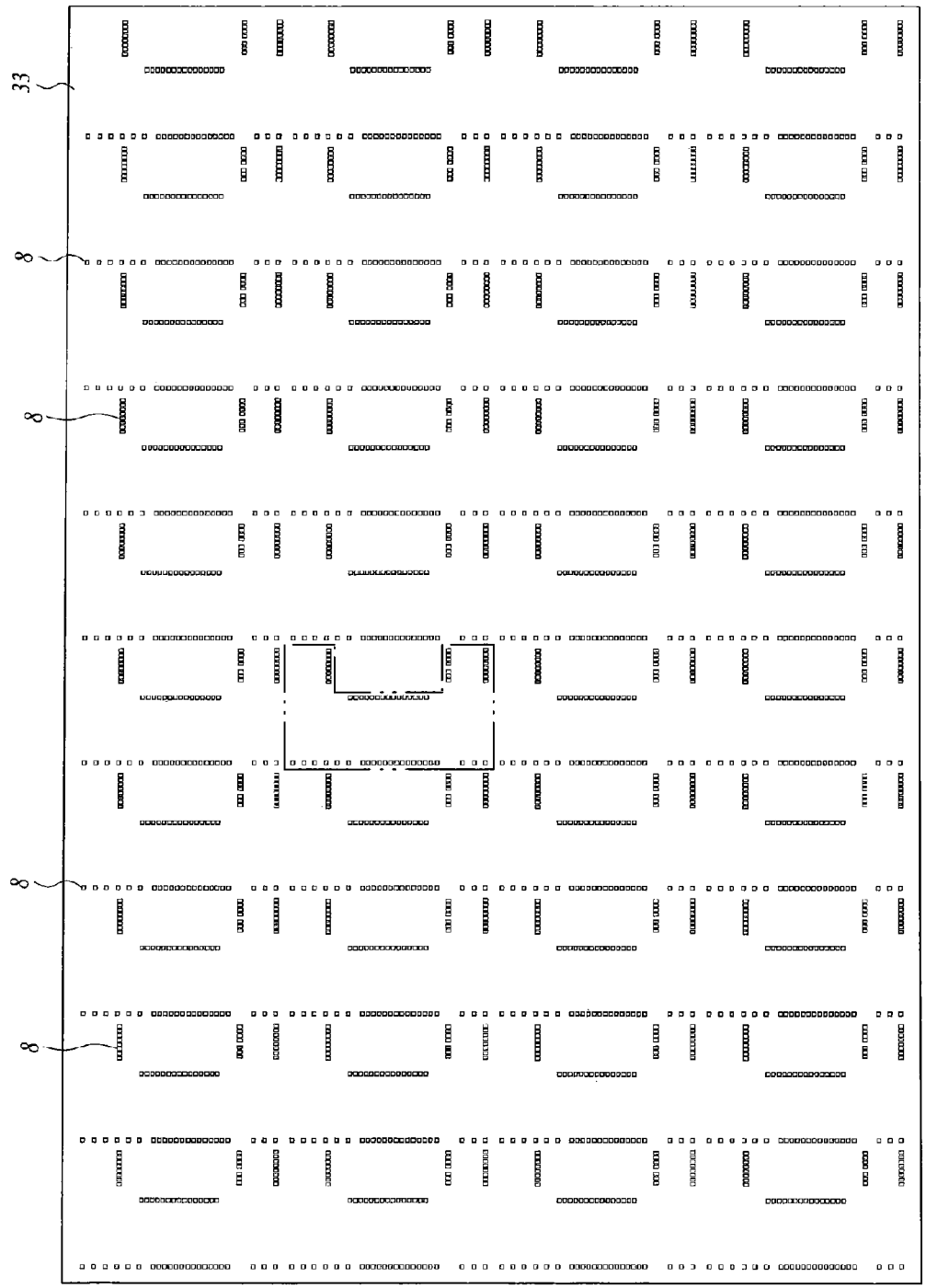
FIG. 25 is a plan view of a map substrate used in fabricating interposers.

For example, the interposer 4 having a U-shape in its plan view can be fabricated in the following manner. FIG. 25 is a plan view of a map substrate 33 used in the fabrication of the interposer 4. This map substrate 33 is a glass epoxy resin substrate having a larger area than the interposer 4, and plural units of the pads 8 and the wirings are formed in the lateral direction and the longitudinal direction of the figure. An area indicated with a two-dot chain line in the figure indicates an area to be a single interposer 4 (one unit). In this map substrate 33, ten units and four units of the pads 8 and wirings are formed in the lateral direction and the longitudinal direction, respectively. Therefore, 10×4=40 pieces of the interposers 4 can be acquired from this map substrate 33.

Figure 26:
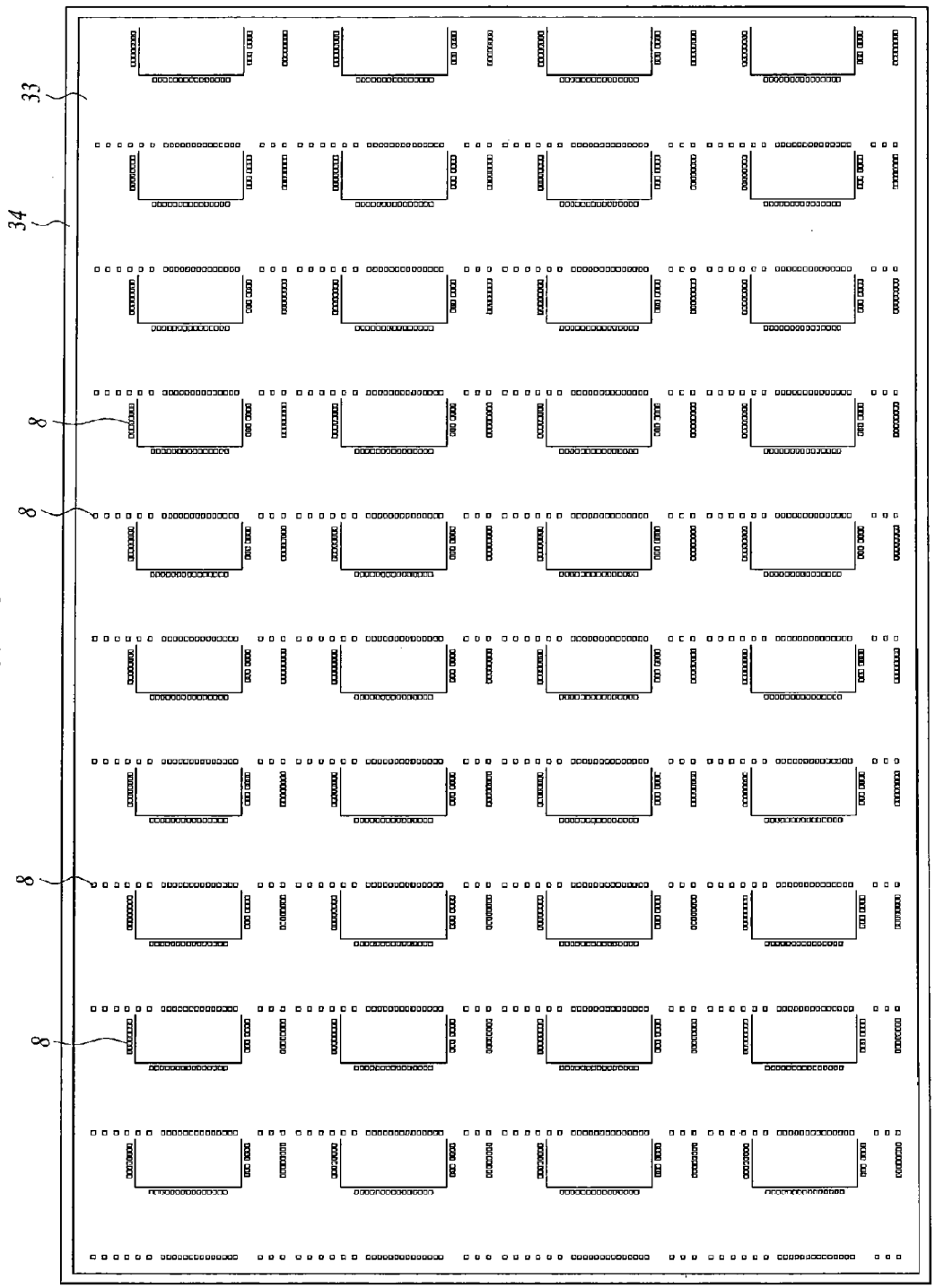
FIG. 26 is a plan view showing a method of fabricating interposers from the map substrate shown in FIG. 25.

In the fabrication of the interposer 4 from the aforementioned map substrate 33, first, a double-sided adhesive tape 34 having a thickness of 10 μm to 20 μm called Die Attach Film is affixed to the rear surface of the map substrate 33 as shown in FIG. 26. This double-sided adhesive tape 34 is a tape which shows adhesiveness when heated, and this double-sided adhesive tape 34 can be affixed to the rear surface of the map substrate 33 by heating the double-side adhesive tape 34 in a state where it is placed below the map substrate 33.

Next, in this state, laser beam is irradiated to the map substrate 33 from above so as to cut each unit into the U-shape. Although the double-sided adhesive tape 34 affixed to the rear surface of the map substrate 33 may be cut at this time, only the map substrate 33 is cut here by adjusting the energy of the laser beam, and the double-sided adhesive tape 34 on the rear surface is not cut.

Figure 27:
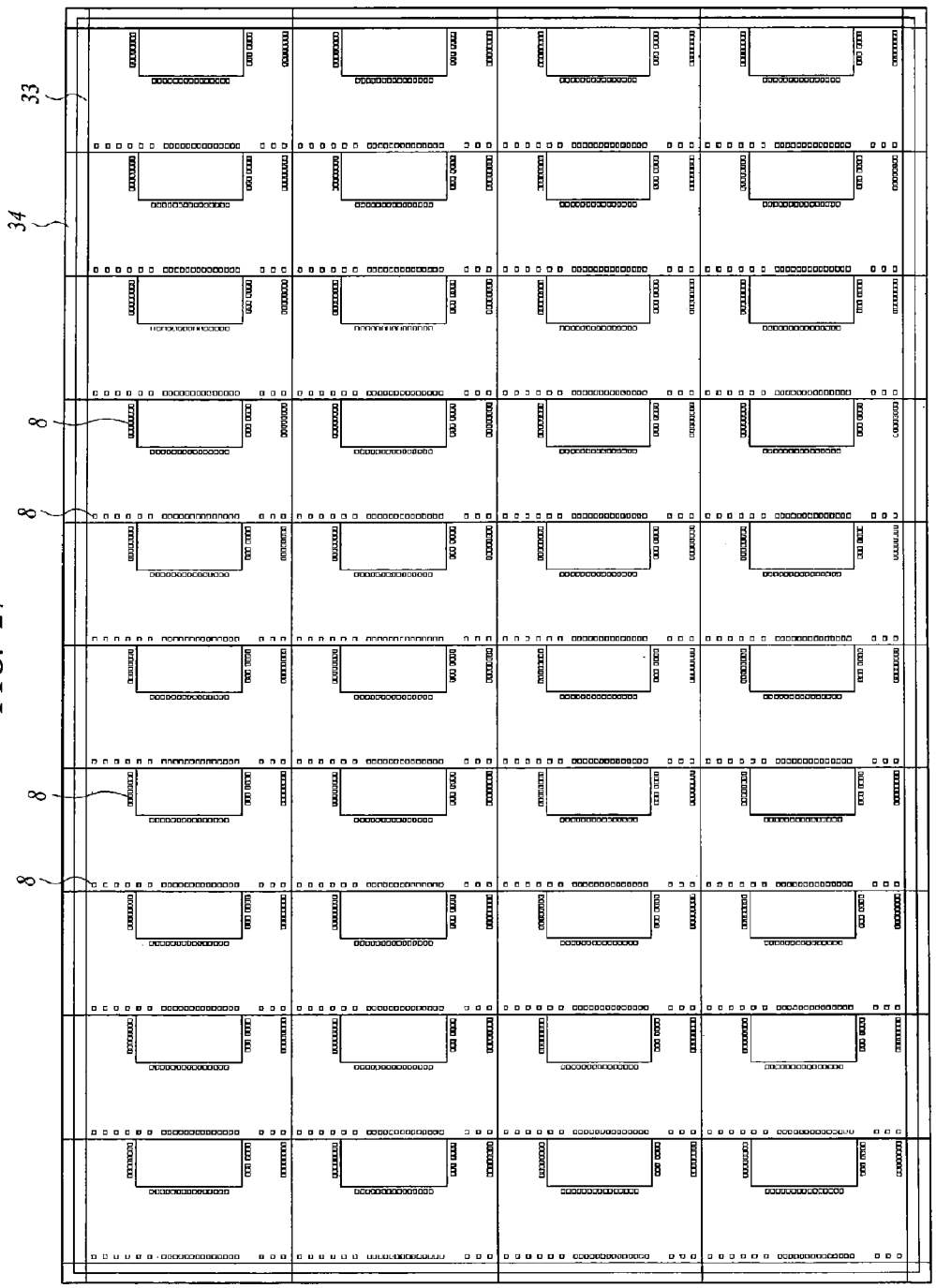
FIG. 27 is a plan view showing a method of fabricating interposers from the map substrate shown in FIG. 25.

Next, as shown in FIG. 27, the map substrate 33 is cut linearly in the lateral direction and the longitudinal direction along a border of each unit. When the map substrate 33 is cut linearly, a dicing blade having a higher cutting speed than the laser beam is used, and the double-sided adhesive tape 34 affixed to the rear surface of the map substrate 33 is also cut at the same time. Note that, it is also possible to cut the map substrate 33 linearly with the dicing blade and then cut each unit into the U-shape using laser beam. However, when the map substrate 33 is cut linearly, respective units are separated from each other and deviated from their original positions. Therefore, accurate cutting can be achieved when the cutting into a U-shape is first performed and the linear cutting is performed thereafter. Through the steps so far, a plurality of interposers 4 in which the double-sided adhesive tape 34 is affixed to the rear surface thereof can be fabricated.

Also, it is also possible to use the laser beam to cut the map substrate 33 linearly, and in this case, only one type of cutting machine is required for the cutting of the map substrate 33. Also in this case, the energy of the laser beam is lowered to cut only the map substrate 33 when cutting each unit into the U-shape, and the energy of the laser beam is raised to cut the double-sided adhesive tape 34 at the same time when cutting the map substrate 33 linearly.

Figure 28:
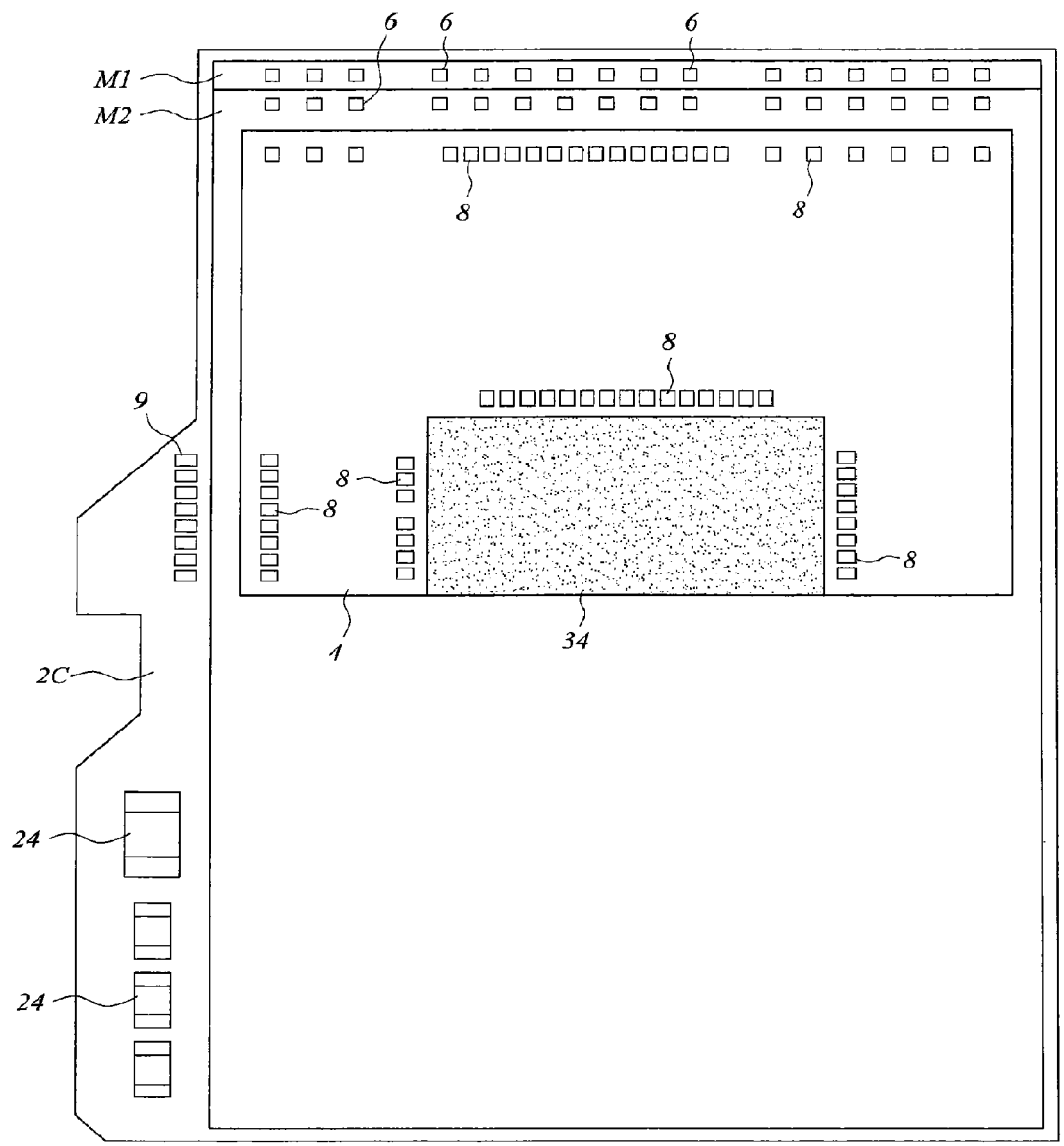
FIG. 28 is a plan view showing a method of assembling a memory card by using an interposer obtained from the map substrate shown in FIG. 25.

Next, as shown in FIG. 28, by heating the wiring board 2C after the interposer 4 is positioned on the memory chips M1 and M2 mounted on the wiring board 2C, the interposer 4 is mounted on the memory chip M2 through the double-sided adhesive tape 34. At this time, the double-sided adhesive tape 34 is exposed inside an area surrounded by the U-shape of the interposer 4.

Figure 29:
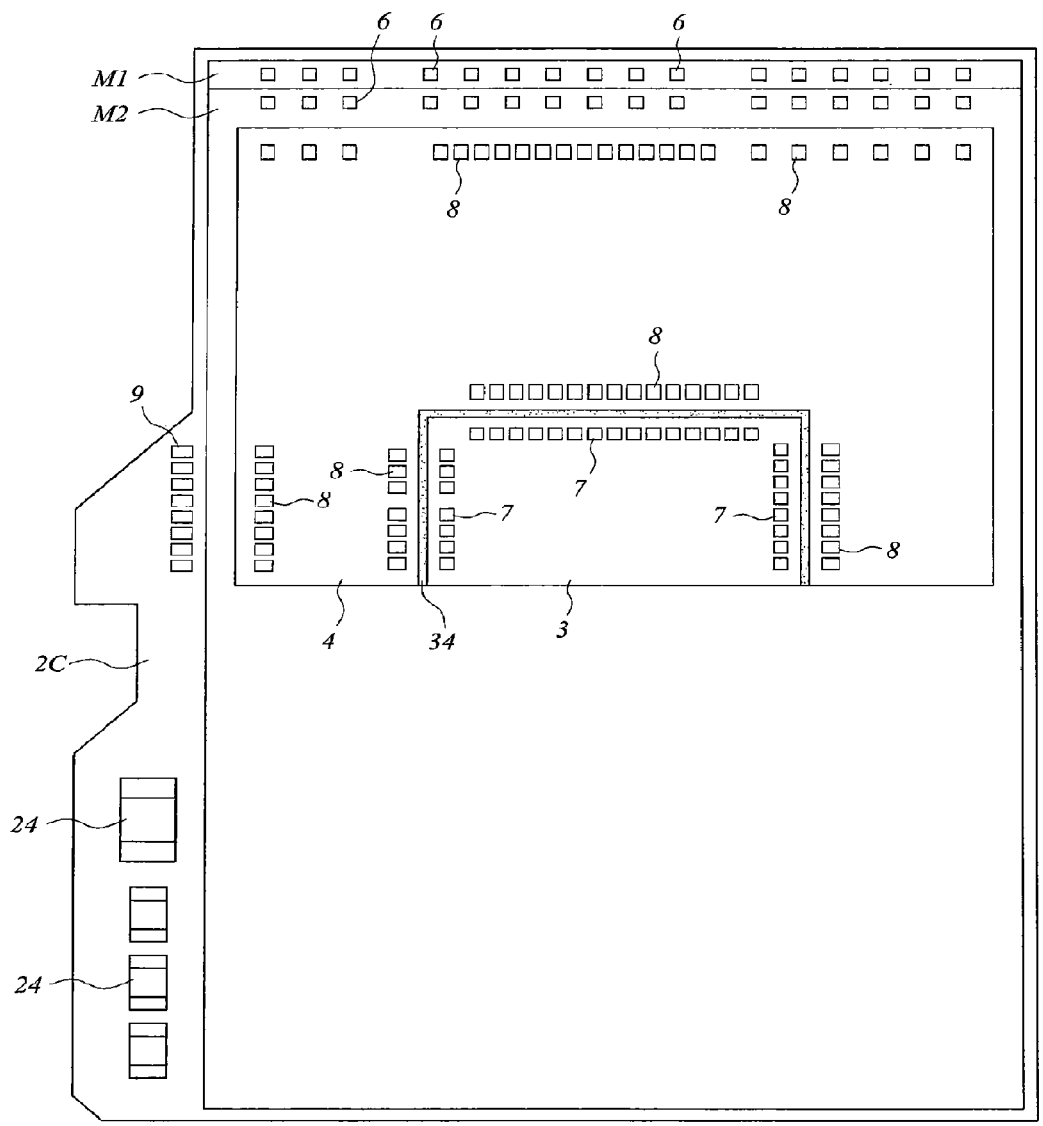
FIG. 29 is a plan view showing a method of assembling a memory card by using an interposer obtained from the map substrate shown in FIG. 25.

Next, as shown in FIG. 29, by positioning the controller chip 3 on the double-sided adhesive tape 34, and then heating the wiring board 2C, the controller chip 3 is mounted on the memory chip M2 through this double-sided adhesive tape 34.

By leaving the double-sided adhesive tape 34 inside the area surrounded by the U-shape when the map substrate 33 is cut into pieces of the interposers 4 as described above, the step of mounting the controller chip 3 can be simplified.

Figure 30:
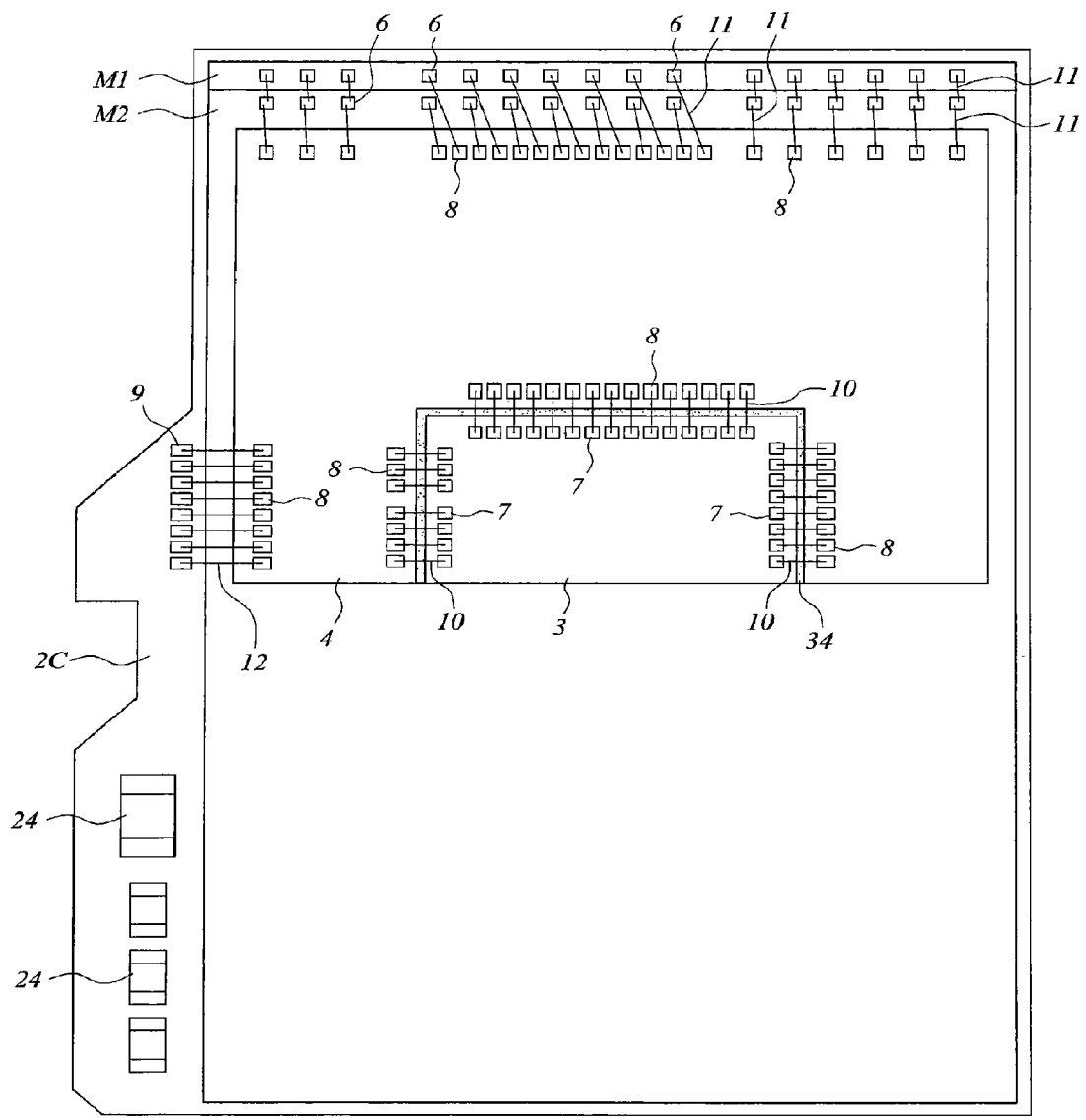
FIG. 30 is a plan view showing a method of assembling a memory card by using an interposer obtained from the map substrate shown in FIG. 25.

Thereafter, as shown in FIG. 30, the wiring board 2C is carried to the wire bonding step, and the pads 8 of the interposer 4, the pads 7 of the controller chip 3, the pads 6 of the memory chips M1 and M2 and the pads 9 of the wiring board 2C are electrically connected through the Au wires 10, 11 and 12, respectively.

Although the fabricating method of the interposer 4 having the U-shape in its plan view has been described here, the interposer 4 having a hollow-square shape in its plan view as shown in FIG. 23 can be fabricated in the same manner as described above.

Also, the case where the double-sided adhesive tape 34 is affixed on the rear surface of the map substrate 33 when the map substrate 33 is cut with a dicing blade or by laser beam has been described here. In this case, however, if any failure is found in a part of the interposer 4 acquired from the map substrate 33 as a result of inspection thereof, both the defective interposer 4 and the double-sided adhesive tape 34 affixed to the rear surface thereof need to be discarded, and therefore, the double-sided adhesive tape 34 is consumed in waste. Thus, it is also possible to mount the interposer 4 on the memory chip M2 by applying adhesive agent to the rear surface of the interposer 4 after the map substrate 33 is cut without affixing the double-sided adhesive tape 34 to the rear surface.

Figure 31:
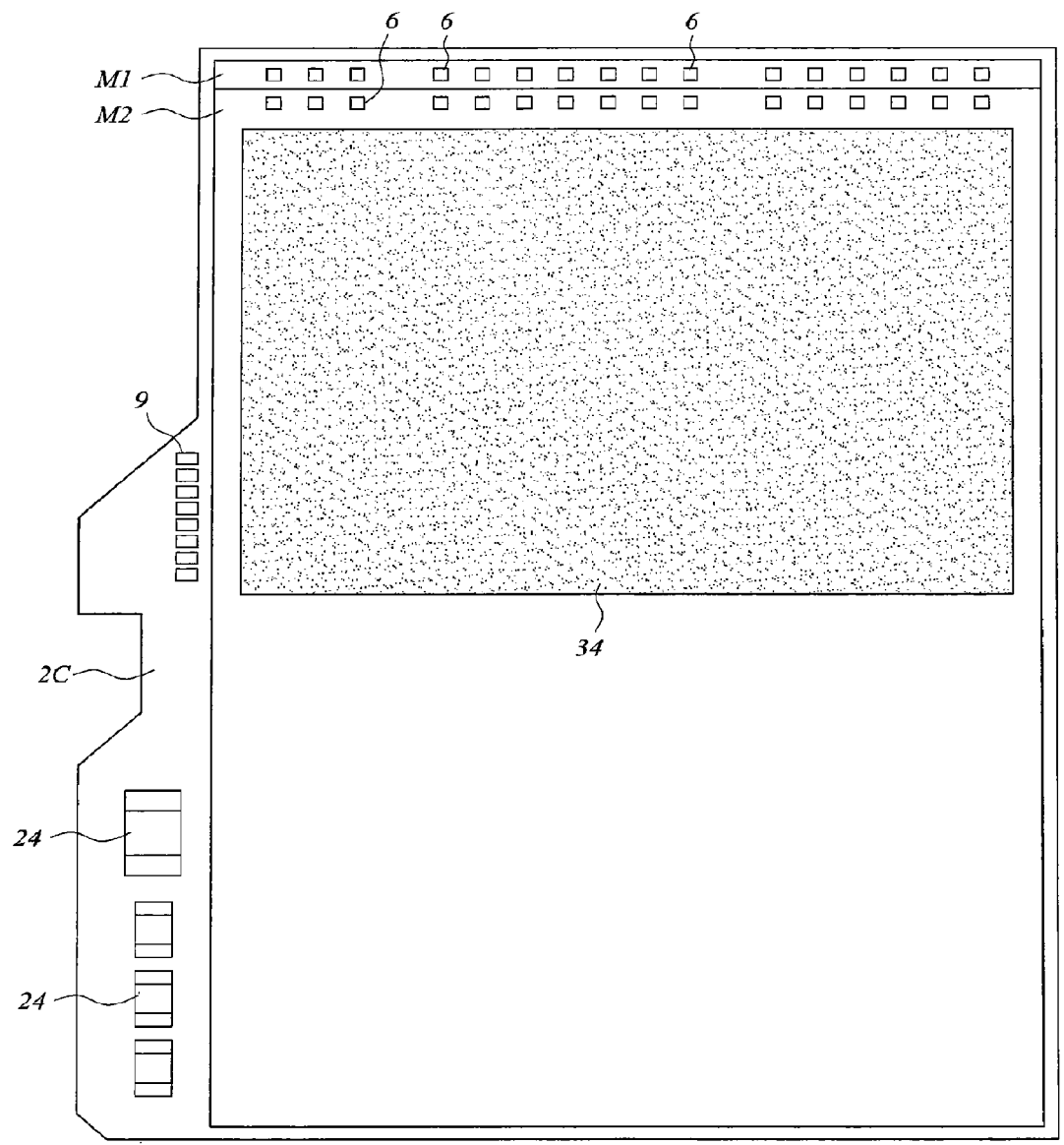
FIG. 31 is a plan view showing another method of assembling a memory card by using an interposer obtained from the map substrate shown in FIG. 25.
Figure 32:
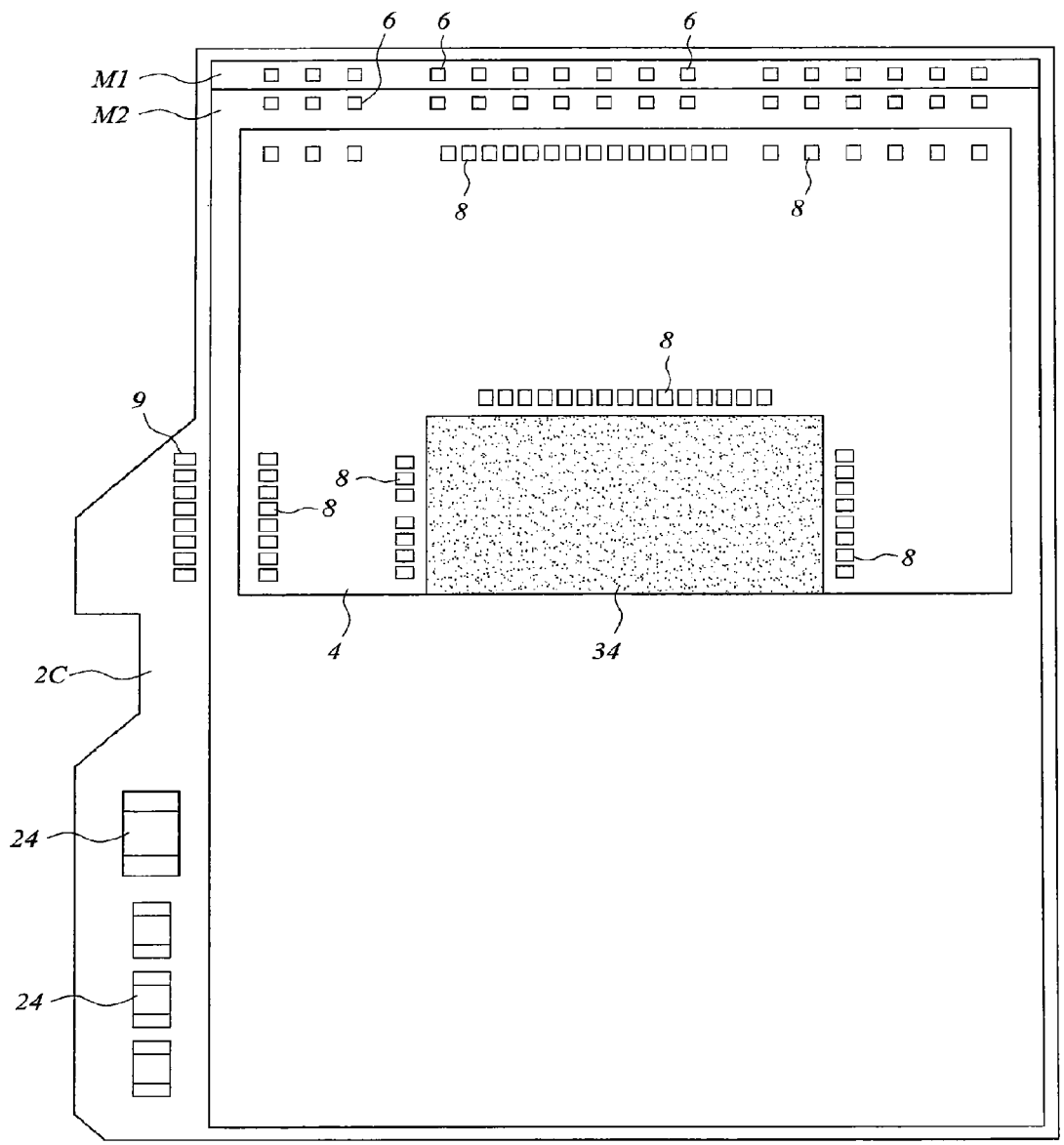
FIG. 32 is a plan view showing another method of assembling a memory card by using an interposer obtained from the map substrate shown in FIG. 25.
Figure 33:
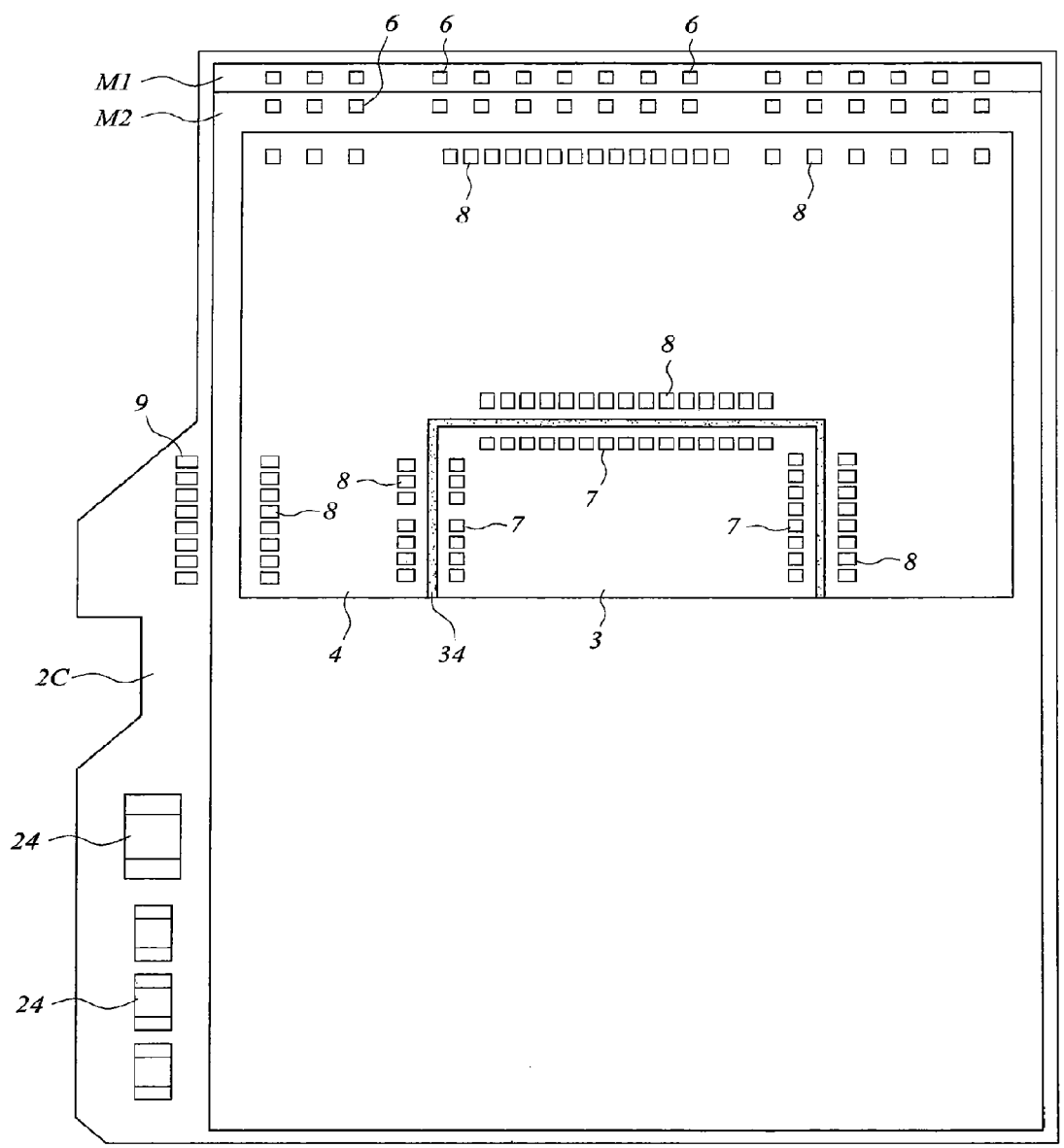
FIG. 33 is a plan view showing another method of assembling a memory card by using an interposer obtained from the map substrate shown in FIG. 25.

Further, as another method, a rectangular double-sided adhesive tape 34 is affixed onto the memory chip M2 in advance as shown in FIG. 31, and then, the interposer 4 obtained by cutting the map substrate 33 is bonded to this double-sided adhesive tape 34 as shown in FIG. 32, and further, the controller chip 3 is bonded to the double-sided adhesive tape 34 exposed inside the area surrounded by the U-shape of the interposer 4 as shown in FIG. 33. In this manner, wasteful consumption of the double-sided adhesive tape 34 can be prevented.

The case where the interposer 4 having the U-shape in its plan view is used has been described here. Also in the case of using the interposer 4 having a hollow-square shape in its plan view as shown in FIG. 23, the wasteful consumption of the double-sided adhesive tape 34 can be prevented by affixing the double-sided adhesive tape 34 on the memory chip M2 in advance.

Figure 34:
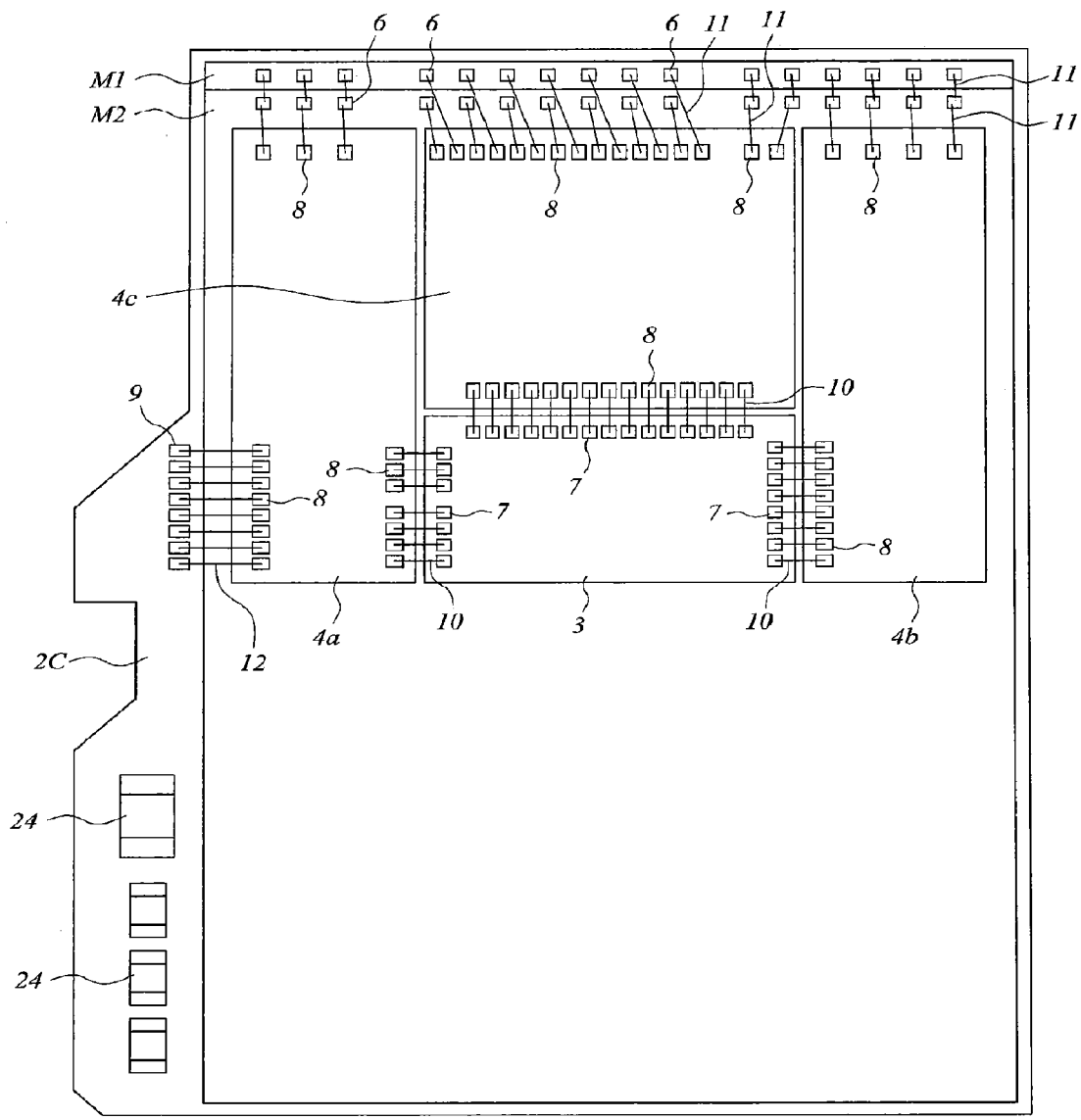
FIG. 34 is a plan view showing a wiring board of a memory card according to another embodiment of the present invention.

FIG. 34 shows an example where three interposers 4a, 4b and 4c each having a rectangular shape in its plan view are mounted on the memory chip M2 by combining them into the U-shape instead of using the interposer 4 having the U-shape in its plan view, and then the controller chip 3 is disposed inside the area surrounded by the U-shape. In this case, since the three interposers 4a, 4b and 4c are different in the number and arrangement of pads and the pattern of wirings, three types of the interposers 4a, 4b and 4c are fabricated from three types of the map substrates. Also, since the planar shapes of the interposers 4a, 4b and 4c are all rectangular, the map substrate needs to be cut only linearly with the dicing blade. Therefore, the cutting step for the map substrate can be simplified.

Figure 35:
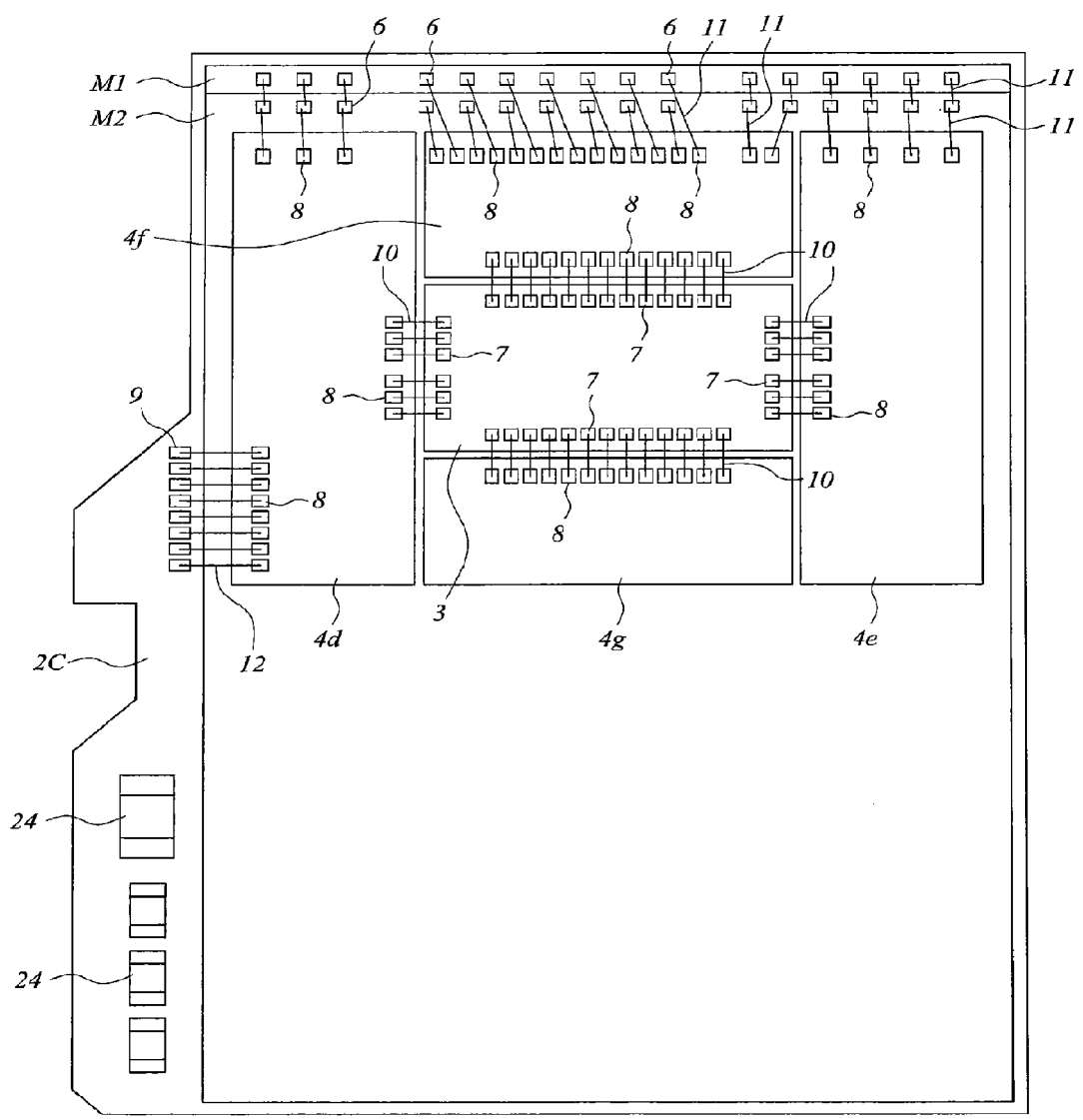
FIG. 35 is a plan view showing a wiring board of a memory card according to another embodiment of the present invention.

Also when the controller chip 3 in which the plurality of the pads 7 are formed along four sides thereof is to be mounted, the four interposers 4d, 4e, 4f and 4g each having a rectangular shape in its plan view are mounted on the memory chip M2 by combining them into a hollow-square shape as shown in FIG. 35 instead of using the interposer 4 having a hollow-square shape in its plan view as shown in FIG. 23, and then, the controller chip 3 is disposed inside the area surrounded by the hollow-square shape.

Sixth Embodiment

Figure 36:
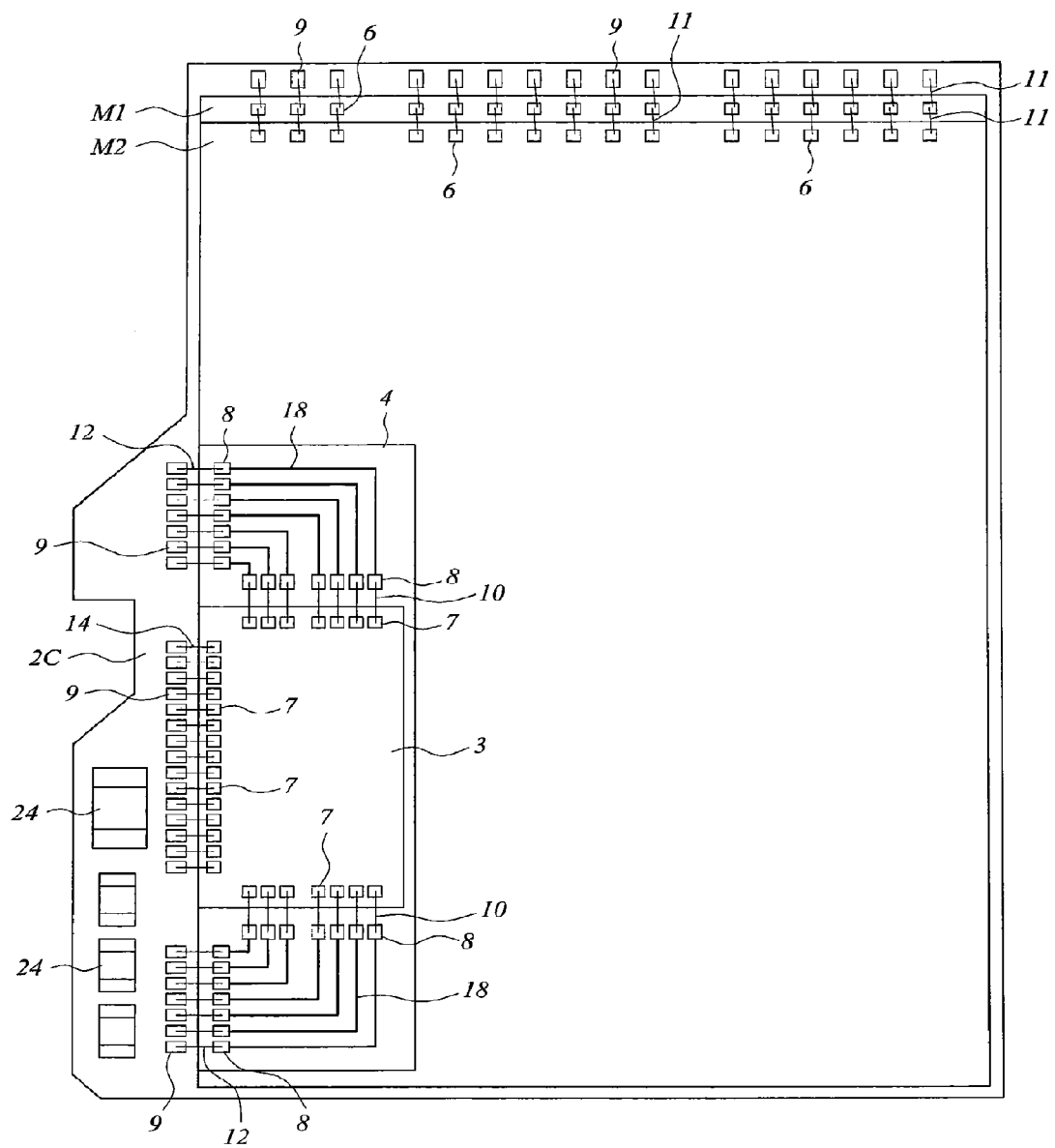
FIG. 36 is a plan view showing a wiring board of a memory card according to another embodiment of the present invention.
Figure 37:
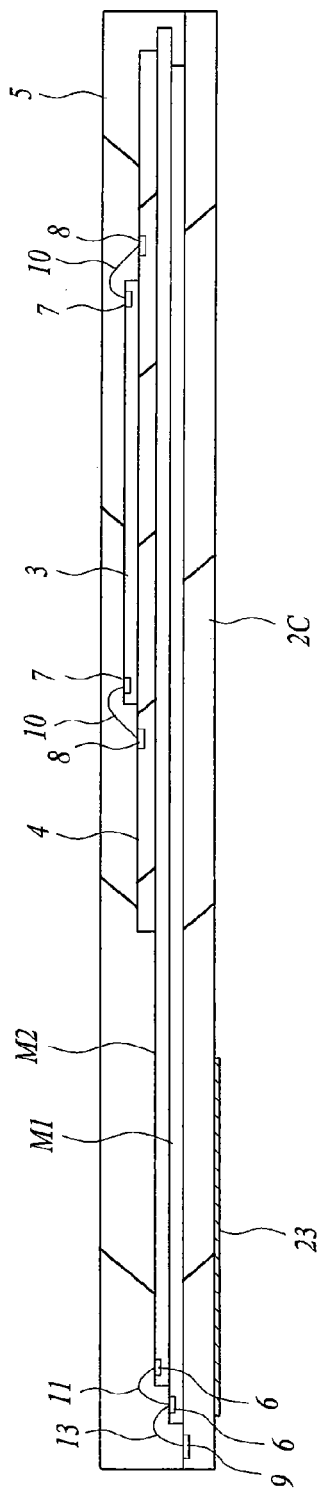
FIG. 37 is a cross sectional view showing the wiring board of the memory card shown in FIG. 36.
Figure 38:
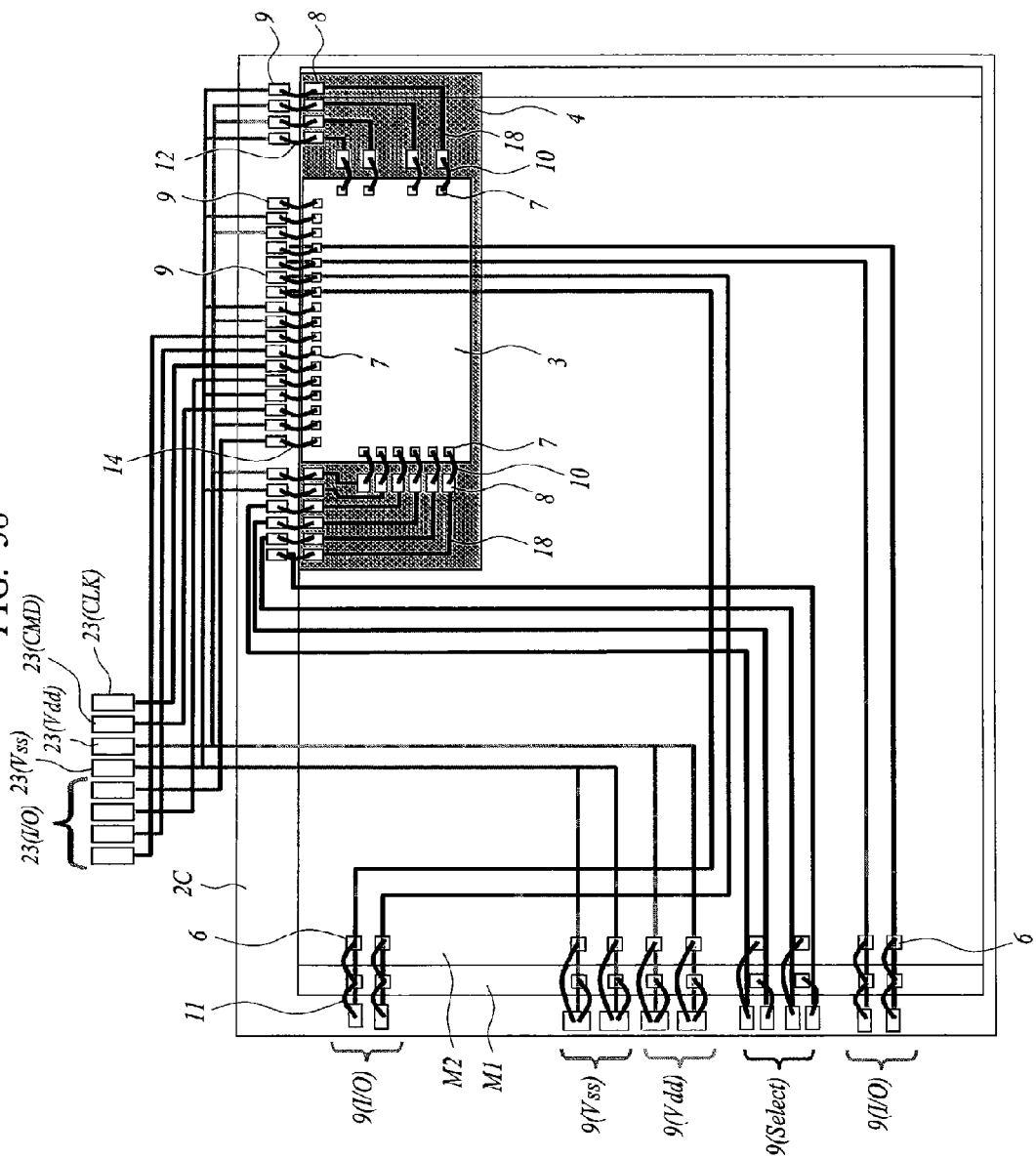
FIG. 38 is a circuit diagram schematically showing the connecting relationship of the wiring board, the memory chips, the controller chip and the interposer of the memory card shown in FIG. 36.

FIG. 36 is a plan view showing the wiring board of the memory card of the present embodiment, FIG. 37 is a cross sectional view showing the wiring board of the memory card and FIG. 38 is a circuit diagram schematically showing the connecting relationship of the wiring board, the memory chips, the controller chip and the interposer of this memory card.

When the generation of the wafer process is progressed and the size of a memory chip having the same memory capacity is decreased in comparison to a former generation, the pads 9 can be disposed on the short side of the wiring board 2C of the memory card other than the long side. Therefore, the following mounting structure can be achieved.

A plurality of pads 9 are formed on one of the long sides and one of the short sides of the wiring board 2C. Two memory chips M1 and M2 are mounted on the main surface of this wiring board 2C, and the memory chip M2 is stacked on the memory chip M1. Also, the interposer 4 is mounted on the memory chip M2 of the upper layer and the controller chip 3 is mounted on the interposer 4.

The memory chips M1 and M2, the interposer 4 and the controller chip 3 each have a rectangular planar shape and are disposed so that their long sides are directed in the same direction. Also, the interposer 4 and the controller chip 3 are stacked so that one of their long sides overlaps one of the long sides of the memory chips M1 and M2.

The pads 6 formed along the short side of each of the two memory chips M1 and M2 are electrically connected to the pads 9 on the short side of the wiring board 2C through the Au wires 11.

The pads 7 are formed along the three sides (one long side and two short sides) on the main surface of the controller chip 3. The pads 7 formed along the long side of the controller chip 3 are electrically connected to the pads 9 on the long side of the wiring board 2C through the Au wires 14. The pads 7 formed along the two short sides of the controller chip 3 are electrically connected to the pads 8 of the interposer 4 through the Au wires 10. These pads 8 are connected to one ends of wirings 18 of the interposer 4 which convert the coordinates of the pads 7 on the short side of the controller chip 3 by 90®, and are electrically connected to the pads 9 on the long side of the wiring board 2C through the pads 8 formed on the other ends of the wirings 18 and the Au wires 12 connected to the pads 8.

In the present embodiment having the structure as described above, the size of the interposer 4 can be reduced and arrangement of the wirings can be simplified.

Seventh Embodiment

Figure 39:
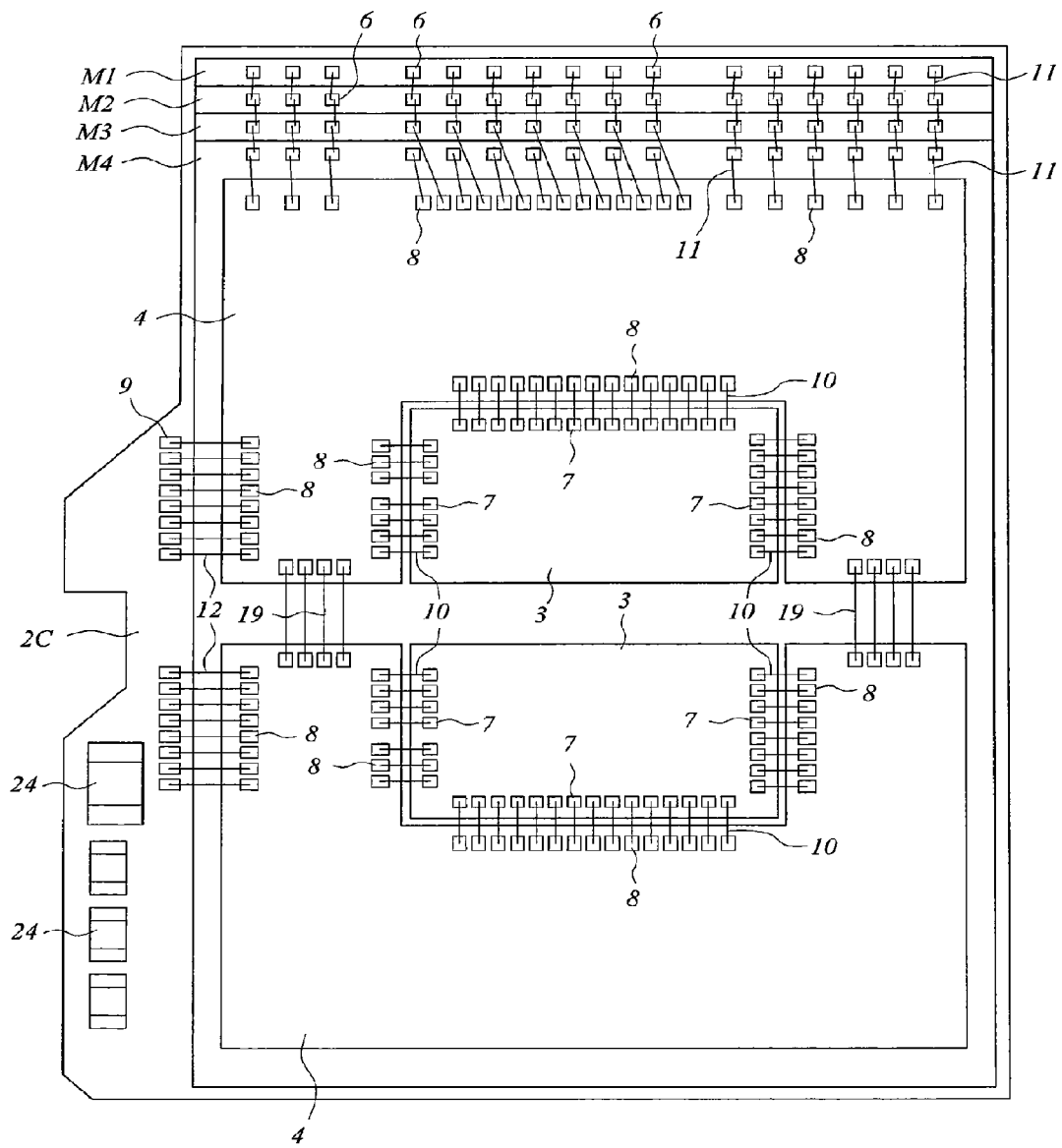
FIG. 39 is a plan view showing a wiring board of a memory card according to another embodiment of the present invention.

FIG. 39 is a plan view showing the wiring board of the memory card of the present embodiment. In the memory card of the present embodiment, four memory chips M1, M2, M3 and M4 are mounted in a stacked manner on the main surface of the wiring board 2C. Also, two controller chips 3 are mounted on the memory chip M4 of the uppermost layer. When the number of memory chips to be mounted on the main surface of the wiring board 2C is increased as described above, the two controller chips 3 are required to be mounted on the memory chip M4 in order to prevent the decrease in the access rate between the memory chip and the controller chip.

In the memory card of the present embodiment, two interposers 4 each having the U-shape in its plan view are mounted on the memory chip M4 of the uppermost layer, and the controller chip 3 is disposed inside the area surrounded by the U-shape of each of the interposers 4 as shown in FIG. 39. Also, the interposer 4 on one side and the interposer 4 on the other side are electrically connected through the Au wires 19.

In the present embodiment having the structure described above, the same effect as that of the fifth embodiment can be achieved. Therefore, two controller chips 3 can be mounted on the memory chip M4.

Figure 40:
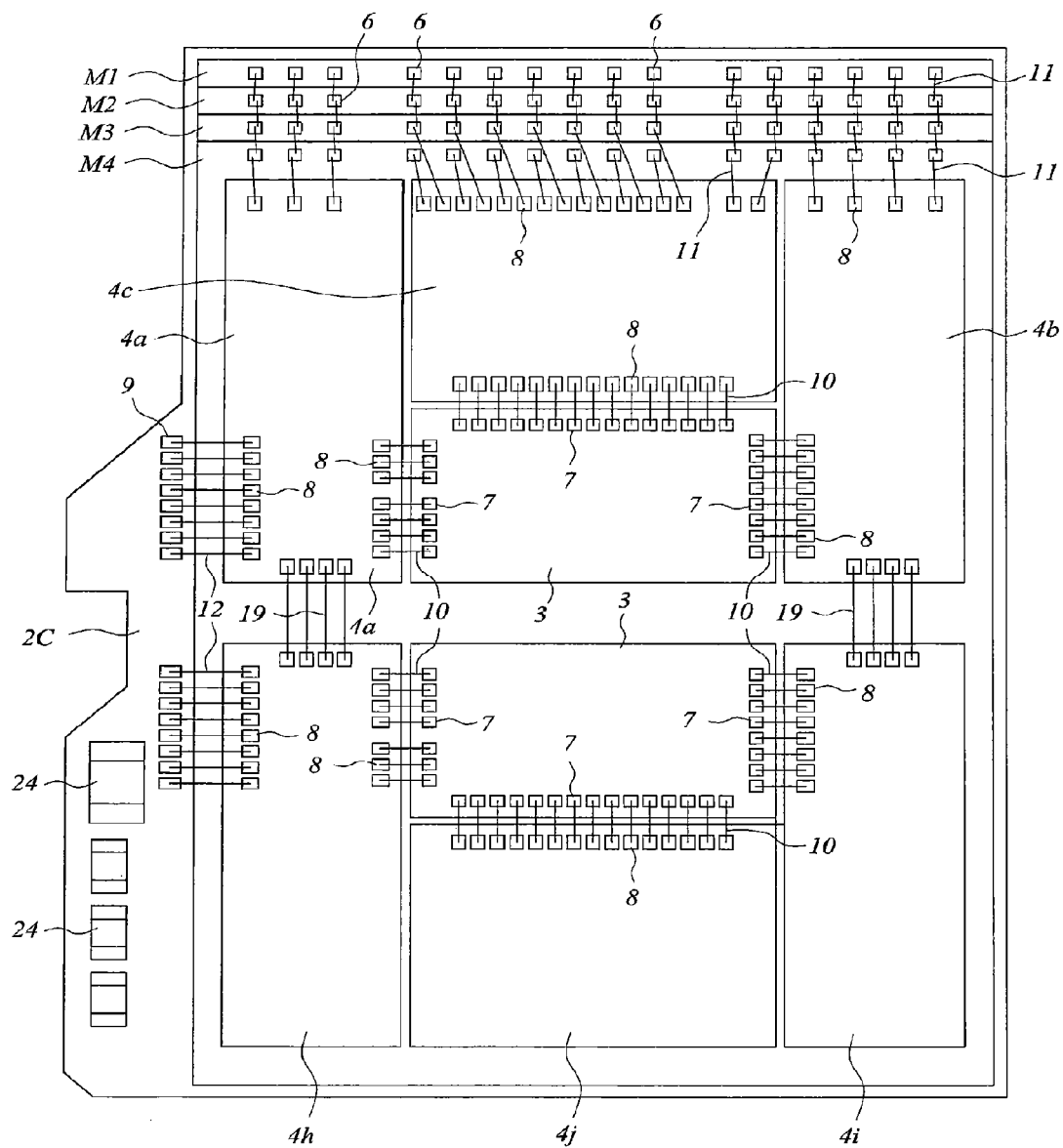
FIG. 40 is a plan view showing a wiring board of a memory card according to another embodiment of the present invention.

Further, the same effect can be attained by mounting three interposers 4a, 4b and 4c and three interposers 4h, 4i and 4j each having a rectangular planar shape and combining each of them into the U-shape on the memory chip M4 as shown in FIG. 40 and then disposing the controller chip 3 inside the area surrounded by each U-shape instead of using the two interposers 4 having the U-shape in its plan view.

The case of mounting the two controller chips 3 each having the pads 7 formed on three sides thereof has been described here. However, when two controller chips 3 each having the pads 7 formed on four sides thereof are to be mounted, the two controller chips 3 can be mounted on the memory chip M4 by using two interposers 4 each having the hollow-square shape in its plan view as shown in FIG. 23.

In the foregoing, the invention made by the inventors of the present invention has been concretely described based on the embodiments. However, it is needless to say that the present invention is not limited to the foregoing embodiments and various modifications and alterations can be made within the scope of the present invention.

In the embodiments described above, flash memory chips each provided with pads on one of its short sides are stacked, but the present invention can be applied to a case of stacking flash memory chips each provided with pads on one of its long sides. Further, the present invention can be applied to a case where the pads are concentrated to one side by forming rewiring on a flash memory chip provided with the pads on opposed two sides.

Also, the cases where two or four memory chips are stacked have been described in the fourth to seventh embodiments. However, the present invention can be applied to a memory card in which more memory chips are stacked. In that case, by adopting the various stacking methods described in the first to third embodiments, a number of memory chips can be stacked on a wiring board having limited dimensions.

Also, when the flash memory chips are stacked on the wiring board, a spacer chip may be provided between the wiring board and the flash memory chips or between the flash memory chip of the lower layer and the flash memory chip of the upper layer.

Figure 41:
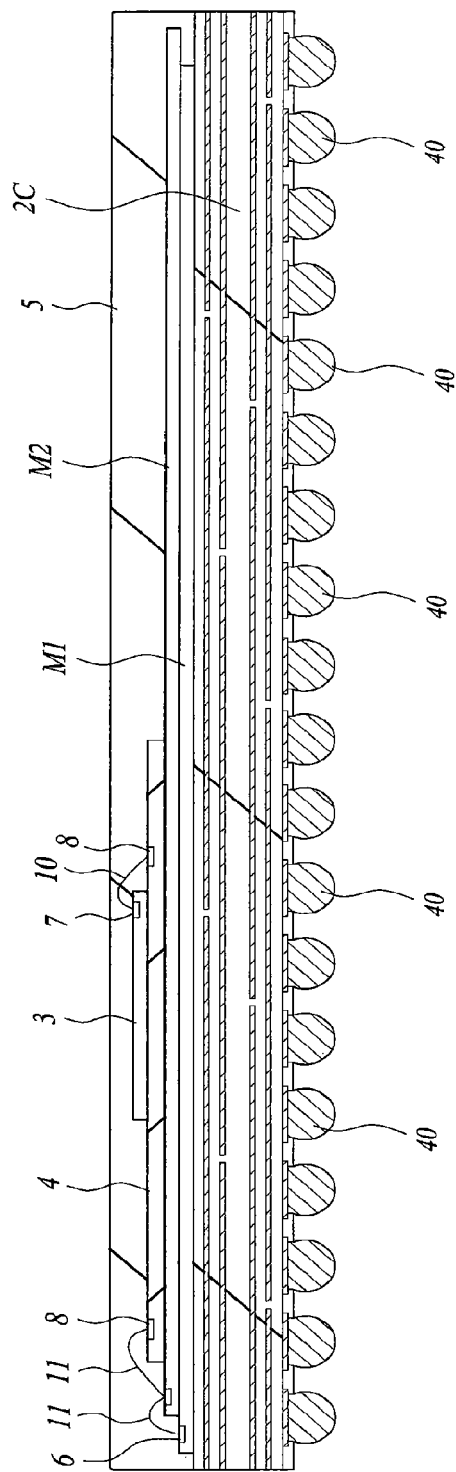
FIG. 41 is a cross sectional view showing the system in package having the ball grid array structure according to another embodiment of the present invention.

Further, a case of applying the present invention to the memory card has been described in the foregoing embodiments. However, the present invention can be applied also to a semiconductor device having a package structure other than the memory card such as a system in package (SIP) with a ball grid array (BGA) structure in which a plurality of memory chips M1 and M2 and the controller chip 3 are stacked on the wiring board 2C, to the bottom surface of which a number of bump electrodes 40 are connected as shown in FIG. 41.

Also, the memory chip is not limited to the flash memory chip, and the present invention can be applied to the case where other memory chip such as DRAM is mounted. The number of the memory chips to be mounted on the wiring board may be one or plural.

Figure 14:
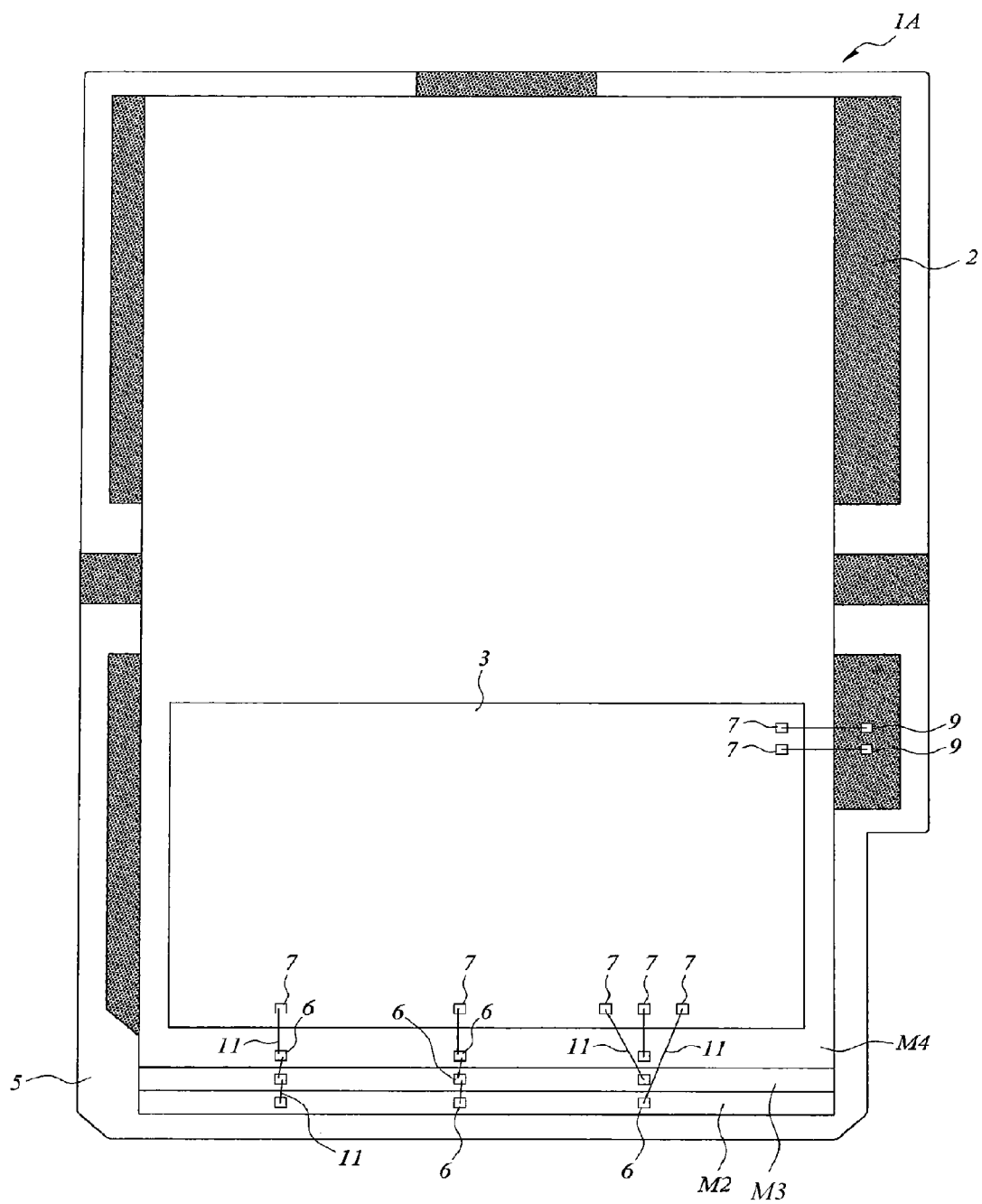
FIG. 14 is a schematic plan view showing the internal structure of a memory card according to another embodiment of the present invention.

Further, in the case where the controller chip 3 is custom-designed in accordance with the specifications of the memory chips M2 to M4 in the first to third embodiments and the controller chip 3, the memory chips M2 to M4 and the wiring board 2 are connected directly, the interposer 4 can be removed. In this case, as shown in FIG. 14, the pads 7 for connecting to the memory chips M2 to M4 are disposed on one side of the controller chip 3, and the pads 7 for connecting to the wiring board 2 are disposed on one side perpendicular to this side (side parallel to the long sides of the memory chips M2 to M4). By this means, the number of components of the memory card 1A and the number of assembly steps can be reduced.

The present invention can be applied to a semiconductor device in which memory chips and a controller chip are stacked on a wiring board.

What is claimed is:
1. A semiconductor device comprising:
a wiring board having a main surface, a rear surface opposite to the main surface, a long side, a short side intersecting the long side, a plurality of first terminals arrayed along the long side on the main surface, a plurality of second terminals arrayed along the short side on the main surface, and external connecting terminals formed on the rear surface;
a memory chip mounted over the main surface of the wiring board, the memory chip having a first main surface, a first side, a second side intersecting the first side, and a plurality of first electrodes arrayed along the second side on the first main surface, the first electrodes being connected with the second terminals of the wiring board via a plurality of first wires; and
a controller chip mounted over the first main surface of the memory chip, the controller chip being operable to control the memory chip and having a second main surface and a plurality of second electrodes arrayed on the second main surface, the second electrodes being connected with the first terminals of the wiring board via a plurality of second wires,
wherein the long side of the wiring board includes a first portion and a second portion, and the first terminals are arrayed between the first side of the memory chip and the first portion of the long side of the wiring board in a plan view,
wherein a distance between the first portion of the long side of the wiring board and the first side of memory chip is greater than a distance between the second portion of the long side of the wiring board and the first side of the memory chip in a first direction perpendicular to the first side of the memory chip, and
wherein the second terminals are arranged on a first area of the main surface of the wiring board between the second side of memory chip and the short side of the wiring board.
2. The semiconductor device according to claim 1, wherein a passive element is arranged on the main surface of the wiring board.
3. The semiconductor device according to claim 2, wherein the passive element is a chip capacitor.
4. The semiconductor device according to claim 1, wherein the second terminals of the wiring board are opposite to the first electrodes in the plan view.
5. The semiconductor device according to claim 1, wherein the memory chip is one of a plurality of such memory chips mounted in a stacked manner on the main surface of the wiring board, and
the memory chips are stacked in a dislocated manner in a second direction perpendicular to the second side of the memory chip so that the respective first electrodes provided along the second sides of the memory chips are exposed.

6. The semiconductor device according to claim 1, wherein the main surface of the wiring board, the memory chip and the controller chip are sealed with resin.

7. The semiconductor device according to claim 1, wherein the wiring board has external dimensions being the same as external dimensions of a wiring board of a micro SD card.

8. A semiconductor device comprising:

a wiring board having:
- a top surface,
- a rear surface opposite the top surface,
- a first long side including a straight line portion and a projected portion,
- a second long side opposite the first long side,
- a first short side, and
- a second short side, which intersect the first and second long sides;

a memory chip mounted over the top surface of the wiring board and having:
- a first main surface,
- a first side facing the first long side of the wiring board,
- a second side opposite the first side and facing the second long side of the wiring board,
- a third side facing the first short side of the wiring board, and
- a fourth side facing the second short side of the wiring board and that intersects the first and second sides; and a controller chip for controlling the memory chip, the controller chip being mounted on the first main surface of the memory chip and having a second main surface, wherein a plurality of first electrodes is disposed on the top surface of the wiring board between the first side of the memory chip and an outer edge of the projected portion of the wiring board in a plan view, wherein a plurality of second electrodes are formed along the first side of the memory chip on the second main surface of the controller chip, wherein a plurality of third electrodes are formed between the third side of the memory chip and the first short side of the wiring board on the top surface of the wiring board, wherein a plurality of the fourth electrodes are formed along the third side of the memory chip on the first main surface of the memory chip, wherein the first electrodes of the wiring board are electrically connected with the second electrodes of the controller chip via a plurality of first wirings, wherein the third electrodes of the wiring board are electrically connected with the fourth electrodes of the memory chip via a plurality of second wirings, wherein the third electrodes of the wiring board are electrically connected with the first electrodes of the wiring board, wherein a portion of the first side of the memory chip is adjacent to the straight line portion of the wiring board, wherein the second side of the memory chip is adjacent to the second long side of the wiring board, wherein the fourth side of the memory chip is adjacent to the second short side of the wiring board, and wherein an electrode is not formed on the top surface of the wiring board in the plan view between the portion of the first side of the memory chip and the straight portion of the wiring board, between the second side of the memory chip and the second long side of the wiring board, and between the fourth side of the memory chip and the second short side of the wiring board.

9. The semiconductor device according to claim 8, wherein a passive element is arranged on the top surface of the wiring board between the first side of the memory chip and the outer edge of the projected portion of the wiring board.

10. The semiconductor device according to claim 9, wherein the passive element is a chip capacitor.

11. The semiconductor device according to claim 9, wherein the first electrodes of the wiring board are arranged between the first side of the memory chip and the passive element in the plan view.

12. The semiconductor device according to claim 8, wherein the fourth electrodes of the memory chip are arranged along the third side of the memory chip such that the fourth electrodes face the third electrodes of the wiring board in the plan view.

13. The semiconductor device according to claim 8, wherein a plurality of the memory chips are stacked over the top surface of the wiring board and are displaced with respect to each other in a direction perpendicular to the third side of the memory chip so that the fourth electrodes provided on their respective third sides are exposed.

14. The semiconductor device according to claim 8, wherein the top surface of the wiring board, the memory chip and the controller chip are sealed with resin.

15. The semiconductor device according to claim 8, wherein the wiring board has external dimensions that are the same as those of a wiring board of a micro SD card.

* * * * *